US012696681B2

(12) United States Patent
Ahn et al.

(10) Patent No.: US 12,696,681 B2
(45) Date of Patent: Jul. 28, 2026

(54) LIGHT-EMITTING ELEMENT AND AROMATIC COMPOUND FOR THE SAME

(71) Applicant: Samsung Display Co., Ltd., Yongin-si (KR)

(72) Inventors: Heechoon Ahn, Seoul (KR); Juhui Yun, Suwon-si (KR); Hyunah Um, Seoul (KR); Yeseul Lee, Busan (KR); Seowon Cho, Asan-si (KR); Jiyong Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 971 days.

(21) Appl. No.: 17/744,164

(22) Filed: May 13, 2022

(65) Prior Publication Data

US 2023/0129854 A1 Apr. 27, 2023

(30) Foreign Application Priority Data

Sep. 14, 2021 (KR) ........................ 10-2021-0122304

(51) Int. Cl.
*H10K 85/40* (2023.01)
*C07F 7/08* (2006.01)
(Continued)

(52) U.S. Cl.
CPC ........... *H10K 85/40* (2023.02); *C07F 7/0812* (2013.01); *C07F 7/30* (2013.01); *C09K 11/06* (2013.01);
(Continued)

(58) Field of Classification Search
CPC ............ C07F 7/30; H10K 50/16; H10K 85/40
See application file for complete search history.

(56) References Cited

U.S. PATENT DOCUMENTS 9,590,189 B2 * 3/2017 Shin ....................... H05B 33/14
2014/0231786 A1 8/2014 Shin
(Continued)

FOREIGN PATENT DOCUMENTS

GB 2505893 A * 3/2014 ............. H10K 85/40
KR 20110046839 A 5/2011
(Continued)

OTHER PUBLICATIONS

Google translation of KR_101214200_B1 (Year: 2025).*
(Continued)

*Primary Examiner* — Michael M Dollinger
(74) *Attorney, Agent, or Firm* — Womble Bond Dickinson (US) LLP

(57) ABSTRACT

A light-emitting that includes a first electrode, a second electrode on the first electrode, and at least one functional layer between the first electrode and the second electrode is provided. At least one functional layer may include an aromatic compound represented by Formula 1. The light-emitting element results in a reduced driving voltage and an improved luminous efficiency.

Formula 1

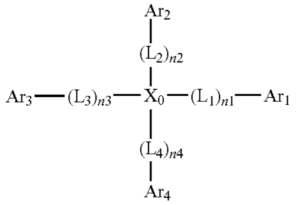

18 Claims, 8 Drawing Sheets

(51) Int. Cl.

| | |
|---|---|
| ***C07F 7/30*** | (2006.01) |
| ***C09K 11/06*** | (2006.01) |
| ***H10K 85/30*** | (2023.01) |
| *H10K 50/11* | (2023.01) |
| *H10K 50/16* | (2023.01) |
| *H10K 85/60* | (2023.01) |
| *H10K 101/10* | (2023.01) |
| *H10K 101/30* | (2023.01) |

(52) U.S. Cl.

CPC ...... *H10K 85/30* (2023.02); *C09K 2211/1018* (2013.01); *C09K 2211/1059* (2013.01); *C09K 2211/188* (2013.01); *H10K 50/11* (2023.02); *H10K 50/16* (2023.02); *H10K 85/626* (2023.02); *H10K 85/654* (2023.02); *H10K 85/6572* (2023.02); *H10K 2101/10* (2023.02); *H10K 2101/30* (2023.02)

(56) References Cited

U.S. PATENT DOCUMENTS

| | | | | |
|---|---|---|---|---|
| 2016/0276604 | A1* | 9/2016 | Kwong .................. | C09K 11/06 |
| 2021/0210700 | A1 | 7/2021 | Fleetham et al. | |

FOREIGN PATENT DOCUMENTS

| | | | |
|---|---|---|---|
| KR | 10-1214200 | B1 | 12/2012 |
| KR | 10-1301730 | B1 | 8/2013 |
| KR | 10-1775891 | B1 | 9/2017 |

OTHER PUBLICATIONS

Google Translation of KR 20110046839 A (Year: 2025).*

Ju Hui Yun et al., Exciton stabilizing high triplet energy n-type hosts for blue phosphorescent organic light-emitting diodes, Elsevier Science Direct Dyes and Pigments 190 (2021) 109297, 7 pages.

* cited by examiner

LIGHT-EMITTING ELEMENT AND AROMATIC COMPOUND FOR THE SAME

CROSS REFERENCE TO RELATED APPLICATION

This application claims priority to and the benefit of Korean Patent Application No. 10-2021-0122304, filed on Sep. 14, 2021, the entire contents of which are hereby incorporated by reference.

BACKGROUND

1. Field

One or more embodiments of the present disclosure relate to a light-emitting element and an aromatic compound used thereof.

2. Description of the Related Art

Recently, development of an organic electroluminescence display device or the like as an image display device has been carried out actively. The organic electroluminescence display device or the like is a display device including a self-luminous display element that achieves display by causing a light-emitting material of a light-emitting layer to emit light through recombining, in the light-emitting layer, holes and electrons injected from a first electrode and a second electrode.

For application of a light-emitting element to a display device, high luminous efficiency is required, and development of a material for a light-emitting element capable of stably implementing such a display device is being continuously sought.

SUMMARY

The present disclosure provides a light-emitting element exhibiting excellent (high) luminous efficiency and having a low driving voltage.

The present disclosure also provides an aromatic compound as a material for a light-emitting element with high efficiency characteristics.

An embodiment of the present disclosure provides a light-emitting element including: a first electrode; a second electrode on the first electrode; and at least one functional layer between the first electrode and the second electrode and including an aromatic compound represented by Formula 1 below Formula 1

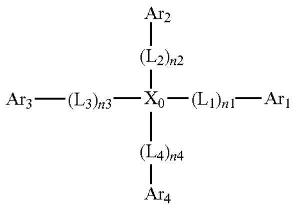

wherein, in Formula 1, $X_0$ is Si or Ge, n1 to n4 may be each independently 1 or 2, $L_1$ to $L_4$ may be each independently a substituted or unsubstituted divalent hydrocarbon ring group having 6 to 30 ring-forming carbon atoms, or a substituted or unsubstituted divalent heterocyclic group having 3 to 30 ring-forming carbon atoms, two selected from among $Ar_1$ to $Ar_4$ may be nitrogen-containing heterocyclic groups and the other two may be each a hydrogen atom, a substituted or unsubstituted aryl group having 6 to 30 ring-forming carbon atoms, or a substituted or unsubstituted heteroaryl group having 2 to 30 ring-forming carbon atoms, and when $Ar_1$ and $Ar_2$ may be heterocyclic groups containing at least one nitrogen atom as a ring-forming atom, n1 and n2 are 1, and $L_1$ and $L_2$ may be each independently a substituted or unsubstituted divalent hydrocarbon ring group having 7 to 30 ring-forming carbon atoms.

In an embodiment, the nitrogen-containing heterocyclic group may be a substituted or unsubstituted pyridine group, a substituted or unsubstituted pyrimidine group, a substituted or unsubstituted quinazoline group, or a substituted or unsubstituted triazine group.

In an embodiment, in which the nitrogen-containing heterocyclic group may be substituted, the nitrogen-containing heterocyclic group comprises, as a substituent, a substituted or unsubstituted phenyl group, a substituted or unsubstituted naphthyl group, a substituted or unsubstituted biphenyl group, or a substituted or unsubstituted pyridine group.

In an embodiment, the two nitrogen-containing heterocyclic groups may be each independently represented by any one of W1-1 to W1-4 below

W1-1

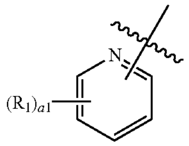

W1-2

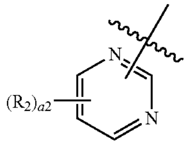

W1-3

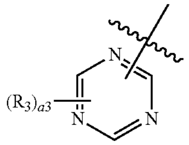

W1-4

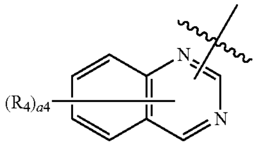

wherein, in W1-1, a1 is an integer of 0 to 4, in W1-2, a2 is an integer of 0 to 3 in W1-3, a3 is an integer of 0 to 2, in W1-4, a4 is an integer of 0 to 5, and in W1-1 to W1-4, $R_1$ to $R_4$ may be each independently a hydrogen atom, a substituted or unsubstituted aryl group having 6 to 30 ring-forming carbon atoms, or a substituted or unsubstituted heteroaryl group having 2 to 30 ring-forming carbon atoms.

In an embodiment, Formula 1 may be represented by any one of Formulas 2-1 to 2-3 below Formula 2-1

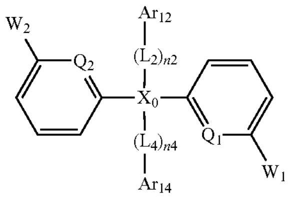

Formula 2-2

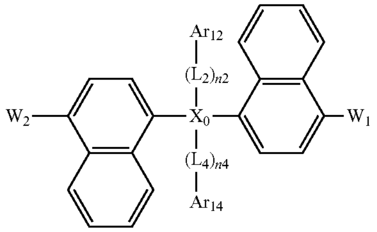

Formula 2-3

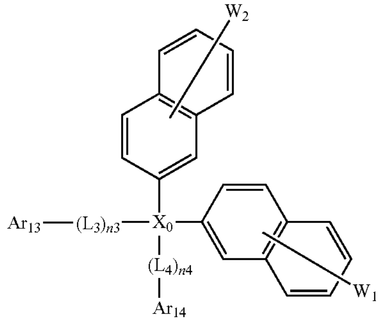

wherein: in Formula 2-1, $Q_1$ and $Q_2$ may be each independently CH or N; and in Formula 2-1 to 2-3, $W_1$ and $W_2$ may be each independently a nitrogen-containing heterocyclic group, $Ar_{12}$ to $Ar_{14}$ may be each independently a hydrogen atom, a substituted or unsubstituted aryl group having 6 to 30 ring-forming carbon atoms, or a substituted or unsubstituted heteroaryl group having 2 to 30 ring-forming carbon atoms, and $L_2$ to $L_4$, n2 to n4, and $X_0$ may be the same as defined in Formula 1 above.

In an embodiment, in Formulas 2-1 to 2-3, $W_1$ and $W_2$ may be the same.

In an embodiment, in Formula 2-1, $L_2$ and $L_4$ may be the same.

In an embodiment, Formula 1 is represented by Formula 3

Formula 3

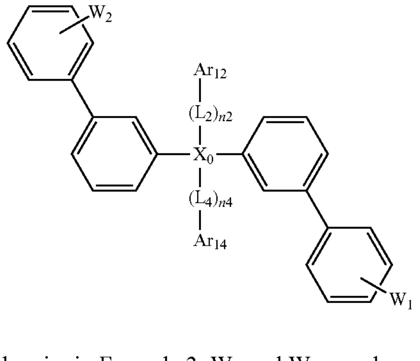

wherein, in Formula 3, $W_1$ and $W_2$ may be each independently a nitrogen-containing heterocyclic group, $Ar_{12}$ to $Ar_{14}$ may be each independently a hydrogen atom, a substituted or unsubstituted aryl group having 6 to 30 ring-forming carbon atoms, or a substituted or unsubstituted heteroaryl group having 2 to 30 ring-forming carbon atoms, and $L_2$, $L_4$, n2 to n4, and $X_0$ may be the same as defined in Formula 1 above.

In an embodiment, $L_1$ to $L_4$ may be each independently a substituted or unsubstituted phenylene group, a substituted or unsubstituted divalent biphenyl group, a substituted or unsubstituted pyridylene group, or a substituted or unsubstituted naphthylene group.

In an embodiment, the at least one functional layer may include a light-emitting layer, a hole transport region between the first electrode and the light-emitting layer, and an electron transport region between the light-emitting layer and the second electrode, and at least one of the light-emitting layer or the electron transport region includes the aromatic compound.

In an embodiment, the electron transport region may include a hole blocking layer on the light-emitting layer, an electron transport layer on the hole blocking layer, and an electron injection layer on the electron transport layer, and at least one of the hole blocking layer, the electron transport layer, or the electron injection layer may include the aromatic compound.

In an embodiment, an aromatic compound represented by Formula 1 is provided.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
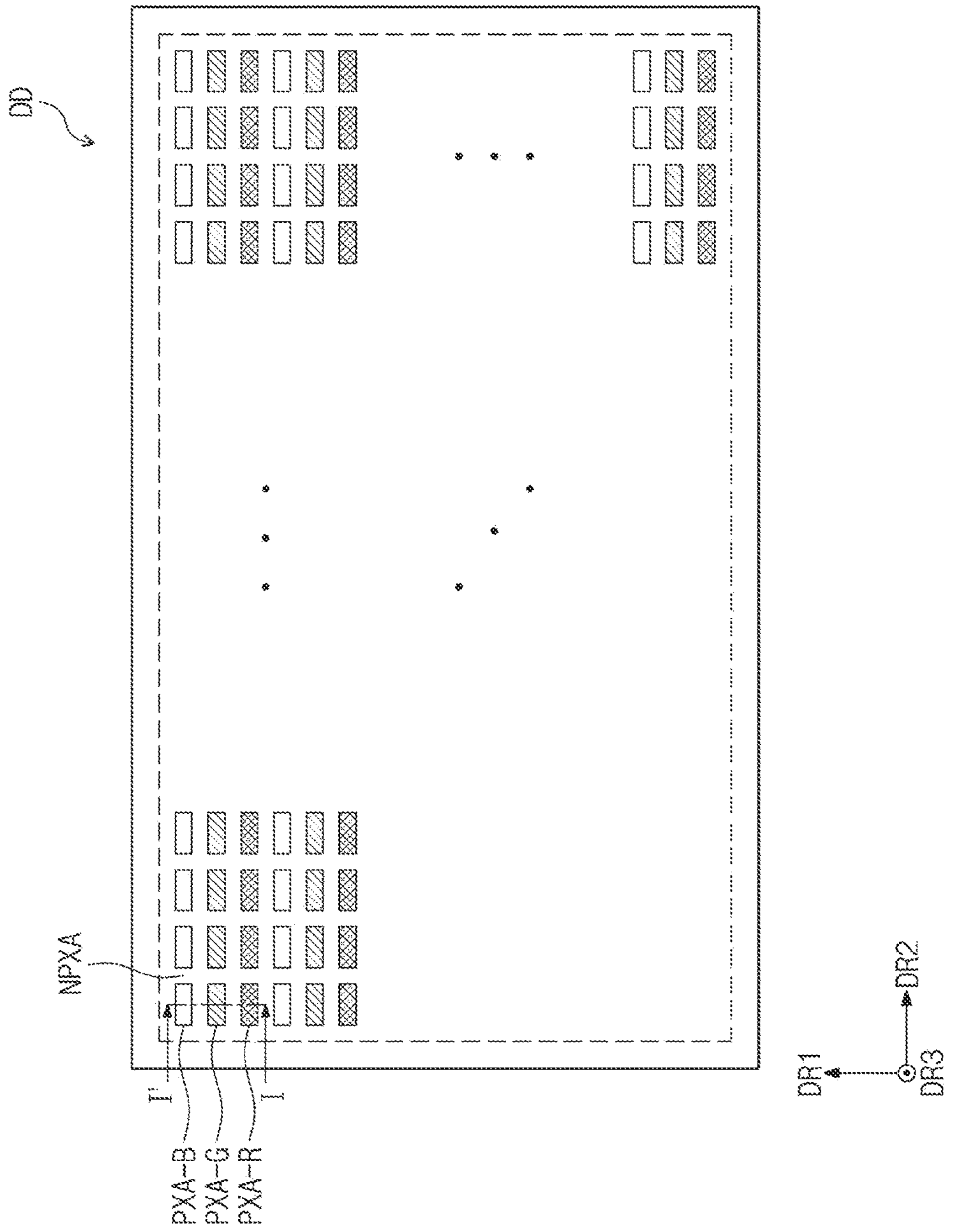
FIG. 1 is a plan view illustrating a display device according to an embodiment.

The subject matter of the present disclosure may have various suitable modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals or symbols refer to like elements throughout. The thickness and the ratio and the dimension of the element may be exaggerated for effective description of the technical contents. As used herein, the term "and/or" includes any and all combinations of one or more of the associated listed items.

It will be understood that, although the terms first, second, etc. may be used herein to describe various suitable elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this disclosure, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as understood by one of ordinary skill in the art to which this disclosure belongs. It will be further understood that terms, such as those defined in dictionaries, should be interpreted as having a meaning that is consistent with their meaning in the context of the relevant art and will not be interpreted in an idealized or overly formal sense unless expressly so defined herein.

Hereinafter, a light-emitting element and an aromatic compound according to an embodiment will be described with reference to the accompanying drawings.

Figure 2:
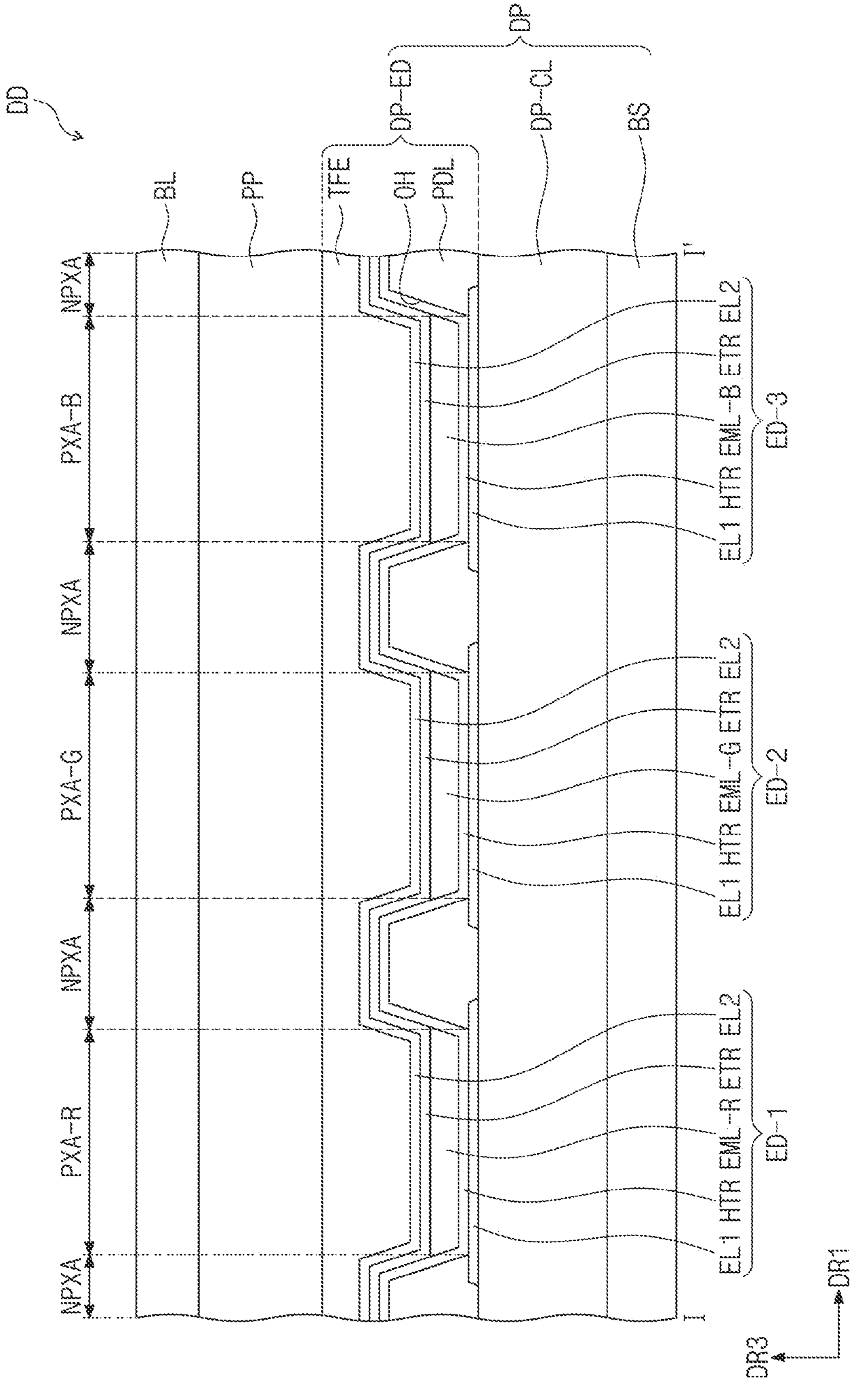
FIG. 2 is a cross-sectional view taken along line I-I' of FIG. 1.

FIG. 1 is a plan view illustrating an embodiment of a display device DD. FIG. 2 is a cross-sectional view of a display device DD according to an embodiment. FIG. 2 is a cross-sectional view taken along line I-I' of FIG. 1.

The display device DD may include a display panel DP and an optical layer PP on the display panel DP. The display panel DP may include light-emitting elements ED-1, ED-2, and ED-3. The display device DD may include a plurality of light-emitting elements ED-1, ED-2, and ED-3. The optical layer PP may be on the display panel DP to control reflected light from the display panel DP by external light. For example, the optical layer PP may include a polarizing layer or a color filter layer. Unlike the configuration illustrated in the drawings, the optical layer PP may be omitted in the display device DD according to an embodiment.

A base substrate BL may be on the optical layer PP. The base substrate BL may be a member that provides a base surface on which the optical layer PP is disposed. The base substrate BL may be a glass substrate, a metal substrate, a plastic substrate, and/or the like. However, an embodiment of the present disclosure is not limited thereto, and the base substrate BL may be an inorganic layer, an organic layer or a composite material layer. In addition, unlike the configuration illustrated, the base substrate BL may be omitted in an embodiment.

The display device DD according to an embodiment may further include a filling layer. The filling layer may be between the display element layer DP-ED and the base substrate BL. The filling layer may be an organic material layer. The filling layer may include at least one of an acrylic resin, a silicone-based resin, or an epoxy-based resin.

The display panel DP may include a base layer BS, a circuit layer DP-CL provided on the base layer BS, and a display element layer DP-ED. The display element layer DP-ED includes pixel defining films (layers) PDL, light-emitting elements ED-1, ED-2, and ED-3 between the pixel defining films PDL, and an encapsulation layer TFE on the light-emitting elements ED-1, ED-2, and ED-3.

The base layer BS may be a member that provides a base surface on which the display element layer DP-ED is disposed. The base layer BS may be a glass substrate, a metal substrate, a plastic substrate, and/or the like. However, an embodiment of the present disclosure is not limited thereto, and the base layer BS may be an inorganic layer, an organic layer, and/or a composite material layer.

In an embodiment, the circuit layer DP-CL may be on the base layer BS, and may include a plurality of transistors. The transistors may each include a control electrode, an input electrode, and/or an output electrode. For example, the circuit layer DP-CL may include a switching transistor and a driving transistor for driving the light-emitting elements ED-1, ED-2, and ED-3 of the display element layer DP-ED.

Each of the light-emitting elements ED-1, ED-2, and ED-3 may have a structure of a light-emitting element ED according to an embodiment in FIGS. 3 to 6 to be described later. Each of the light-emitting elements ED-1, ED-2, and ED-3 may include a first electrode EL1, a hole transport region HTR, light-emitting layers EML-R, EML-G, and EML-B, an electron transport region ETR, and a second electrode EL2.

FIG. 2 illustrates an embodiment in which the light-emitting layers EML-R, EML-G, and EML-B of the light-emitting elements ED-1, ED-2, and ED-3 may be in openings OH defined in the pixel defining films PDL, and the hole transport region HTR, the electron transport region ETR, and the second electrode EL2 may be provided as common layers in all of the light-emitting elements ED-1, ED-2, ED-3. However, an embodiment of the present disclosure is not limited thereto, and in an embodiment unlike the configuration illustrated in FIG. 3, the hole transport region HTR and the electron transport region ETR may be provided by being patterned inside the openings OH defined in the pixel defining films PDL. For example, in an embodiment, the hole transport region HTR, the light-emitting layers EML-R, EML-G, and EML-B, and the electron transport region ETR of the light-emitting elements ED-1, ED-2, and ED-3 may be provided by being patterned through an inkjet printing method or any other suitable method.

The encapsulation layer TFE may cover the light-emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a stack of a plurality of layers. The encapsulation layer TFE may include at least one insulating layer. The encapsulation layer TFE according to an embodiment may include at least one inorganic film (hereinafter, an inorganic encapsulation film). In addition, the encapsulation layer TFE according to an embodiment may include at least one organic film (hereinafter, an organic encapsulation film) and at least one inorganic encapsulation film.

The inorganic encapsulation film protects the display element layer DP-ED from moisture/oxygen, and the organic encapsulation film protects the display device layer DP-ED from foreign substances such as dust particles. The inorganic encapsulation film may include silicon nitride, silicon oxynitride, silicon oxide, titanium oxide, aluminum oxide, and/or the like, but is not particularly limited thereto. The organic encapsulation film may include an acrylic compound, an epoxy-based compound, and/or the like. The organic encapsulation film may include a photopolymerizable organic material but is not limited thereto.

The encapsulation layer TFE may be on the second electrode EL2, and may be disposed to fill the opening OH.

Referring to FIGS. 1 and 2, the display device DD may include a non-light-emitting region NPXA and light-emitting regions PXA-R, PXA-G, and PXA-B. The light-emitting regions PXA-R, PXA-G, and PXA-B may be regions in which light generated by the respective light-emitting elements ED-1, ED-2, and ED-3 is emitted. The light-emitting regions PXA-R, PXA-G, and PXA-B may be spaced apart from each other on a plane.

The light-emitting regions PXA-R, PXA-G, and PXA-B may be respectively divided by the pixel defining films PDL. The non-light-emitting regions NPXA may be located between the adjacent light-emitting regions PXA-B, PXA-G, and PXA-R and may be correspond to the pixel defining films PDL. In the present disclosure, the light-emitting regions PXA-B, PXA-G, and PXA-R may respectively correspond to pixels. The pixel defining film PDL may divide the light-emitting elements ED-1, ED-2, and ED-3. The light-emitting layers EML-R, EML-G, EML-B of the light-emitting elements ED-1, ED-2, and ED-3 may be in the openings OH defined in the pixel defining films PDL and thus separated from each other.

The light-emitting regions PXA-B, PXA-G, and PXA-R may be classified into a plurality of groups according to the color of light generated from the light-emitting elements ED-1, ED-2, and ED-3. In the display device DD according to an embodiment illustrated in FIGS. 2 and 3, three light-emitting regions PXA-R, PXA-G, and PXA-B respectively emitting red light, green light, and blue light are illustrated. For example, the display device DD according to an embodiment may include a red light-emitting region PXA-R, a green light-emitting region PXA-G, and a blue light-emitting region PXA-B that may be distinguished from each other.

In the display device DD according to an embodiment, the plurality of light-emitting elements ED-1, ED-2, and ED-3 may emit light of different wavelength ranges. For example, in an embodiment, the display device DD may include a first light-emitting element ED-1 for emitting red light, a second light-emitting element ED-2 for emitting green light, and a third light-emitting element ED-3 for emitting blue light. For example, the red light-emitting region PXA-R, green light-emitting region PXA-G, and blue light-emitting region PXA-B of the display device DD may respectively correspond to the first light-emitting element ED-1, the second light-emitting element ED-2, and the third light-emitting element ED-3.

However, an embodiment of the present disclosure is not limited thereto, and the first to third light-emitting elements ED-1, ED-2, and ED-3 may emit light of the same (substantially the same) wavelength range or at least one of the first to third light-emitting elements ED-1, ED-2, or ED-3 may emit light of a different wavelength range. For example, all of the first to third light-emitting elements ED-1, ED-2, and ED-3 may emit blue light.

The light-emitting regions PXA-R, PXA-G, and PXA-B in the display device DD according to an embodiment may be arranged in a stripe shape. Referring to FIG. 1, a plurality of red light-emitting regions PXA-R, a plurality of green light-emitting regions PXA-G, and a plurality of blue light-emitting regions PXA-B may be each aligned along the second direction axis DR2. In addition, the light-emitting regions may be alternately arranged in the order of the red light-emitting region PXA-R, the green light-emitting region PXA-G, and the blue light-emitting region PXA-B along the first direction axis DR1.

FIGS. 1 and 2 illustrate that areas of the light-emitting regions PXA-R, PXA-G, and PXA-B are all similar (substantially similar), but an embodiment of the present disclosure is not limited thereto. Thus, the areas of the light-emitting regions PXA-R, PXA-G, and PXA-B may be different from each other depending on the wavelength range of the emitted light. The areas of the light-emitting regions PXA-R, PXA-G, and PXA-B may refer to an area as viewed on a plane defined by the first direction axis DR1 and the second direction axis DR2.

An arrangement form of the light-emitting regions PXA-R, PXA-G, and PXA-B is not limited to that illustrated in FIG. 1, and an order, in which the red light-emitting region PXA-R, the green light-emitting region PXA-G, and the blue light-emitting region PXA-B are arranged, may be provided in various suitable combinations according to the characteristics of display quality required for the display device DD. For example, the arrangement form of the light-emitting regions PXA-R, PXA-G, and PXA-B may be a PENTILE® arrangement structure (for example, an RGBG matrix, an RGBG structure, or RGBG matrix structure), or a diamond arrangement, but the present disclosure is not limited thereto. PENTILE® is a duly registered trademark of Samsung Display Co., Ltd.

In addition, the areas of the light-emitting regions PXA-R, PXA-G, and PXA-B may be different from each other. For example, in an embodiment, the area of the green light-emitting region PXA-G may be smaller than the area of the blue light-emitting region PXA-B, but an embodiment of the present disclosure is not limited thereto.

Hereinafter, FIGS. 3 to 6 are cross-sectional views schematically illustrating a light-emitting element according to an embodiment. The light-emitting element ED may include the first electrode EL1, the hole transport region HTR, the light-emitting layer EML, the electron transport region ETR, and the second electrode EL2 which may be sequentially stacked.

Figure 3:
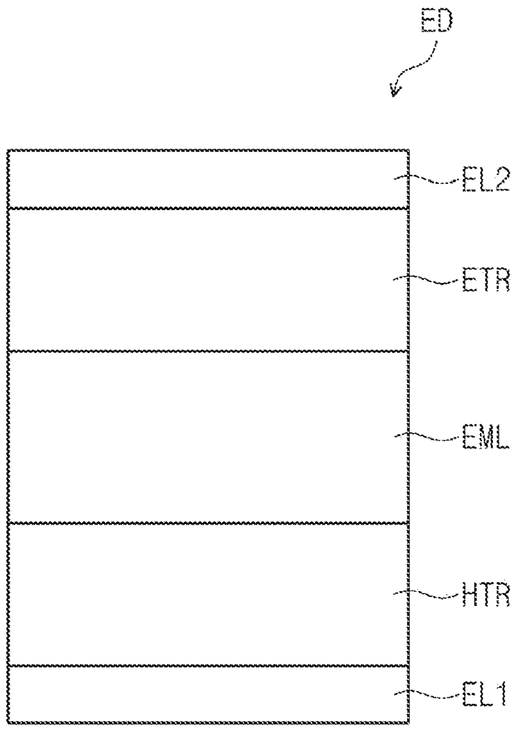
FIG. 3 is a cross-sectional view schematically illustrating a light-emitting element according to an embodiment.
Figure 4:
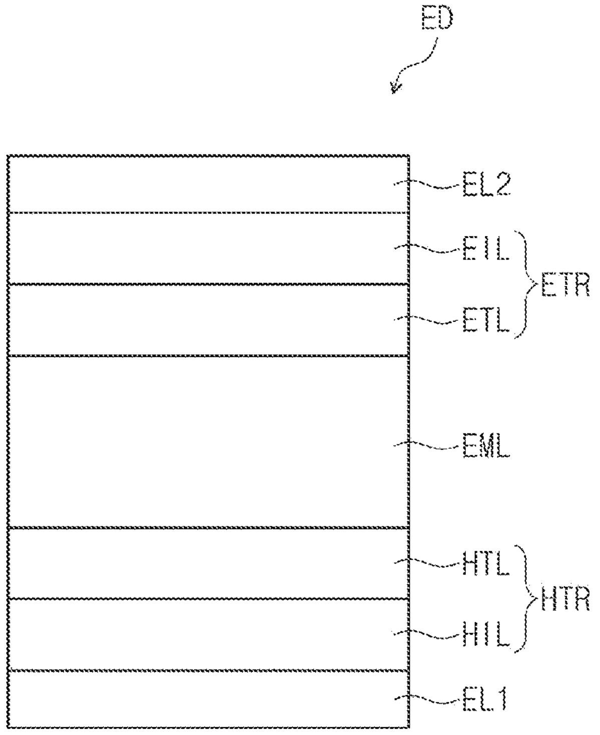
FIG. 4 is a cross-sectional view schematically illustrating a light-emitting element according to an embodiment.
Figure 5:
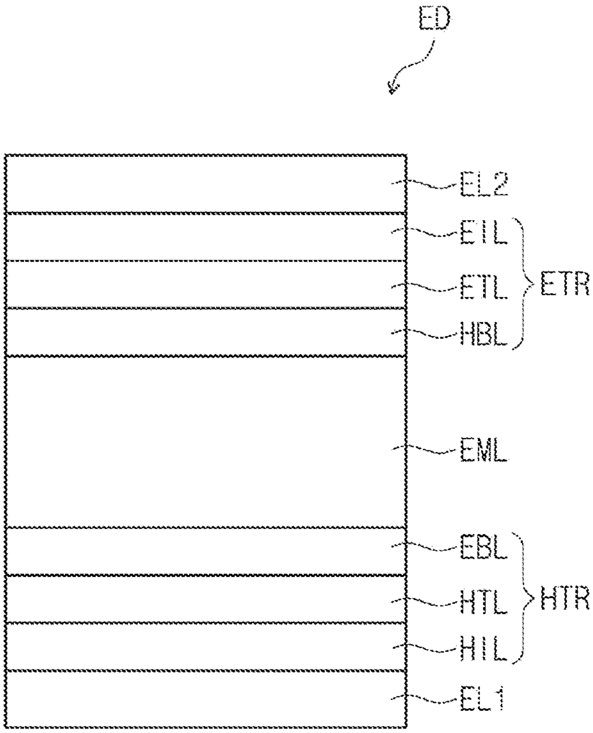
FIG. 5 is a cross-sectional view schematically illustrating a light-emitting element according to an embodiment.
Figure 6:
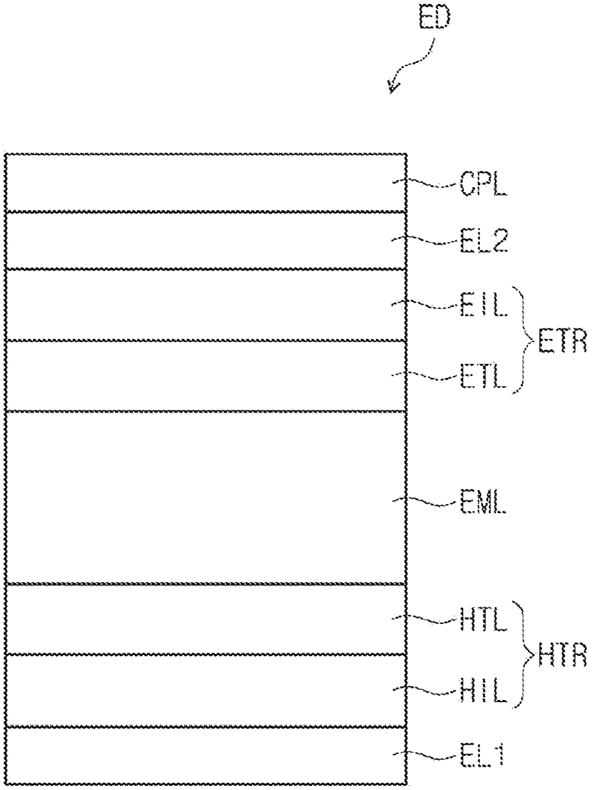
FIG. 6 is a cross-sectional view schematically illustrating a light-emitting element according to an embodiment.

FIG. 4 is a cross-sectional view of a light-emitting element ED according to an embodiment in which the hole transport region HTR includes a hole injection layer HIL and a hole transport layer HTL, and the electron transport region ETR include an electron injection layer EIL and an electron transport layer ETL, compared to FIG. 3 in which the EIL, ETL, HTL and HIL are absent. In addition, FIG. 5 is a cross-sectional view of a light-emitting element ED according to an embodiment in which the hole transport region HTR includes a hole injection layer HIL, a hole transport layer HTL, and an electron blocking layer EBL, and the electron transport region ETR include an electron injection layer EIL, an electron transport layer ETL, and a hole blocking layer HBL. FIG. 6 is a cross-sectional view of a light-emitting element ED according to an embodiment including a capping layer CPL on the second electrode EL2.

The light-emitting element ED according to an embodiment may include an aromatic compound. For example, at least one of the light-emitting layer EML or the electron transport region ETR may include the aromatic compound according to an embodiment. The aromatic compound may include a nitrogen-containing heterocyclic group which is directly or indirectly bonded to a silicon (Si) atom or a germanium (Ge) atom.

The term "substituted or unsubstituted" in the present disclosure may mean being substituted or unsubstituted with at least one substituent selected from the group consisting of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents exemplified above may be substituted or unsubstituted. For example, the biphenyl group may be interpreted as an aryl group and may also be interpreted as a phenyl group substituted with a phenyl group.

In the present disclosure, the term "bonding with an adjacent group to form a ring" may mean bonding with an adjacent group to form a substituted or unsubstituted hydrocarbon ring or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, a ring formed by mutually bonding may be connected to another ring to form a spiro structure.

In the present disclosure, the term "adjacent group" may mean a substituent substituted at an atom directly linked to an atom substituted with the corresponding substituent, another substituent substituted at an atom substituted with the corresponding substituent, or a substituent which is three-dimensionally closest to the corresponding substituent. For example, in 1,2-dimethylbenzene, two methyl groups may be interpreted as mutually "adjacent groups", and in 1,1-diethylcyclopentane, two ethyl groups may be interpreted as mutually "adjacent groups." In addition, in 4,5-dimethylphenanthrene, two methyl groups may be interpreted as mutually "adjacent groups".

In the present disclosure, examples of a halogen atom include a fluorine atom, a chlorine atom, a bromine atom or an iodine atom.

In the present disclosure, an alkyl group may be straight, branched or cyclic. The number of carbon atoms in the alkyl group may be 1 to 50, 1 to 30, 1 to 20, 1 to 10 or 1 to 6. Examples of the alkyl group may include a methyl group, an ethyl group, an n-propyl group, a isopropyl group, an n-butyl group, a s-butyl group, a t-butyl group, an i-butyl group, an 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, an 2-ethylpentyl group, a 4-methyl-2-pentyl group, an n-hexyl group, a 1-methylhexyl group, an 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, an 2-ethylheptyl group, a 2-butylheptyl group, an n-octyl group, a t-octyl group, an 2-ethyloctyl group, a 2-butyloctyl group, an 2-hexyloctyl group, a 3,7-dimethyloctyl group, a cyclooctyl group, an n-nonyl group, an n-decyl group, an adamantyl group, an 2-ethyldecyl group, a 2-butyldecyl group, a 2-hexyldecyl group, an 2-octyldecyl group, an n-undecyl group, an n-dodecyl group, an 2-ethyldodecyl group, a 2-butyldodecyl group, an 2-hexyldodecyl group, an 2-octyldodecyl group, an n-tridecyl group, an n-tetradecyl group, an n-pentadecyl group, an n-hexadecyl group, an 2-ethylhexadecyl group, a 2-butylhexadecyl group, an 2-hexylhexadecyl group, an 2-octylhexadecyl group, an n-heptadecyl group, an n-octadecyl group, an n-nonadecyl group, an n-icosyl group, an 2-ethyleicosyl group, a 2-butylicosyl group, an 2-hexylicosyl group, an 2-octylicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group and/or the like, but an embodiment of the present disclosure is not limited thereto.

In the present disclosure, an alkenyl group refers to a hydrocarbon group including one or more carbon double bonds in the middle or terminal of an alkyl group having 2 or more carbon atoms. The alkenyl group may be straight or branched. The number of carbon atoms is not limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group and/or the like, but an embodiment of the present disclosure is not limited thereto.

In the present disclosure, a hydrocarbon ring group means any functional group or substituent derived from an aliphatic hydrocarbon ring or an aromatic hydrocarbon ring. The aliphatic hydrocarbon ring may be a saturated hydrocarbon ring group having 5 to 30 or 6 to 30 ring-forming carbon atoms. The aromatic hydrocarbon ring may be an aryl group.

In the present disclosure, the aryl group refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group and/or the like, but an embodiment of the present disclosure is not limited thereto.

In the present disclosure, a heterocyclic group refers to any functional group or substituent derived from a ring containing at least one of B, O, N, P, Si or S as a hetero atom. The heterocyclic group includes an aliphatic heterocyclic group and an aromatic heterocyclic group. The aromatic heterocyclic group may be a heteroaryl group. The aliphatic heterocycle and the aromatic heterocycle may be a monocyclic heterocycle or a polycyclic heterocycle. If the heterocyclic group includes two or more heteroatoms, the two or more heteroatoms may be the same as or different from each other. The number of ring-forming carbon atoms in the heterocyclic group may be 2 to 30, 2 to 20, or 2 to 10.

In the present disclosure, the heteroaryl group may include, as a hetero atom, at least one of B, O, N, P, Si, or S. If the heteroaryl group includes two or more hetero atoms, the two or more hetero atoms may be the same as or different from each other. The heteroaryl group may be a monocyclic heterocyclic group or a polycyclic heterocyclic group. The number of ring-forming carbon atoms in the heterocyclic group may be 2 to 30, 2 to 20, or 2 to 10. Examples of the heteroaryl group include a thiophene group, a furan group, a pyrrole group, a imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxy group, a phthalazine group, a pyrido pyrimidine group, a pyrido pyrazine group, a pyrazino pyrazine group, an isoquinoline group, an indole group, a carbazole group, an N-aryl carbazole group, an N-heteroaryl carbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, and/or the like, but an embodiment of the present disclosure is not limited thereto.

In the present disclosure, the description of the above-described aryl group may be applied to the arylene group, except that the arylene group is a divalent group. The description of the above-described heteroaryl group may be applied to the heteroarylene group, in which the heteroarylene group is a divalent group.

In the present disclosure, a boron group may refer to a boron atom that is bonded to the alkyl group or aryl group as defined above. The boron group may include an alkyl boron group and an aryl boron group. Examples of the boron group include a trimethylboron group, a triethylboron group, a t-butyldimethylboron group, a triphenylboron group, a diphenylboron group, a phenylboron group, and/or the like, but an embodiment of the present disclosure is not limited thereto.

In the present disclosure, a silyl group includes an alkyl silyl group and an aryl silyl group. Examples of the silyl group may include a trimethylsilyl group, a triethylsilyl group, a t-butyldimethylsilyl group, an ethyldimethylsilyl group, a propyldimethylsilyl group, a triphenylsilyl group, a diphenylsilyl group, a phenylsilyl group, and/or the like, but an embodiment of the present disclosure is not limited thereto.

In the present disclosure, a thio group may include an alkyl thio group and an aryl thio group. The thio group may refer to a sulfur atom that is bonded to the alkyl group or aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, and/or the like, but an embodiment of the present disclosure is not limited thereto.

In the present disclosure, the number of carbon atoms in the amine group is not limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, and a triphenylamine group, but an embodiment of the present disclosure is not limited thereto.

In the present disclosure, an oxy group may refer to an oxygen atom that is bonded to the alkyl group or aryl group as defined above. The oxy group may include an alkoxy group and an aryl oxy group. The alkoxy group may have a linear, branched or cyclic chain. The number of carbon atoms in the alkoxy group is not limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, and/or the like. However, an embodiment of the present disclosure is not limited thereto.

In the present disclosure, in an alkyl thio group, an alkyl sulfoxy group, an alkyl oxy group, an alkyl amino group, an alkyl boron group, an alkyl silyl group, and an alkyl amine group, an alkyl group is the same as the alkyl group as defined above.

In the present disclosure, in an aryl oxy group, an aryl thio group, an aryl sulfoxy group, an aryl amino group, an aryl boron group, an aryl silyl group, and an aryl amine group, an aryl group is the same as the aryl group as defined above.

In the present disclosure a direct linkage may refer to a single bond. In the present disclosure, " 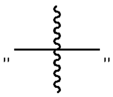 " and "—*"

refer to a connected position.

The light-emitting element according to an embodiment may include an aromatic compound represented by Formula 1 below.

Formula 1

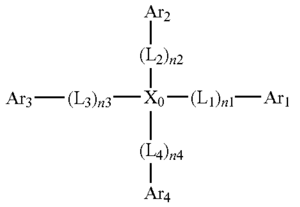

In Formula 1, $X_0$ may be Si or Ge. n1 to n4 may be each independently 1 or 2. When n1 is 2, two Lis may be the same as or different from each other. If n2 is 2, the two $L_2$s may be the same as or different from each other. When n3 is 2, the two $L_3$s may be the same as or different from each other. When n4 is 2, the two $L_4$s may be the same as or different from each other.

$L_1$ to $L_4$ may be each independently a substituted or unsubstituted divalent hydrocarbon ring group having 6 to 30 ring-forming carbon atoms, or a substituted or unsubstituted divalent heterocyclic group having 3 to 30 ring-forming carbon atoms. $L_1$ to $L_4$ may be each a substituted or unsubstituted divalent aliphatic hydrocarbon ring group having 6 to 30 ring-forming carbon atoms, and a substituted or unsubstituted divalent aromatic hydrocarbon ring group having 6 to 30 ring-forming carbon atoms. In addition, $L_1$ to $L_4$ may be an aliphatic heterocyclic group or an aromatic heterocyclic group including at least one heteroatom of B, O, N, P, Si or S as a ring-forming atom. For example, $L_1$ to $L_4$ may be each independently a substituted or unsubstituted phenylene group, a substituted or unsubstituted divalent biphenyl group, a substituted or an unsubstituted pyridylene group, or a substituted or unsubstituted naphthylene group.

In Formula 1, two groups selected from among $Ar_1$ to $Ar_4$ may be a nitrogen-containing heterocyclic group, and the other two groups may be each a hydrogen atom, a substituted or unsubstituted aryl group having 6 to 30 ring-forming carbon atoms, or a substituted or unsubstituted heteroaryl group having 2 to 30 ring-forming carbon atoms. The two nitrogen-containing heterocyclic groups may be the same as or different from each other. In addition, the remaining two except for the two selected from among $Ar_1$ to $Ar_4$ may be the same as or different from each other. For example, two selected from among $Ar_1$ to $Ar_4$ may be the same as each other, and the other two may be the same as each other.

In the present disclosure, the nitrogen-containing heterocyclic group may be a heterocyclic group including at least one nitrogen atom as a ring-forming atom. The aromatic compound according to an embodiment may include at least one nitrogen-containing heterocyclic group, and the nitrogen-containing heterocyclic group may be an electron withdrawing group.

In Formula 1, when $Ar_1$ and $Ar_2$ may be each a heterocyclic group including at least one nitrogen atom as a ring-forming atom, n1 and n2 may be 1, and $L_1$ and $L_2$ may be each independently a substituted or unsubstituted divalent hydrocarbon ring group having 7 to 30 ring-forming carbon atoms. For example, if $Ar_1$ and $Ar_2$ are each a heterocyclic group including at least one nitrogen atom as a ring-forming atom, $L_1$ and $L_2$ may be each independently a substituted or unsubstituted naphthylene group. However, this is merely an example, and is not limited to a divalent hydrocarbon ring group having 7 to 30 carbon atoms.

For example, two groups, among $L_1$ to $L_4$, to which the nitrogen-containing heterocyclic group is not bonded may be an unsubstituted phenyl group, an unsubstituted biphenyl group, or a phenyl group substituted with a fluorine group. However, this is an example, and an embodiment of the present disclosure is not limited thereto.

The aromatic compound according to an embodiment may include at least two nitrogen-containing heterocyclic groups. For example, the nitrogen-containing heterocyclic group may be a substituted or unsubstituted pyridine group, a substituted or unsubstituted pyrimidine group, a substituted or unsubstituted quinazoline group, or a substituted or unsubstituted triazine group. When the nitrogen-containing heterocyclic group is a substituted or unsubstituted quinazoline group, among the two cyclic groups included in the quinazoline group, a cyclic group that includes a nitrogen atom as a ring-forming atom may be directly bonded to $X_0$ in Formula 1. For example, when the nitrogen-containing heterocyclic group includes a polycyclic ring, a cyclic group including a nitrogen atom as a ring-forming atom may be directly bonded to $X_0$ in Formula 1.

In an embodiment, the nitrogen-containing heterocyclic group may be represented by any one of the groups among W1-1 to W1-4 below. W1-1 represents a substituted or unsubstituted pyridine group, and W1-2 represents a substituted or unsubstituted pyrimidine group. W1-3 represents a substituted or unsubstituted triazine group, and W1-4 represents a substituted or unsubstituted quinazoline group.

W1-1

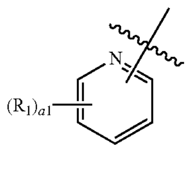

-continued

W1-2

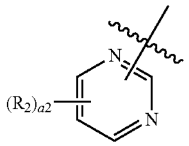

W1-3

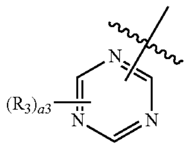

W1-4

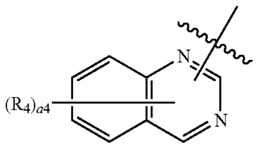

In W1-1, a1 is an integer of 0 to 4, and if a1 is an integer of 2 or more, a plurality of $R_1$s may be the same or at least one thereof may be different from the others. In W1-2, a2 is an integer of 0 to 3, and if a2 is an integer of 2 or more, a plurality of $R_2$s may be the same or at least one thereof may be different from the others. In W1-3, a3 is an integer of 0 to 2, and when a3 is an integer of 2 or more, a plurality of $R_3$s may be the same or at least thereof may be different from the others. In W1-4, a4 is an integer of 0 to 5, and when a4 is an integer of 2 or more, a plurality of R4s may be the same or at least one thereof may be different from the others.

In W1-1 to W1-4, $R_1$ to $R_4$ may be a substituent of a nitrogen-containing heterocyclic group. $R_1$ to $R_4$ may be each independently a hydrogen atom, a substituted or unsubstituted aryl group having 6 to 30 ring-forming carbon atoms, or a substituted or unsubstituted heteroaryl group having 2 to 30 ring-forming carbon atoms. When the nitrogen-containing heterocyclic group is substituted, the nitrogen-containing heterocyclic group may include, as a substituent, a substituted or unsubstituted aryl group having 6 to 30 ring-forming carbon atoms, or a substituted or unsubstituted heteroaryl group having 2 to 30 ring-forming carbon atoms. For example, if the nitrogen-containing heterocyclic group includes a substituted aryl group as a substituent, the substituted aryl group may be substituted with a fluorine group or a cyano group.

For example, if the nitrogen-containing heterocyclic group is substituted, the nitrogen-containing heterocyclic group may include, as a substituent, a substituted or unsubstituted phenyl group, a substituted or unsubstituted naphthyl group, a substituted or unsubstituted biphenyl group, or a substituted or unsubstituted pyridine group. For example, $R_1$ to $R_4$ may be a substituted or unsubstituted phenyl group, a substituted or unsubstituted naphthyl group, a substituted or unsubstituted biphenyl group, or a substituted or unsubstituted pyridine group. However, this is an example, and an embodiment of the present disclosure is not limited thereto.

For example, the nitrogen-containing heterocyclic group may be represented by any one of the groups among W2-1 to W2-9 below. The nitrogen-containing heterocyclic group included in the aromatic compound according to an embodiment may be represented by any one of the groups among W2-1 to W2-9 below.

W2-1

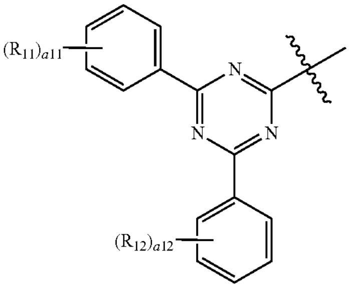

W2-2

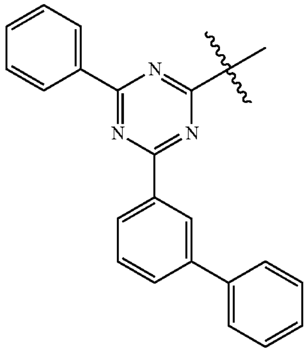

W2-3

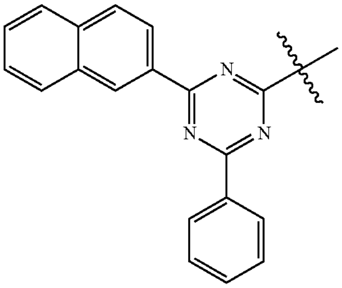

W2-4

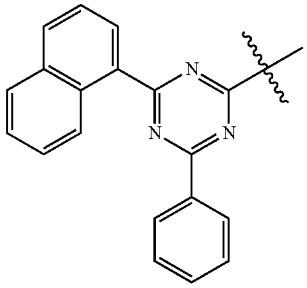

W2-5

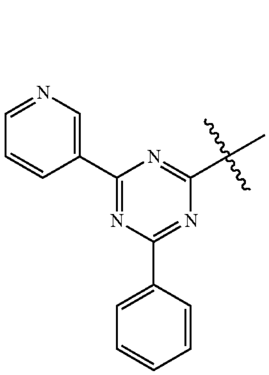

-continued

W2-6

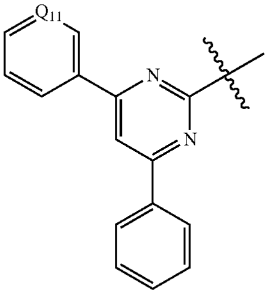

W2-7

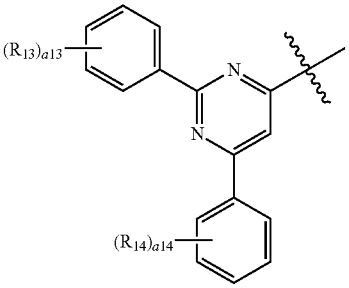

W2-8

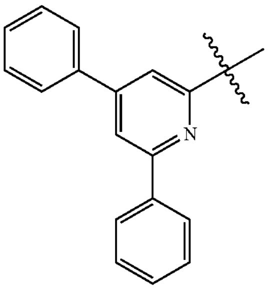

W2-9

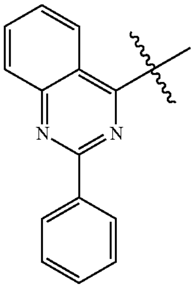

W2-1 represents a triazine group substituted with two phenyl groups, and W2-2 represents a triazine group which is substituted with a phenyl group and a biphenyl group. W2-3 and W2-4 represent a triazine group which is substituted with a phenyl group and a naphthyl group, and in W2-3 and W2-4, the positions of ring-forming carbon atoms of the naphthyl group bonded to the triazine group may be different. W2-5 represents a triazine group which is substituted with a phenyl group and a pyridine group. In W2-1, a11 and a12 may each independently represent 0 or 1, and $R_{11}$ and $R_{12}$ may each independently represent a hydrogen atom, a fluorine group, or a cyano group.

W2-6 represents a pyrimidine group substituted with one phenyl group and one pyridine group or with two phenyl groups. In W2-6, $Q_{11}$ may be N or CH. When $Q_{11}$ is N, the cyclic group including $Q_{11}$ may be a pyridine group, and if $Q_{11}$ is CH, the cyclic group including $Q_{11}$ may be a phenyl group.

W2-7 represents a pyrimidine group substituted with two phenyl groups. In W2-7, a13 and a14 may each independently represent 0 or 1, and $R_{13}$ and $R_{14}$ may each independently represent a hydrogen atom or a fluorine group.

W2-8 represents a pyridine group substituted with two phenyl groups. W2-9 represents a quinazoline group substituted with one phenyl group.

In an embodiment, Formula 1 may be represented by any one among Formulas 2-1 to 2-3 below. Formula 2-1 illustrates a case in which n1 and n3 are 1, and $L_1$ and $L_3$ may be the aryl group or the heteroaryl group in Formula 1. Formula 2-2 illustrates a case in which n1 and n3 are 1, and $L_1$ and $L_3$ may be a naphthylene group in Formula 1. In addition, Formula 2-1 and Formula 2-2 illustrate cases in which two selected from among $Ar_1$ to $Ar_4$ in Formula 1 may be $Ar_1$ and $Ar_3$. On the other hand, Formula 2-3 illustrates a case in which, in Formula 1, n1 and n2 are 1, and $L_1$ and $L_2$ may be naphthylene groups. Formula 2-3 illustrates a case in which two selected from among $Ar_1$ to $Ar_4$ in Formula 1 may be $Ar_1$ and $Ar_2$.

Formula 2-1

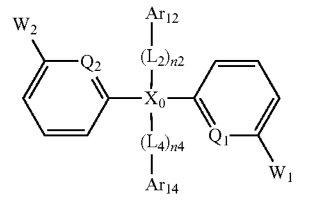

Formula 2-2

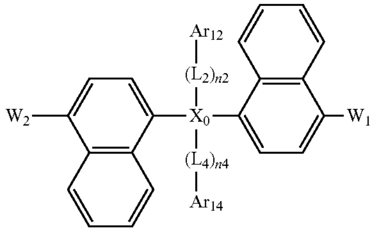

Formula 2-3

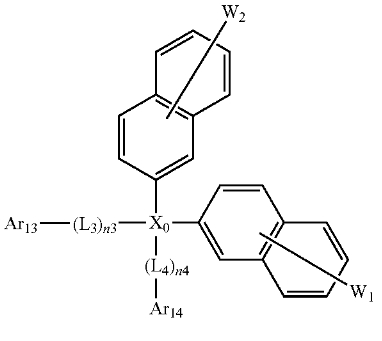

In Formulas 2-1 to 2-3, $L_2$ to $L_4$, n2 to n4, and $X_0$ may be the same as those described in Formula 1. In Formula 2-1, $Q_1$ and $Q_2$ may be each independently CH or N.

If $Q_1$ is CH, a cyclic group including $Q_1$ as a ring-forming atom may be a phenyl group. If $Q_1$ is N, a cyclic group including $Q_1$ as a ring-forming atom may be a pyridine group. Such description may be similarly applied to $Q_2$ and a cyclic group including $Q_2$ as a ring-forming atom.

In Formulas 2-1 to 2-3, W1 and W2 may be each independently a nitrogen-containing heterocyclic group. W1 and W2 may be the same as or different from each other.

In Formulas 2-1 to 2-3, $Ar_{12}$ to $Ar_{14}$ may be the unselected remaining two from among $Ar_1$ to $Ar_4$ in Formula 1. In Formulas 2-1 to 2-3, $Ar_{12}$ to $Ar_{14}$ may be each independently a hydrogen atom, a substituted or unsubstituted aryl group having 6 to 30 ring-forming carbon atoms, or a substituted or unsubstituted heteroaryl group having 2 to 30 ring-forming carbon atoms.

In Formula 2-1, $L_2$ and $L_4$ may be the same as each other. For example, $L_2$ and $L_4$ may each be an unsubstituted phenyl group, a phenyl group substituted with a fluorine group, or a phenyl group substituted with a pyridine group. However, this is an example, and an embodiment of the present disclosure is not limited thereto.

In Formula 2-1, W1 and $X_0$ may be bonded to the meta position of a ring group including $Q_1$ as a ring-forming atom. In Formula 1, when two selected from among $Ar_1$ to $Ar_4$ may be $Ar_1$ and $Ar_3$, and n1 and n3 are 1, $Ar_1$ and $Ar_3$ may be bonded to the meta position with respect to $X_0$. However, when $L_1$ and $L_3$ may be an aryl group having 7 to 30 carbon atoms or include a polycyclic ring, the bonding position of the nitrogen-containing heterocyclic group and $X_0$ is not limited thereto.

In Formula 2-1, the nitrogen-containing heterocyclic groups represented by $W_1$ and $W_2$ may be each indirectly bonded to $X_0$ through a phenylene group or a pyridylene group. In Formulas 2-2 and 2-3, the nitrogen-containing heterocyclic groups represented by $W_1$ and $W_2$ may be each indirectly bonded to $X_0$ through a naphthylene group. $W_1$ and $W_2$ may be each independently represented by any one of the groups among W1-1 to W1-4 described above.

In an embodiment, Formula 1 may be represented by Formula 3 below. Formula 3 illustrates a case in which in Formula 1, n1 and n3 are 2 and two selected from among $Ar_1$ to $Ar_4$ may be $Ar_1$ and $Ar_3$.

Formula 3

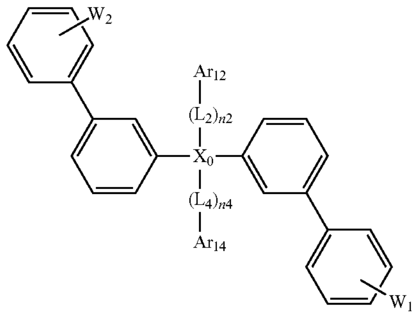

In Formula 3, $L_2$, $L_4$, n2, n4, and $X_0$ may be the same as those described in Formula 1. In Formula 3, $W_1$ and $W_2$ may be each independently a nitrogen-containing heterocyclic group. $W_1$ and $W_2$ may be the same as or different from each other.

In Formula 3, $Ar_{12}$ and $Ar_{14}$ may be the unselected remaining two groups from among $Ar_1$ to $Ar_4$ in Formula 1. In Formula 3, $Ar_{12}$ and $Ar_{14}$ may be each independently a hydrogen atom, a substituted or unsubstituted aryl group having 6 to 30 ring-forming carbon atoms, or a substituted or unsubstituted heteroaryl group having 2 to 30 ring-forming carbon atoms.

The aromatic compound according to an embodiment may be represented by any one of compounds of Compound Group 1 below. The light-emitting element ED according to an embodiment may include any one of the compounds of the Compound Group 1 below.

Compound Group 1
1
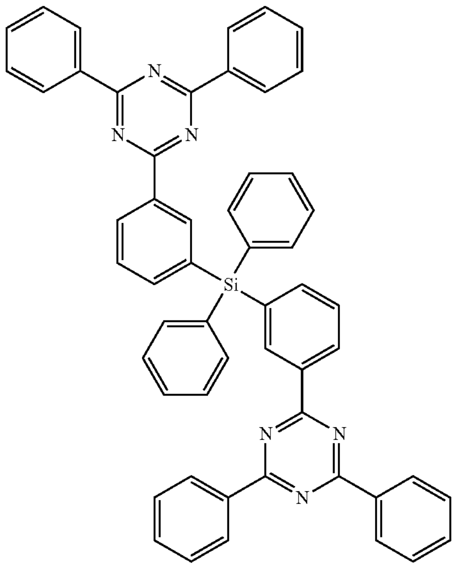
-continued
3
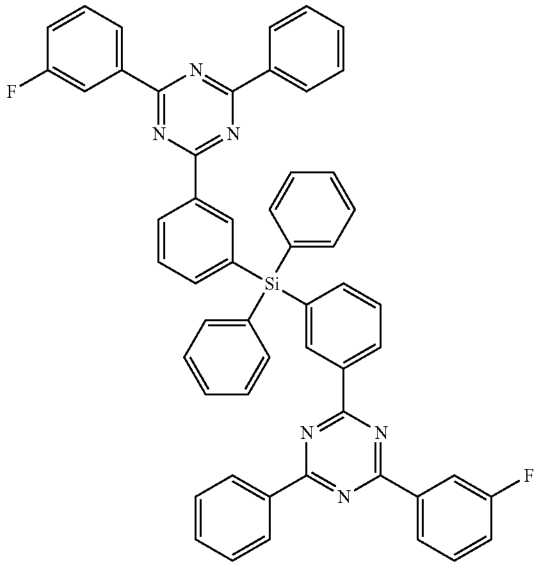
2
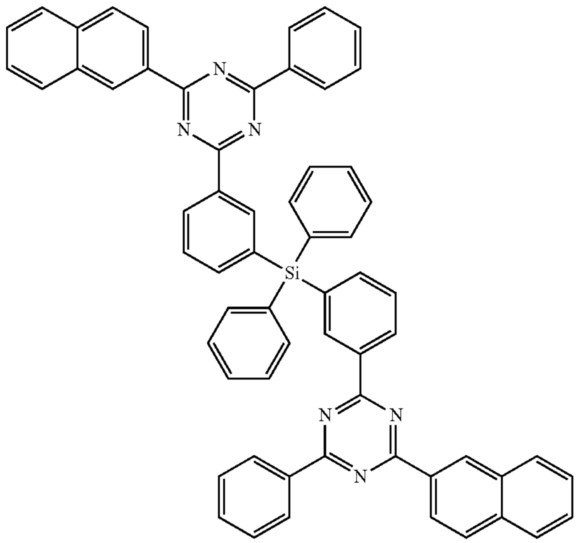
4
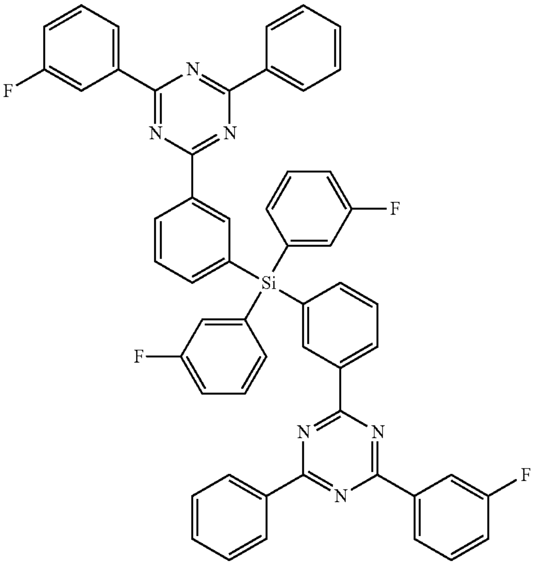

-continued
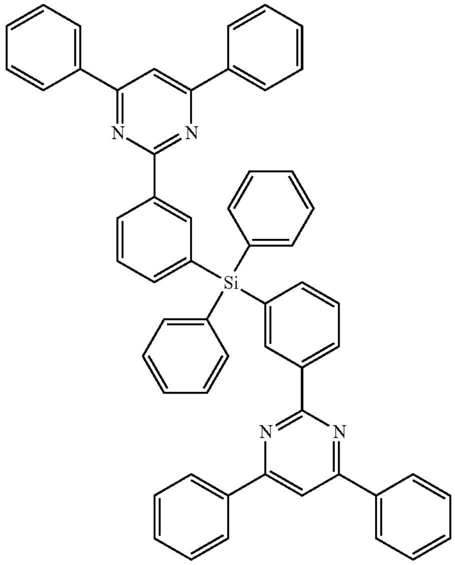
5
-continued
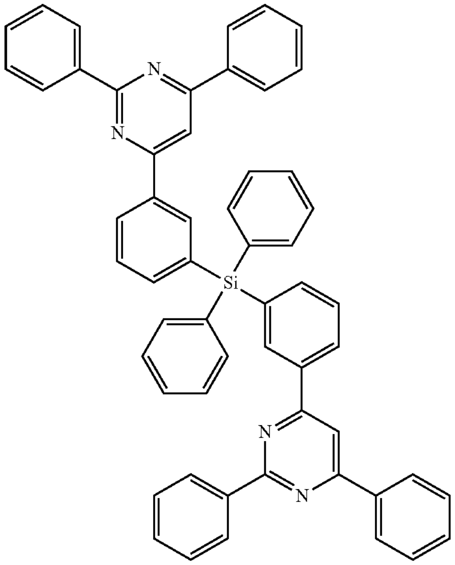
7
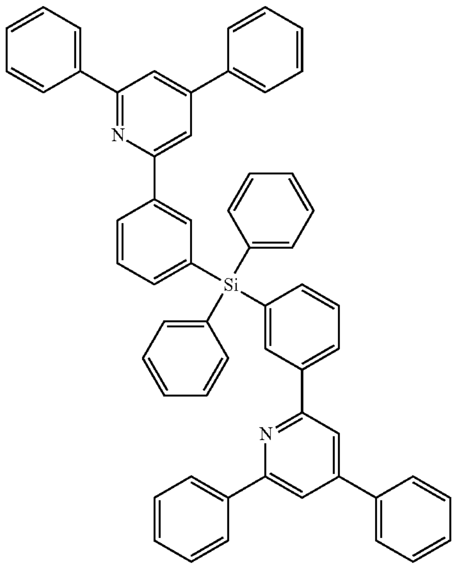
6
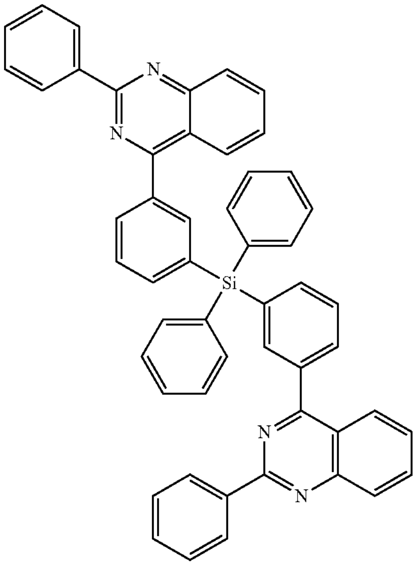
8

-continued
9
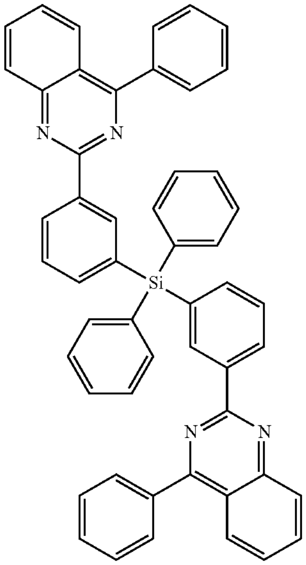
10
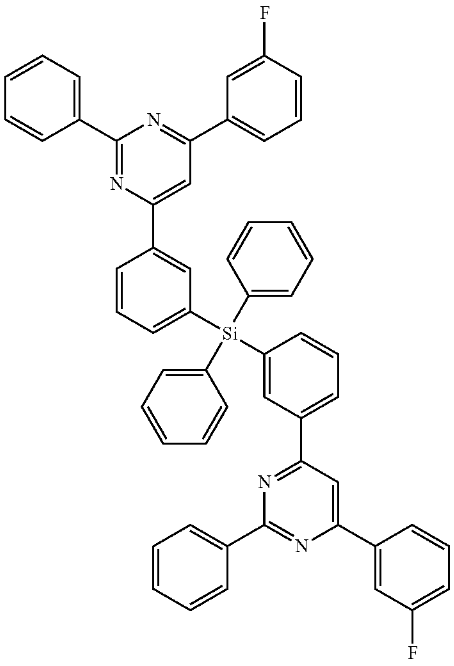
-continued
11
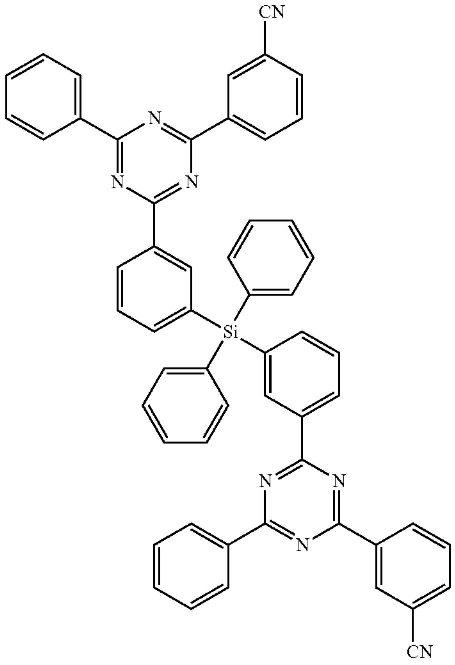
12
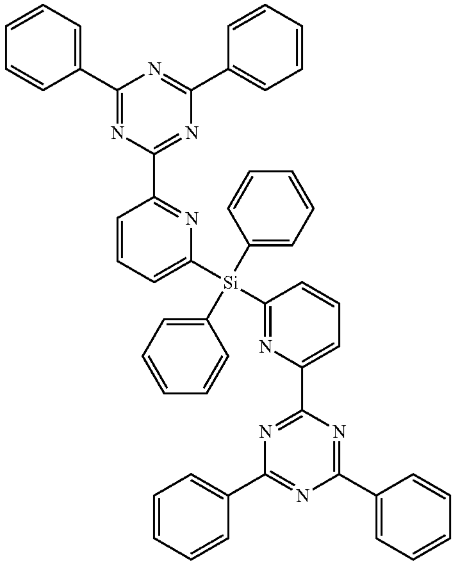

13
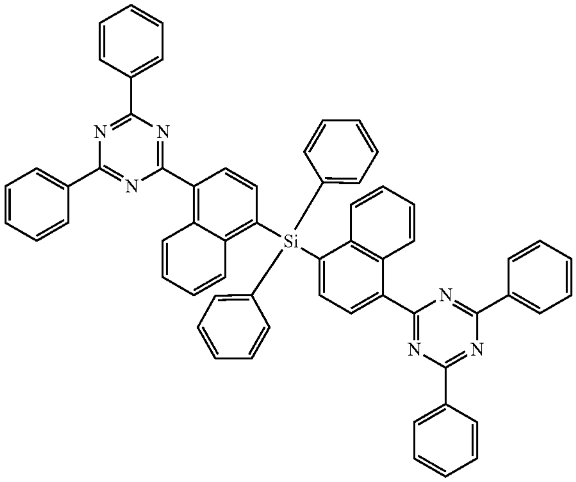
14
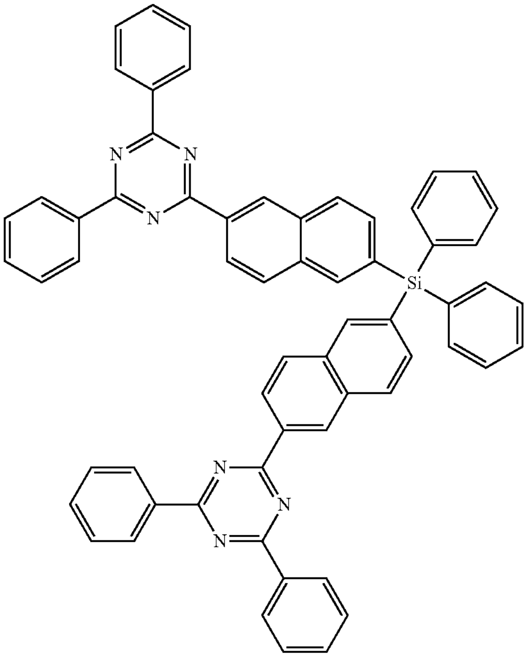
15
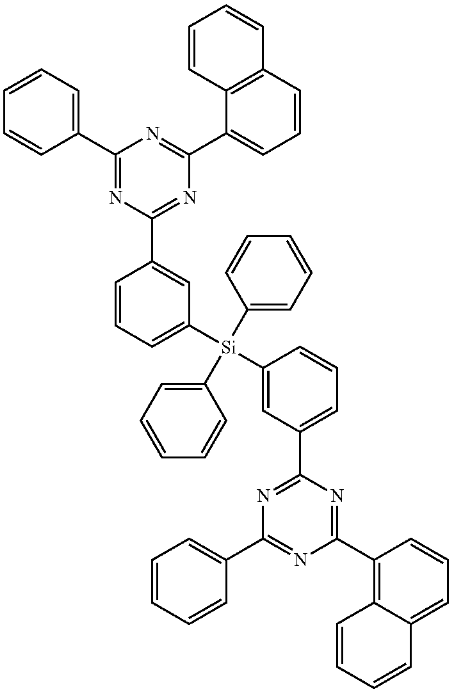
16
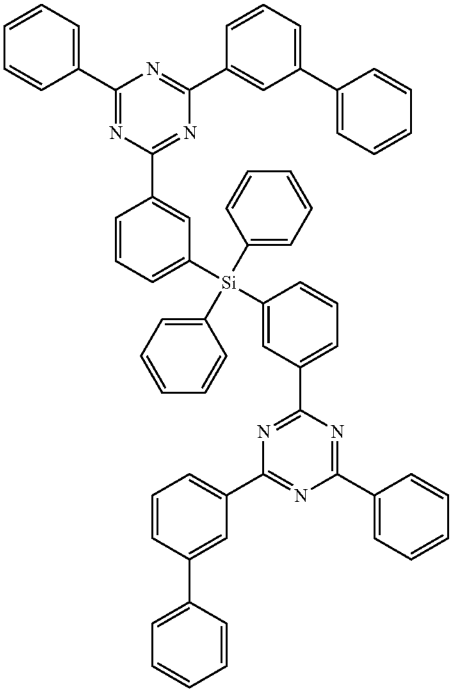

-continued
17
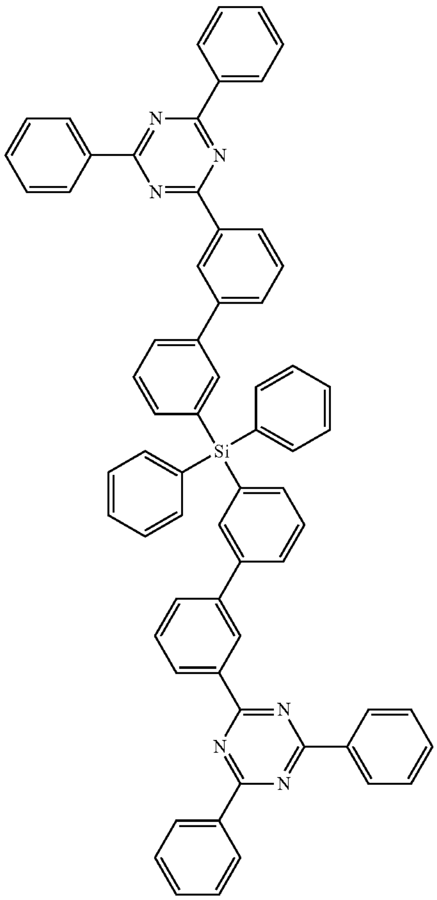
18
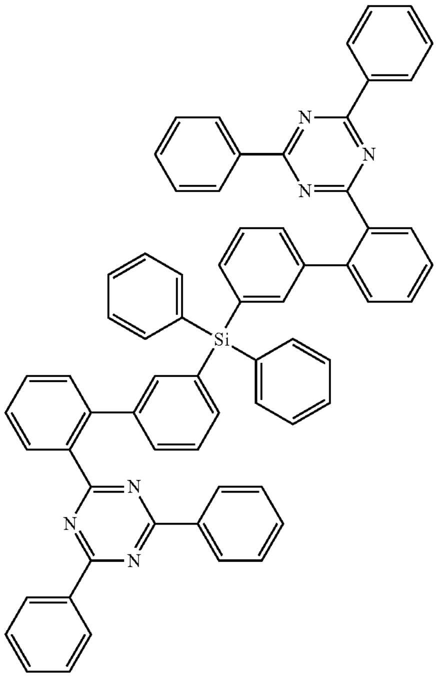
-continued
19
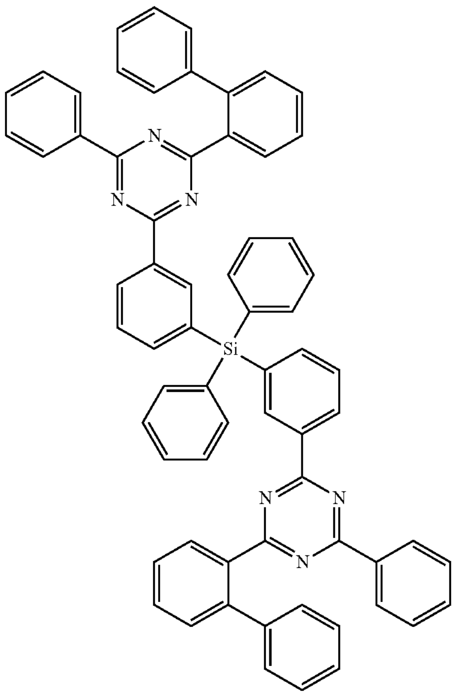
20
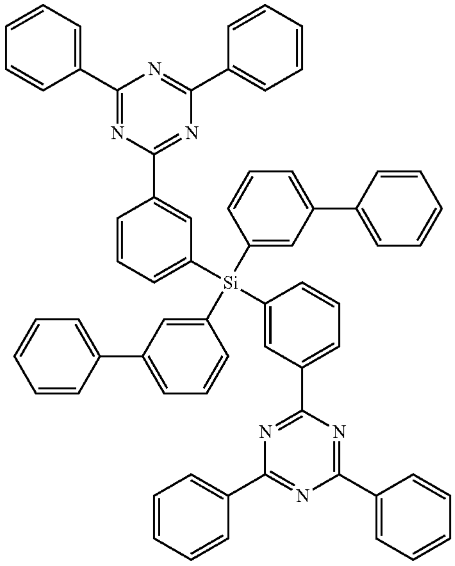

-continued
21
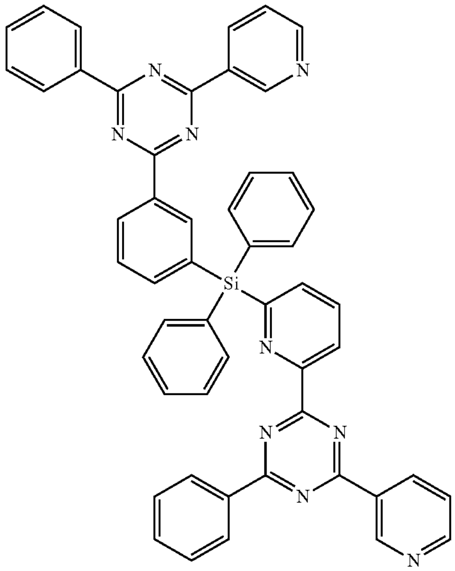
22
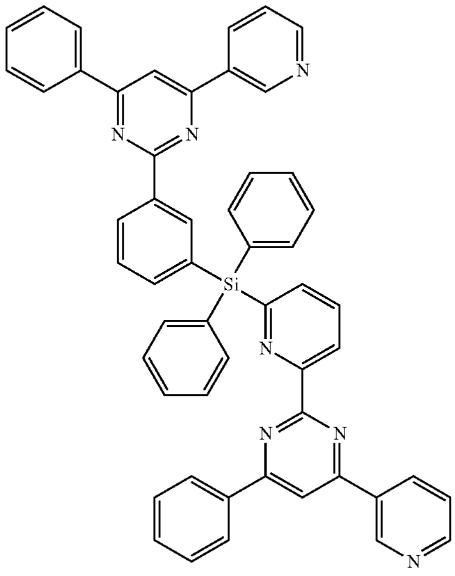
-continued
23
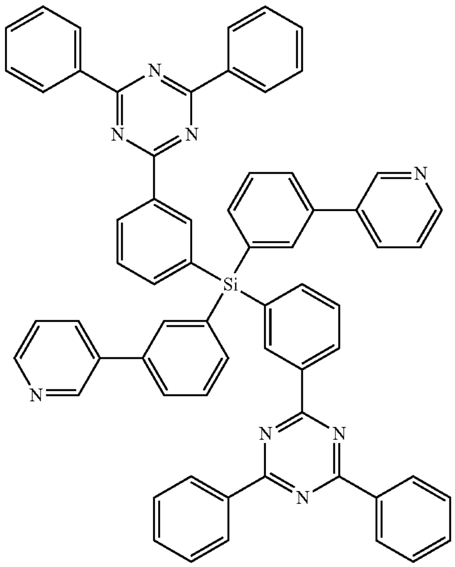
24
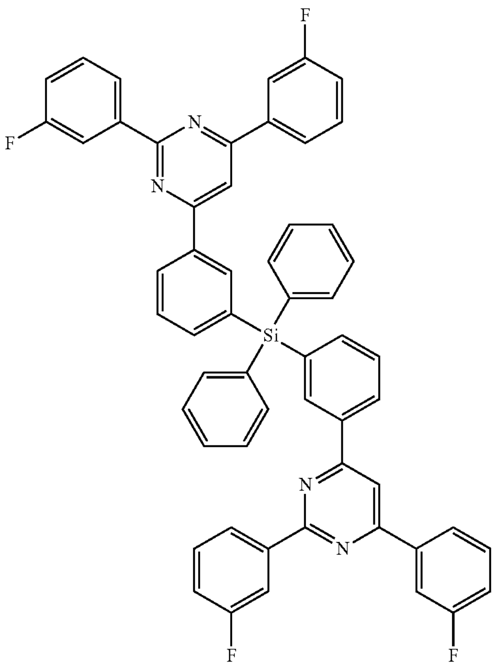

-continued
25
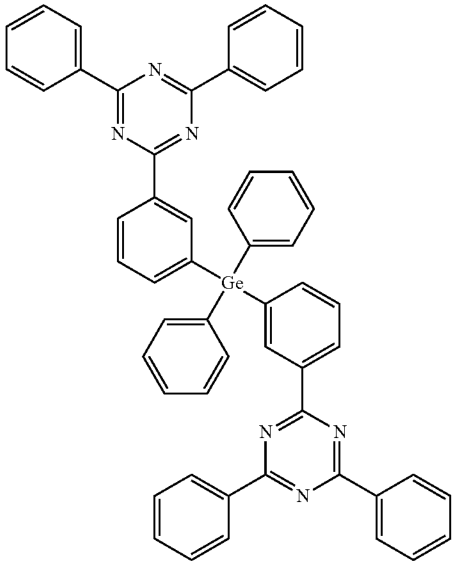
27
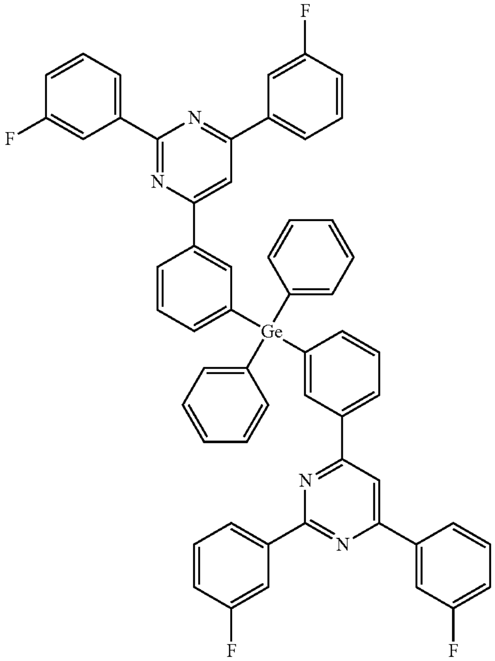
26
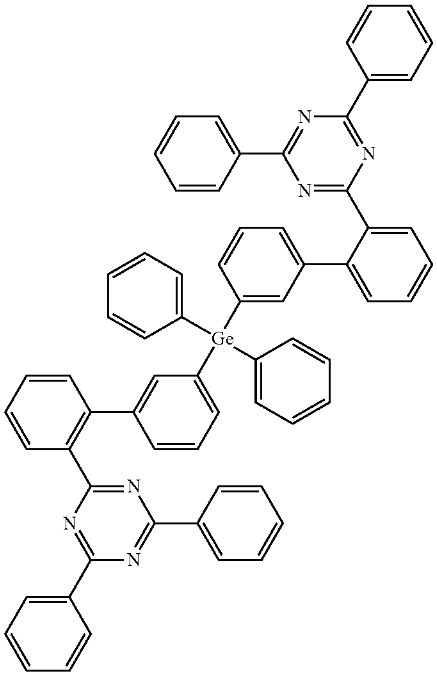
28
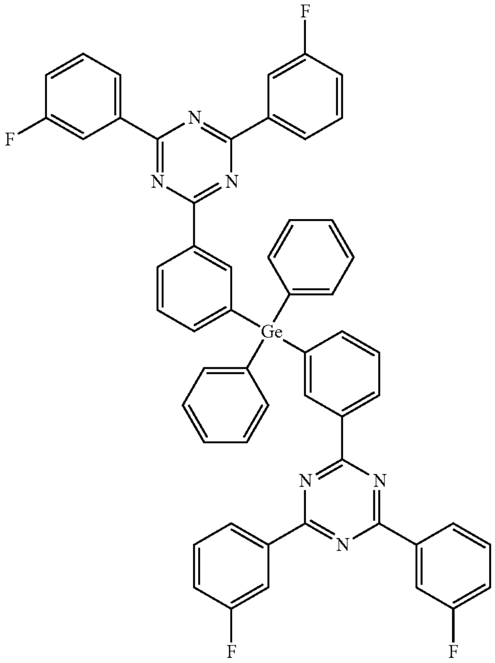
-continued

-continued

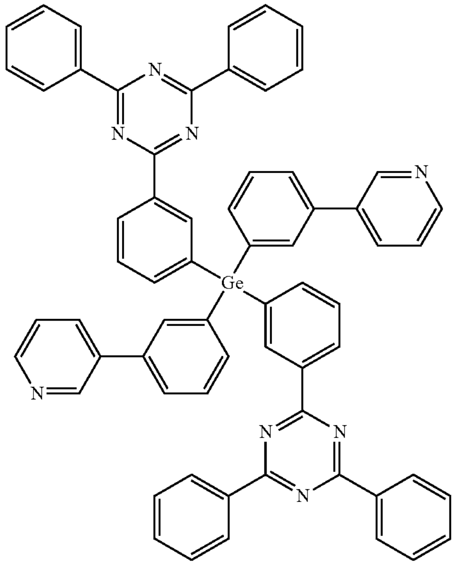

29

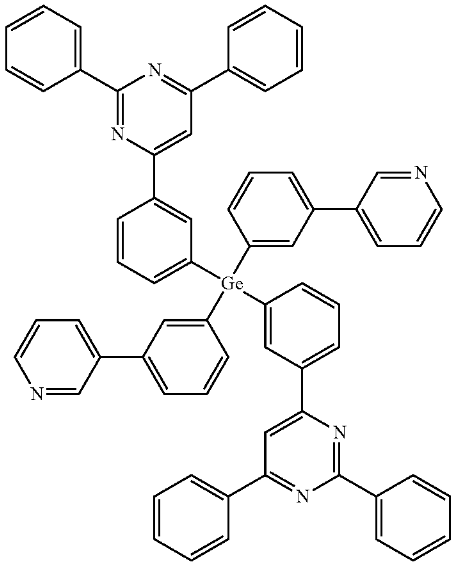

30

The aromatic compound according to an embodiment may include four ring groups bonded to a silicon (Si) atom or a germanium (Ge) atom. The four ring groups may each be a hydrocarbon ring group or a heterocyclic group. Due to the three-dimensional structure of the hydrocarbon ring group or the heterocyclic group, intermolecular interactions of aromatic compounds may be prevented (reduced). Accordingly, in the aromatic compound according to an embodiment, quenching of triplet excitons or formation of excimers may be minimized (reduced). The excimers may be formed by bonding identical molecules in an excited state.

In addition, a nitrogen-containing heterocyclic group may be bonded to two ring groups selected from among the four ring groups of the aromatic compound. The nitrogen-containing heterocyclic group is an electron withdrawing group, and the aromatic compound according to an embodiment including the nitrogen-containing heterocyclic group may exhibit excellent electron transport properties. Accordingly, the light-emitting element ED including the aromatic compound according to an embodiment may exhibit improved efficiency and driving voltage. The light-emitting element ED according to an embodiment may include the aromatic compound according to an embodiment in at least one of the light-emitting layer EML or the electron transport region ETR.

Referring again to FIGS. 3 to 6, the first electrode EL1 has conductivity. The first electrode EL1 may be formed of a metal material, a metal alloy or a conductive compound. The first electrode EL1 may be an anode or a cathode. However, an embodiment of the present disclosure is not limited thereto. In addition, the first electrode EL1 may be a pixel electrode. The first electrode EL1 may be a transmissive electrode, a transflective electrode, or a reflective electrode. The first electrode EL1 may include: at least one element or compound selected from among Ag, Mg, Cu, Al, Pt, Pd, Au, Ni, Nd, Ir, Cr, Li, Ca, LiF, Mo, Ti, W, In, Sn, and Zn; two or more elements or compounds selected from thereamong; a mixture of two or more elements or compounds selected from thereamong; and/or oxides of at least one element or compound thereof.

If the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (stacked structure of LiF and Ca), LiF/Al (stacked structure of LiF and Al), Mo, Ti, W, compounds thereof, and/or mixtures thereof (for example, a mixture of Ag and Mg).

Also, the first electrode EL1 may have a multilayer structure including a reflective film or a transflective film formed of the above materials, and a transparent conductive film formed of ITO, IZO, ZnO, ITZO and/or the like. For example, the first electrode EL1 may include a three-layer structure of ITO/Ag/ITO. However, an embodiment of the present disclosure is not limited thereto. The first electrode EL1 may include the above-described metal materials, combinations of two or more metal materials selected from among the above-described metal materials, or oxides of the above-described metal materials. The first electrode EL1 may have a thickness of about 700 Å to about 10,000 Å. For example, the first electrode EL1 may have a thickness of about 1,000 Å to about 3,000 Å.

The hole transport region HTR is provided on the first electrode EL1. The hole transport region HTR may include at least one of a hole injection layer HIL, a hole transport layer HTL, a buffer layer or a light-emitting auxiliary layer, or an electron blocking layer EBL. The hole transport region HTR may have a thickness of, for example, about 50 Å to about 15,000 Å.

The hole transport region HTR may have a single layer formed of a single material, a single layer formed of multiple different materials, or a multilayer structure having multiple layers formed of multiple different materials.

For example, the hole transport region HTR may have a structure of a single layer of a hole injection layer HIL or a hole transport layer HTL, and may have a structure of a single layer formed of a hole injection material and a hole transport material. In some embodiments, the hole transport region HTR may have a structure of a single layer formed of multiple different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL, which may be sequentially stacked from the first electrode EL1, but an embodiment of the present disclosure is not limited thereto.

The hole transport region HTR may be formed using various suitable methods such as, but not limited to, a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

Formula H-1

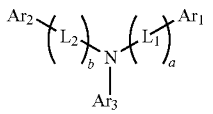

In Formula H-1, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. If a or b is an integer of 2 or more, a plurality of $L_1$ and a plurality of $L_2$ may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 may be a monoamine compound. In some embodiments, the compound represented by Formula H-1 may be a diamine compound in which at least one group among $Ar_1$ to $Ar_3$ includes an amine group as a substituent. In addition, the compound represented by Formula H-1 may be a carbazole-based compound in which at least one group among $Ar_1$ and $Ar_2$ includes a substituted or unsubstituted carbazole group, or a fluorene-based compound in which at least one group among $Ar_1$ and $Ar_2$ includes a substituted or unsubstituted fluorene group.

The compound represented by Formula H-1 may be represented by any one of the compounds in Compound Group H below. However, the compounds in Compound Group H are only examples, and the compound represented by Formula H-1 is not limited to the compounds represented in Compound Group H below.

Compound Group H

H-1-1

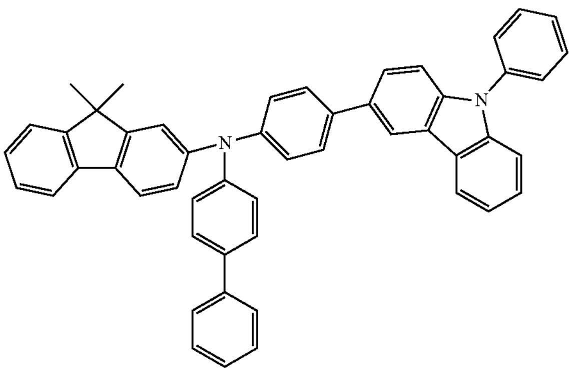

H-1-2

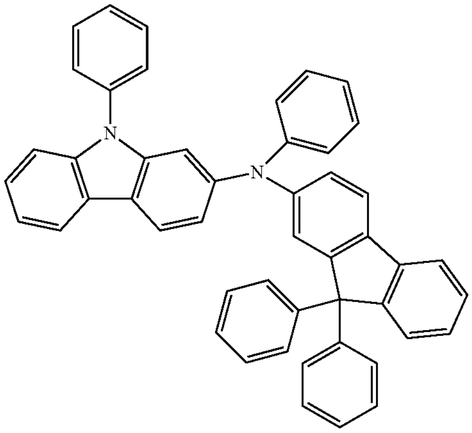

H-1-3

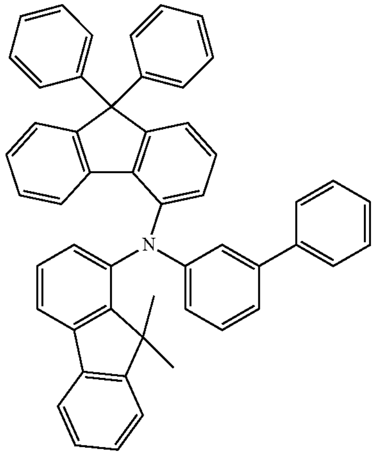

H-1-4

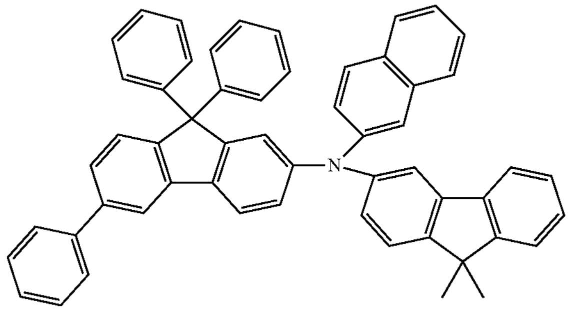

-continued
H-1-5
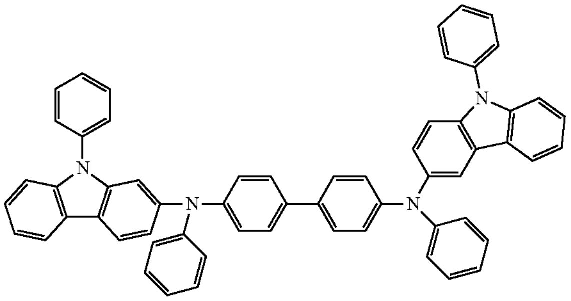
H-1-6
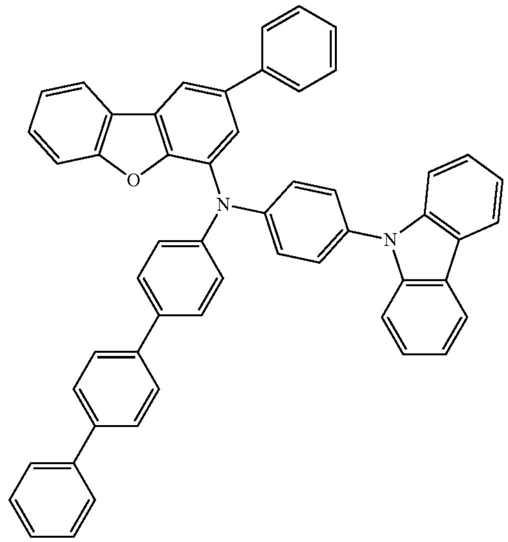
H-1-7
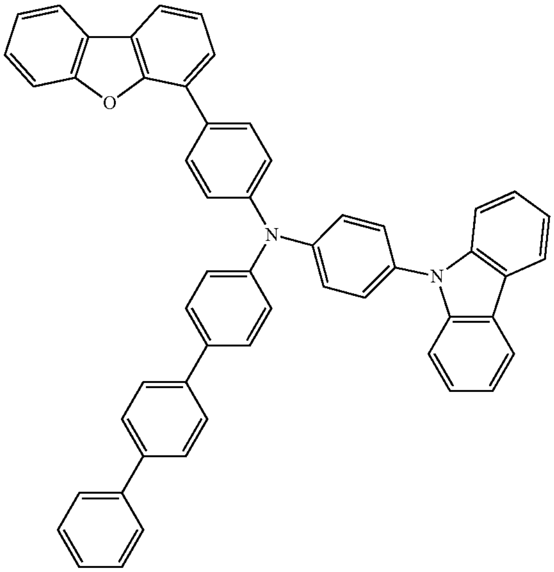
-continued
H-1-8
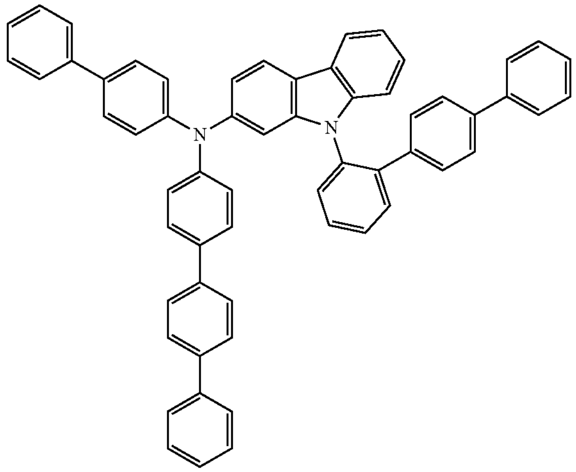
H-1-9
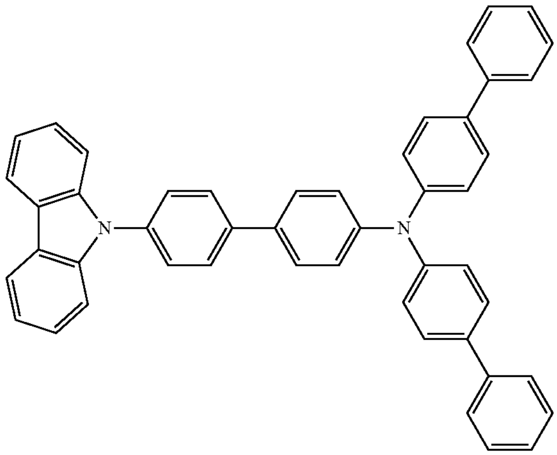
H-1-10
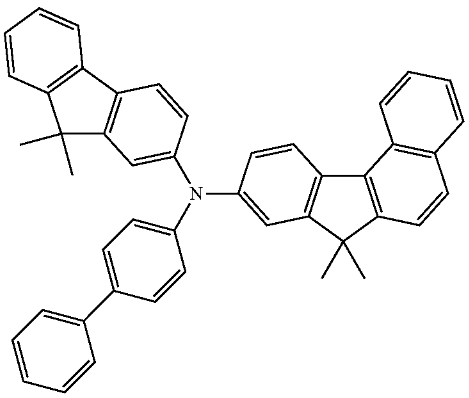

-continued
H-1-11
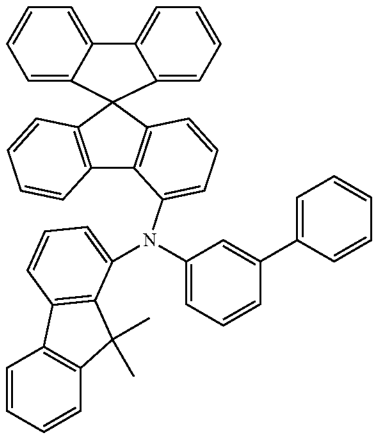
H-1-12
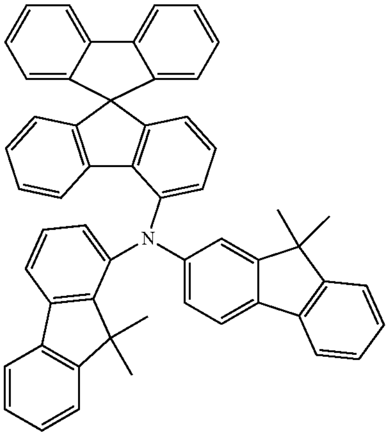
H-1-13
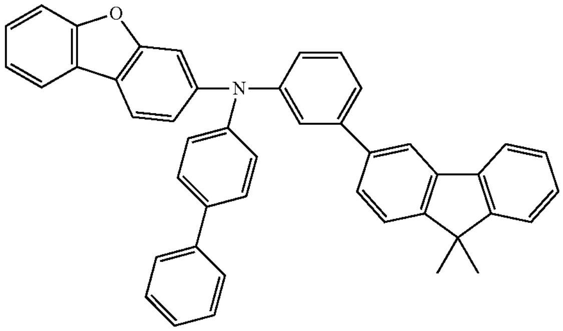
H-1-14
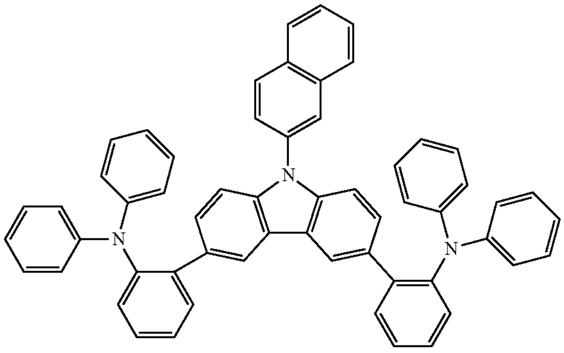
-continued
H-1-15
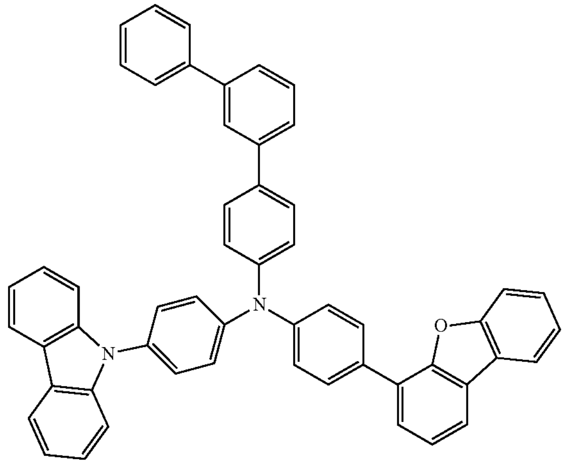
H-1-16
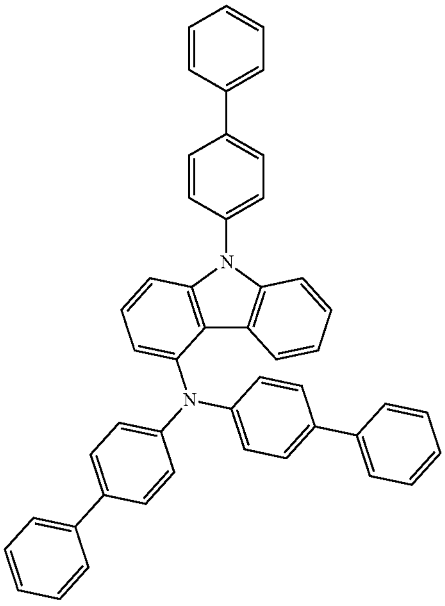
H-1-17
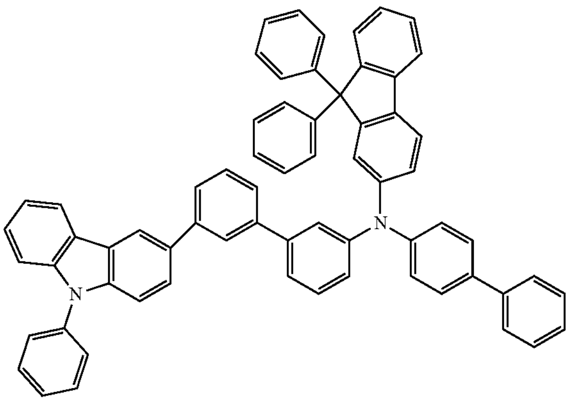

-continued

H-1-18

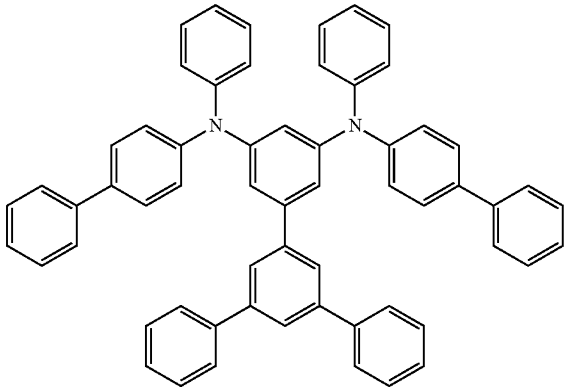

H-1-19

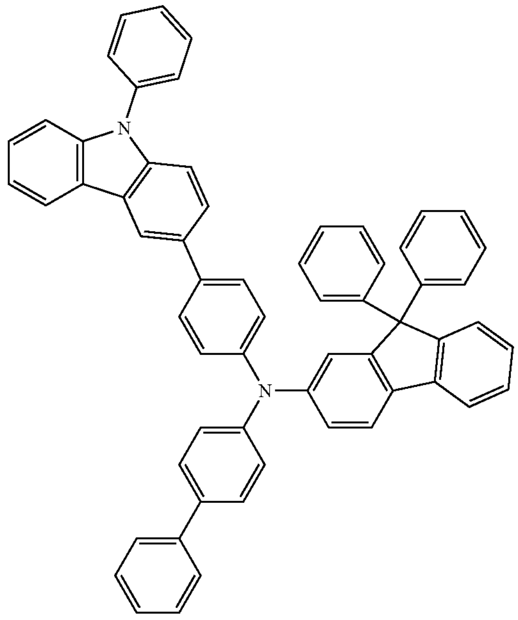

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f:2',3'-h]quinoxaline-2,3,6,7,10,11-hexacarbonitrile (HATCN), etc.

In addition, the hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine derivatives such as 4,4',4"-tris(N-carbazolyl)triphenylamine (TCTA), N,N'-di(naphthalene-I-yl)-N,N'-diphenyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), or 1,3-bis(1,8-dimethyl-9H-carbazol-9-yl)benzene (mDCP), etc.

The hole transport region HTR may include the above-described compounds of the hole transport region in at least one of the hole injection layer HIL, the hole transport layer HTL, or the electron blocking layer EBL.

The hole transport region HTR may have a thickness of about 100 Å to about 10,000 Å, for example, about 100 Å to about 5,000 Å. When the hole transport region HTR includes a hole injection layer HIL, the hole injection layer HIL may have a thickness of, for example, about 30 Å to about 1,000 Å. In the case in which the hole transport region HTR includes a hole transport layer HTL, the hole transport layer HTL may have a thickness of about 30 Å to about 1,000 Å. For example, in the case in which the hole transport region HTR includes an electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, satisfactory (suitable) hole transport properties may be achieved without a substantial increase in driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include at least one of a metal halide compound, a quinone derivatives, metal oxide, or a cyano group-containing compound, but an embodiment of the present disclosure is not limited thereto. For example, the p-dopant may include a metal halide compound such as CuI and RbI, a quinone derivative such as tetracyanoquinodimethane (TCNQ) and 2,3,5,6-tetrafluoro-7,7',8,8-tetracyanoquinodimethane (F4-TCNQ), a metal oxide such as tungsten oxide and molybdenum oxide, a cyano group-containing compound such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but an embodiment of the present disclosure is not limited thereto.

As described above, the hole transport region HTR may further include at least one of a buffer layer or an electron blocking layer EBL in addition to the hole injection layer HIL and the hole transport layer HTL. The buffer layer may compensate for a resonance distance according to the wavelength of light emitted from the light-emitting layer EML and may increase emission efficiency. Materials which may be included in the hole transport region HTR may also be used as materials included in the buffer layer. The electron blocking layer EBL serves to prevent (reduce) the injection of electrons from the electron transport region ETR to the hole transport region HTR.

The light-emitting layer EML is provided on the hole transport region HTR. The light-emitting layer EML may have a thickness of, for example, about 100 Å to about 1,000 Å or about 100 Å to about 300 Å. The light-emitting layer EML may have a single layer formed of a single material, a single layer formed of multiple different materials, or a multilayer structure having multiple layers formed of multiple different materials.

In the light-emitting element ED according to an embodiment, the light-emitting layer EML may include an aromatic compound represented by Formula 1. For example, the aromatic compound according to an embodiment may be used as a host of the light-emitting layer EML.

In addition, the light-emitting layer EML may include an anthracene derivative, a pyrene derivative, a fluoranthene derivative, a chrysene derivative, a dihydrobenzanthracene derivative, or a triphenylene derivative. For example, the light-emitting layer EML may include the anthracene derivative or the pyrene derivative.

In the light-emitting element ED according to an embodiment illustrated in FIGS. 3 to 6, the light-emitting layer EML may include a host and a dopant, and the host may include one or two or more hosts. For example, the dopant may be a fluorescent dopant. In addition, the light-emitting layer EML may further include a sensitizer, and the sensitizer may be a phosphorescent sensitizer or a thermally activated delayed fluorescence (TADF) sensitizer.

For example, the light-emitting layer may include a hole transport host and an electron transport host, and the hole transport host and the electron transport host may form an exciplex. In this case, a triplet energy of the exciplex formed by a hole-transporting host and an electron-transporting host may correspond to an interval between a lowest unoccupied molecular orbital (LUMO) energy level of the electron-transporting host and a highest occupied molecular orbital (HOMO) energy level of the hole-transporting host. For example, in the light-emitting element ED, an absolute value of a triplet energy (T1) level of the exciplex formed by the hole-transporting host and the electron-transporting host may be about 2.4 eV to about 3.0 eV.

In addition, the triplet energy level of the exciplex may be a value smaller than the energy gap of each host material. For example, the exciplex may have an absolute value of a triplet energy level of 3.0 eV or less, which is an energy gap between the hole-transporting host and the electron-transporting host.

The light-emitting layer EML may include a compound represented by Formula E-1 below. The compound represented by Formula E-1 below may be used as a fluorescence host material.

Formula E-1

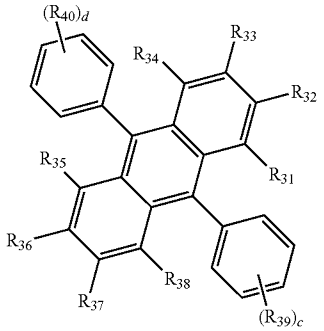

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, "c" and "d" may be each independently an integer of 0 to 5. Formula E-1 may be represented by any one among Compound E1 to Compound E19 below.

E1

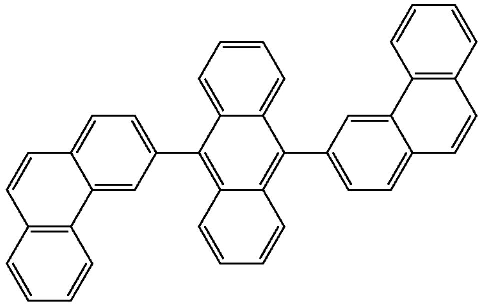

E2

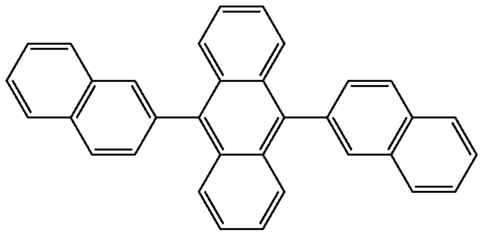

E3

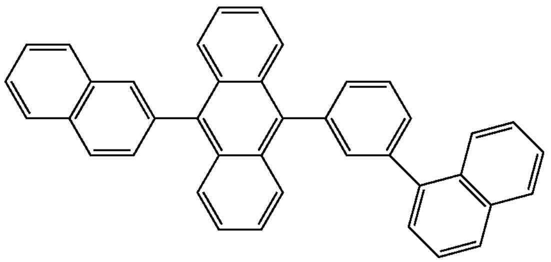

E7

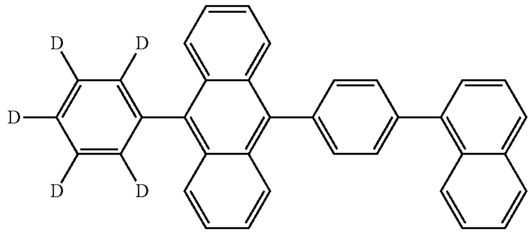

E8

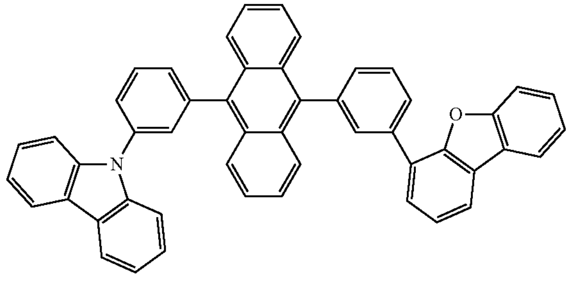

-continued

E9

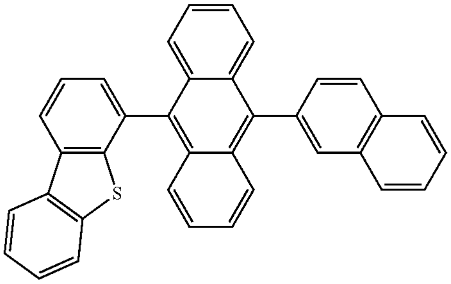

E13

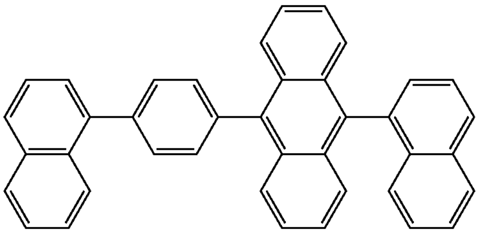

E14

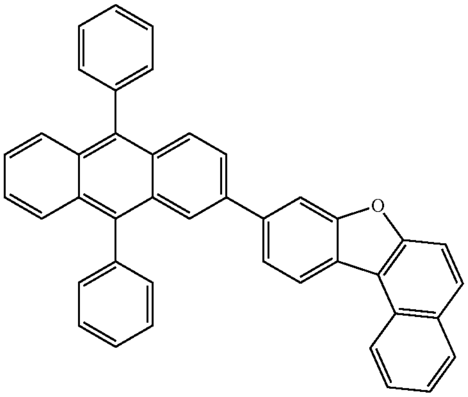

E15

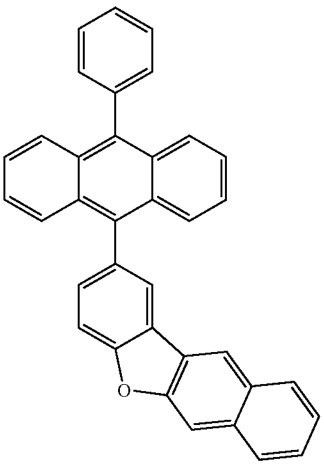

-continued

E19

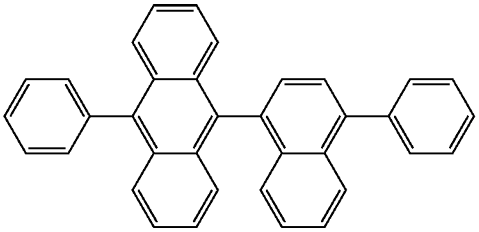

In an embodiment, the light-emitting layer EML may include a compound represented by Formula E-2a or Formula E-2b below. The compound represented by Formula E-2a or Formula E-2b below may be used as a phosphorescence host material.

Formula E-2a

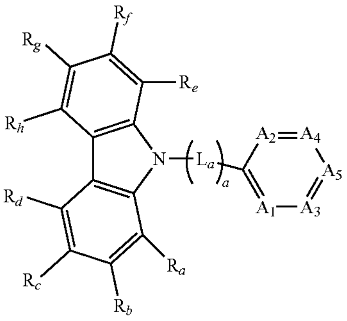

In Formula E-2a, "a" may be an integer of 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. If "a" is an integer of 2 or more, a plurality of La may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle including N, O, S, etc., as a ring-forming atom.

In Formula E-2a, two or three selected from among $A_1$ to $A_5$ may be N, and the remainder may be $CR_i$.

Formula E-2b $$(Cbz1)-(L_b)_b-(Cbz2)$$

In Formula E-2b, Cbz1 and Cbz2 may be each independently an unsubstituted carbazole group or a carbazole group which is substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. "b" is an integer of 0 to 10, and when "b" is an integer of 2 or more, a plurality of $L_b$ may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of the compounds in Compound Group E-2 below. However, the compounds in Compound Group E-2 below are only examples, and the compound represented by Formula E-2a or Formula E-2b is not limited to the compounds represented in Compound Group E-2 below.

Compound Group E-2

E-2-1

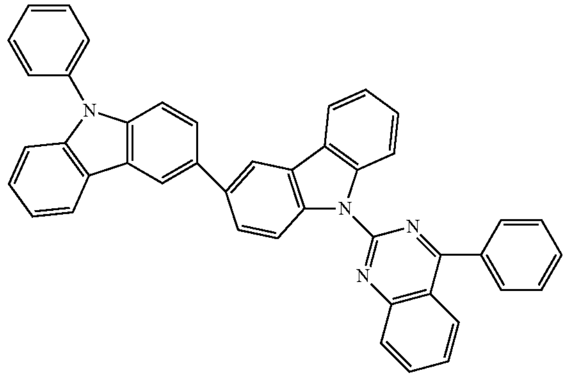

E-2-2

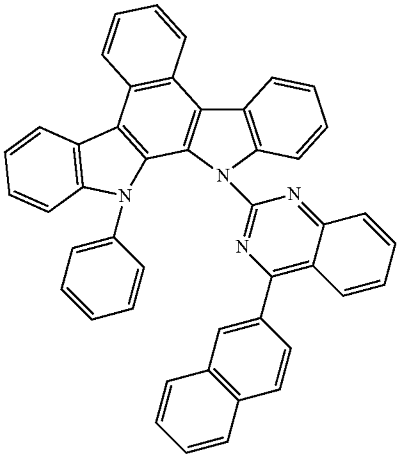

-continued

E-2-3

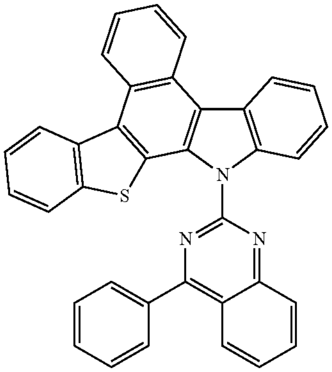

E-2-4

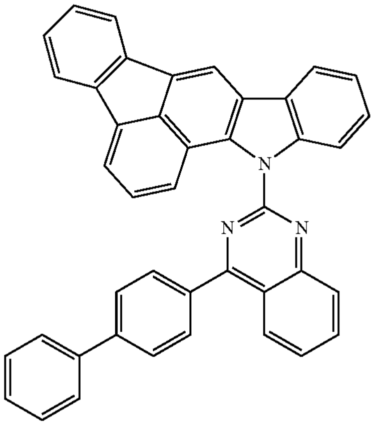

E-2-5

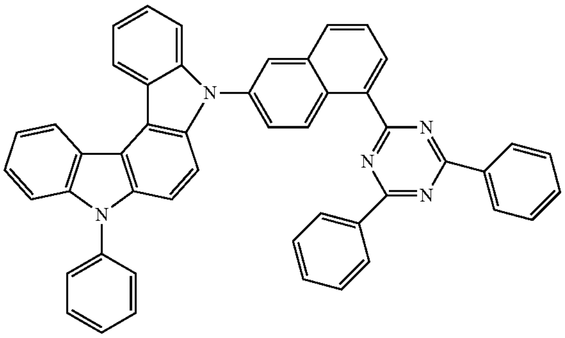

E-2-6

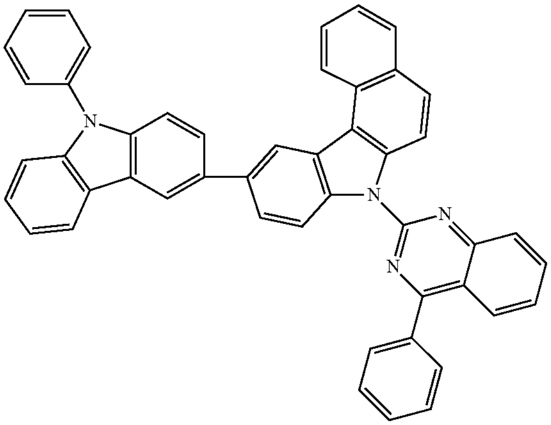

-continued
E-2-7
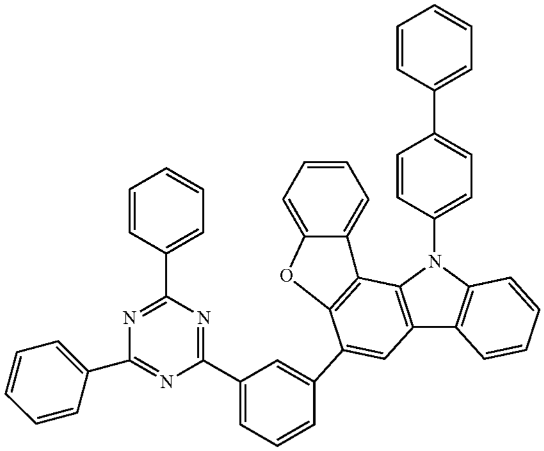
E-2-8
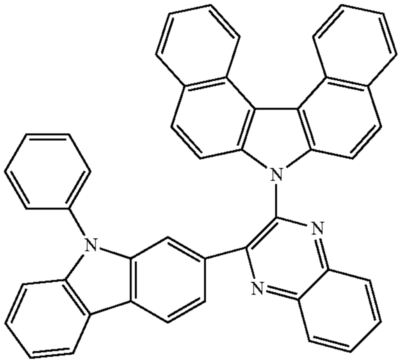
E-2-9
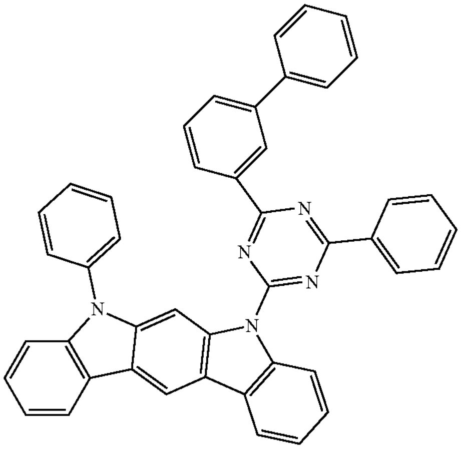
-continued
E-2-10
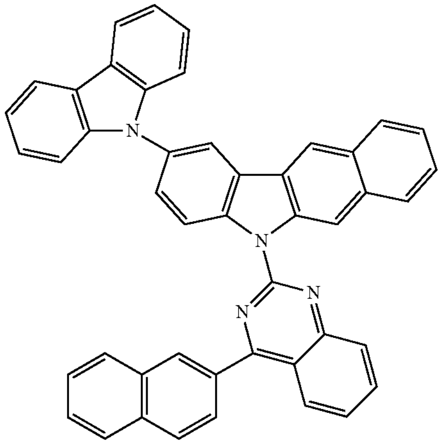
E-2-11
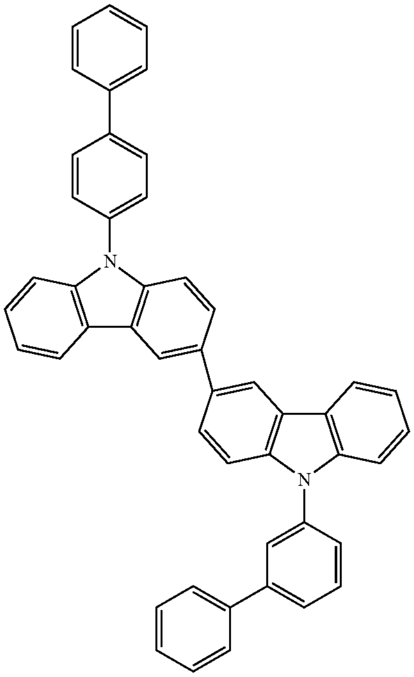
E-2-12
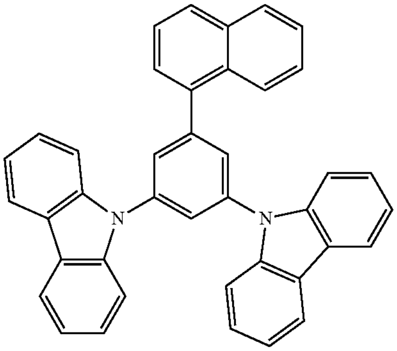

-continued
E-2-13
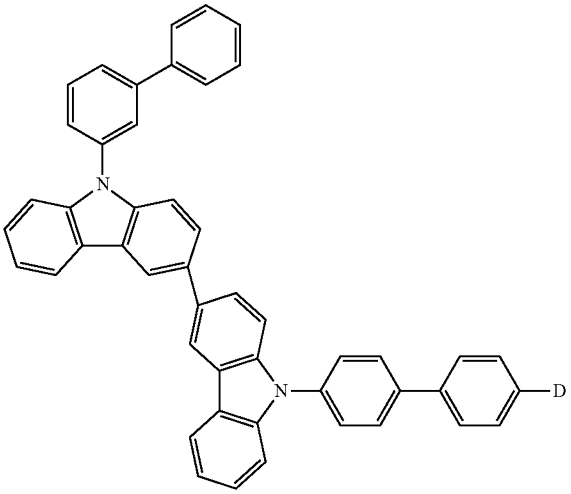
E-2-14
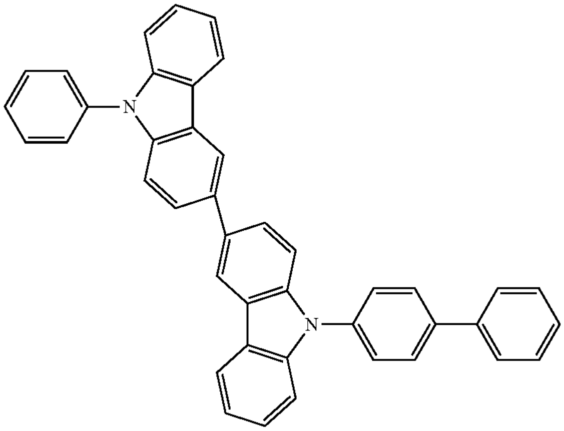
E-2-15
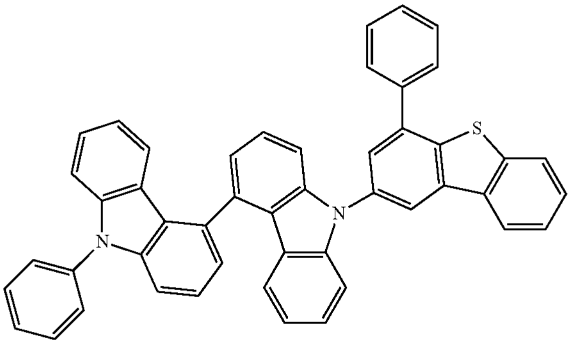
-continued
E-2-16
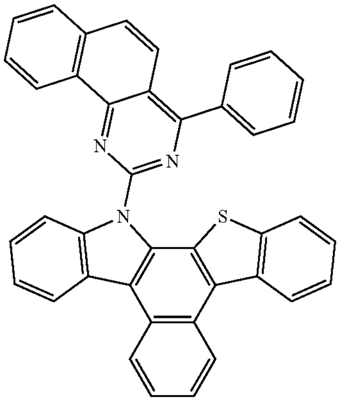
E-2-17
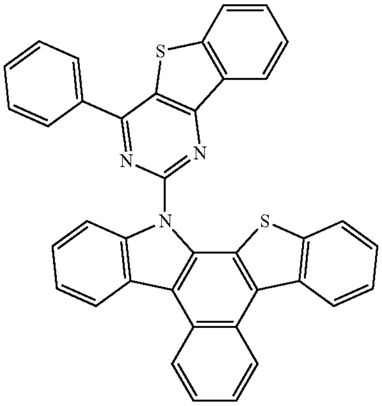
E-2-18
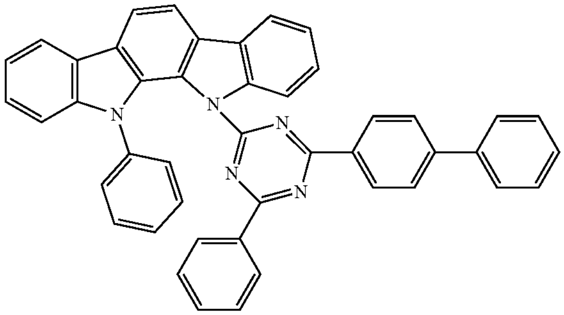
E-2-19
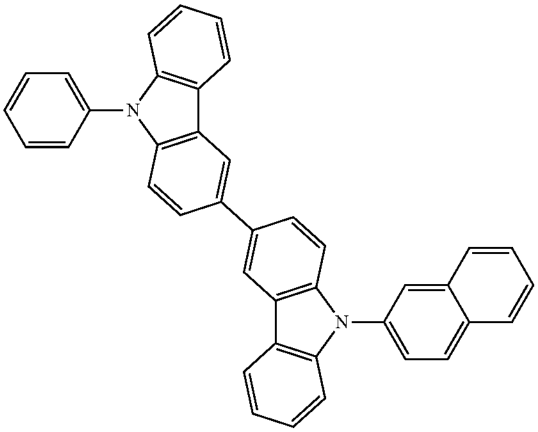

-continued

E-2-20

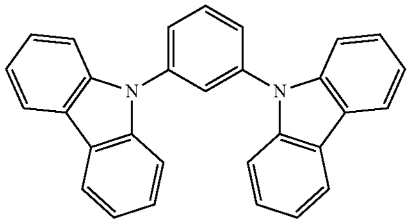

E-2-21

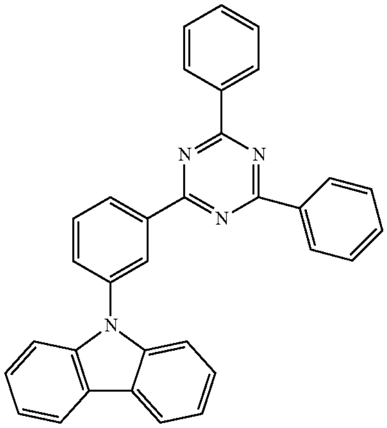

E-2-22

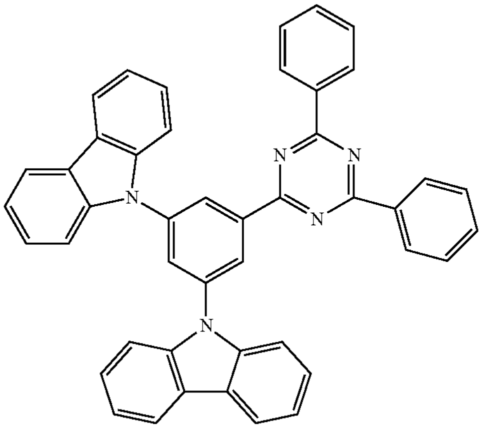

E-2-23

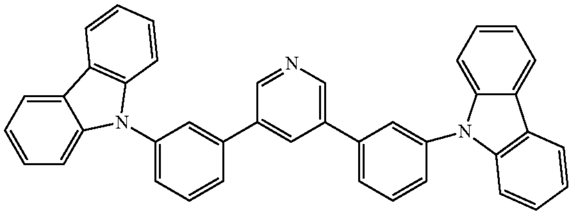

-continued

E-2-24

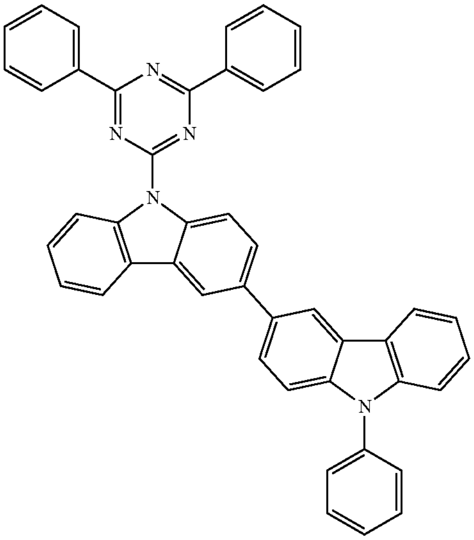

The light-emitting layer EML may further include a material generally used/generally available in the art as a host material. For example, the light-emitting layer EML may include as a host material, at least one of 3,3'-di(9H-carbazol-9-yl)biphenyl (mCBP), bis (4-(9H-carbazol-9-yl) phenyl)diphenylsilane (BCPDS), (4-(1-(4-(diphenylamino) phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA) or 1,3,5-tris(1-phenyl-1H-benzo[d]imidazole-2-yl)benzene (TPBi).

However, an embodiment of the present disclosure is not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc., may be used as the host material.

The light-emitting layer EML may include a compound represented by Formula M-a or Formula M-b below. The compound represented by Formula M-a or Formula M-b may be used as a phosphorescence dopant material.

Formula M-a

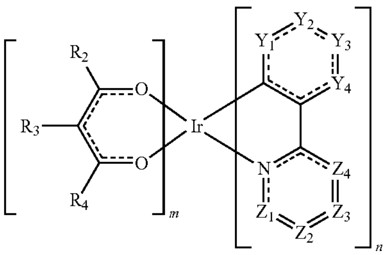

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, “m” is 0 or 1, and “n” is 2 or 3. In Formula M-a, if “m” is 0, “n” is 3, and if “m” is 1, “n” is 2.

The compound represented by Formula M-a may be used as a phosphorescence dopant.

The compound represented by Formula M-a may be represented by any one of Compounds M-a1 to M-a25 below. However, Compounds M-a1 to M-a25 below are merely examples, and the compound represented by Formula M-a is not limited to the compounds represented by Compounds M-a1 to M-a25 below.

M-a1

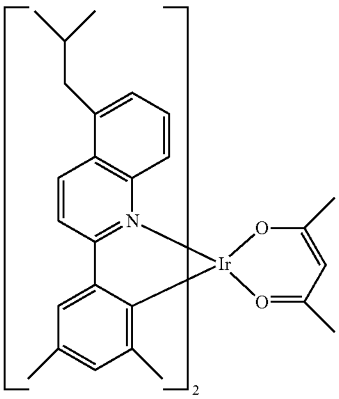

M-a2

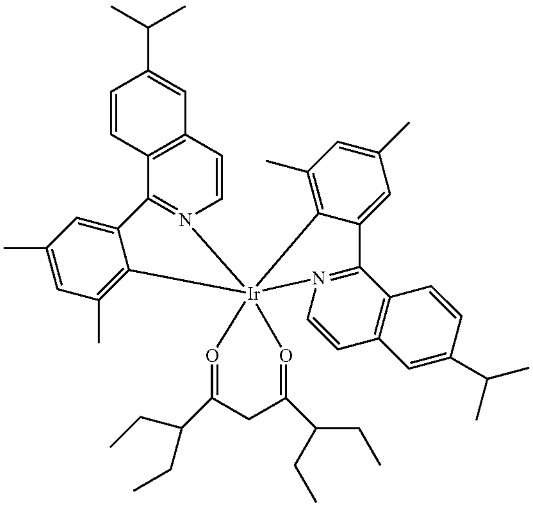

-continued

M-a3

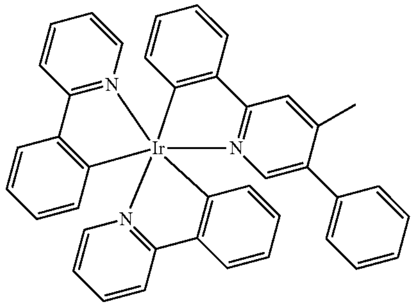

M-a4

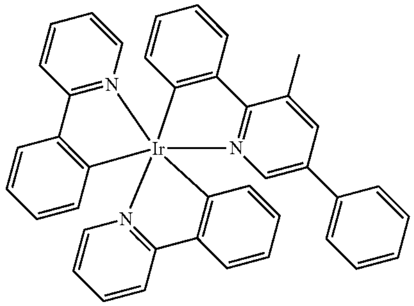

M-a5

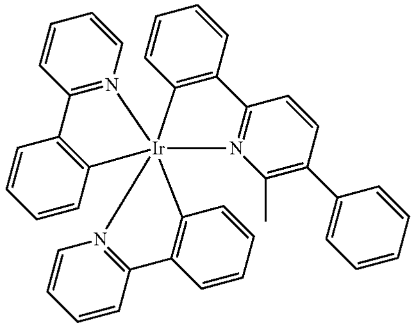

M-a6

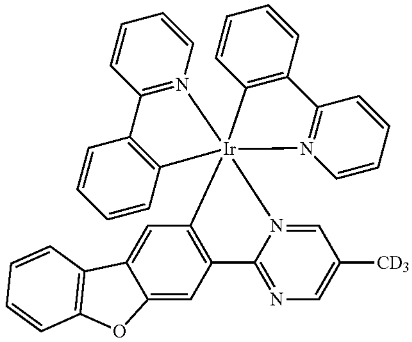

-continued

M-a7

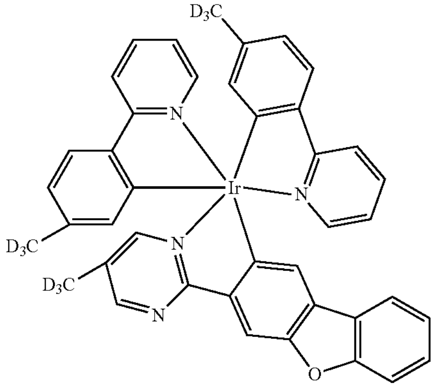

M-a20

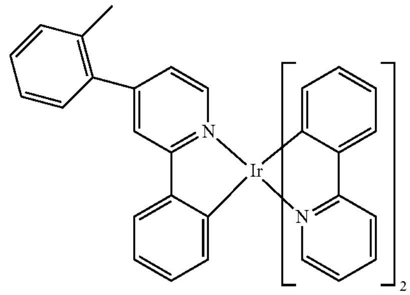

M-a21

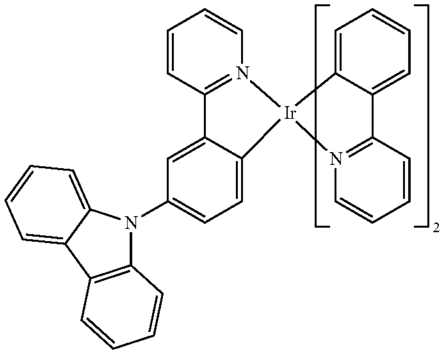

M-a22

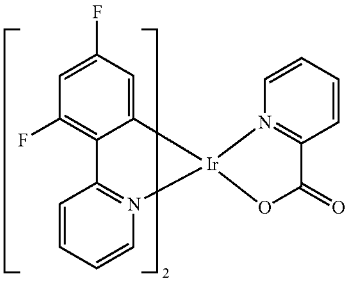

M-a23

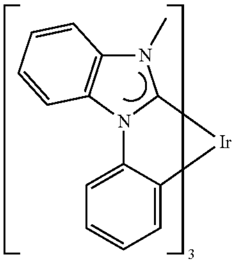

-continued

M-a24

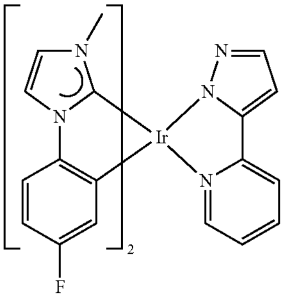

M-a25

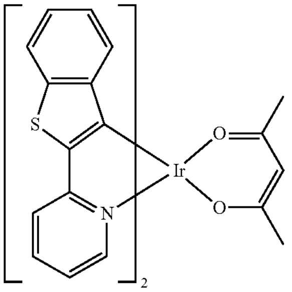

Compound M-a1 and Compound M-a2 may be used as red dopant materials, and Compound M-a3 to Compound M-a7 may be used as green dopant materials.

Formula M-b

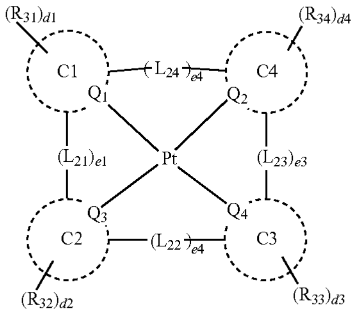

In Formula M-b, $Q_1$ to $Q_4$ may be each independently C or N, C1 to C4 may be each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may be each independently a direct linkage,

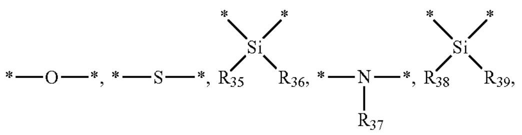

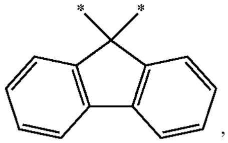

, a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one of the compounds below. However, the compounds below are merely examples, and the compound represented by Formula M-b is not limited to the compounds represented below.

M-b-1

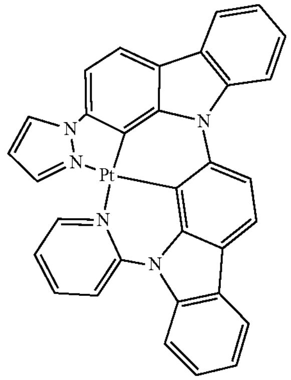

M-b-2

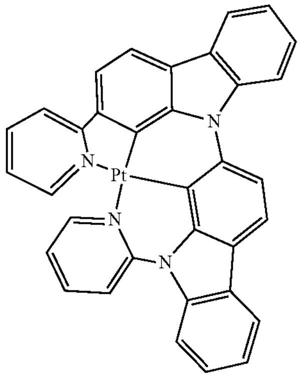

-continued

M-b-3

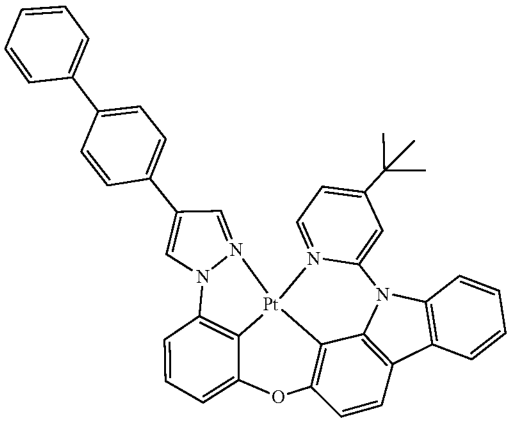

M-b-4

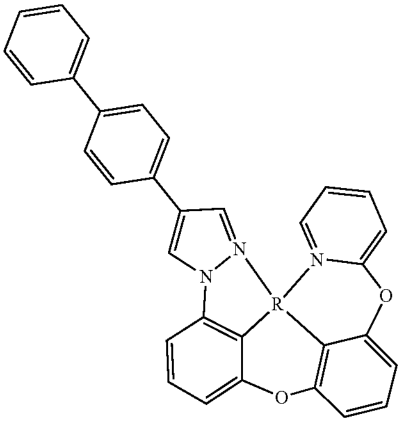

M-b-5

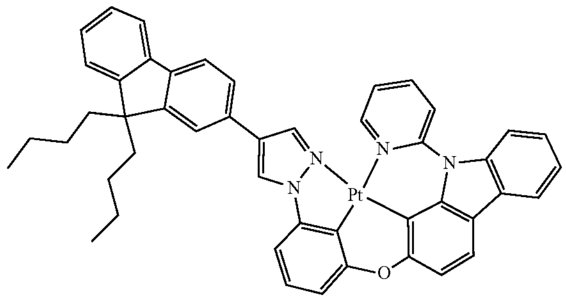

M-b-6

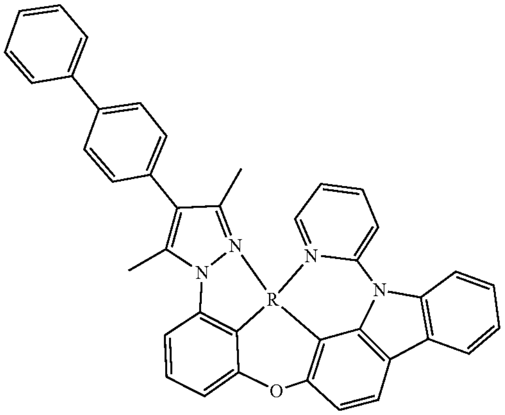

-continued

M-b-7

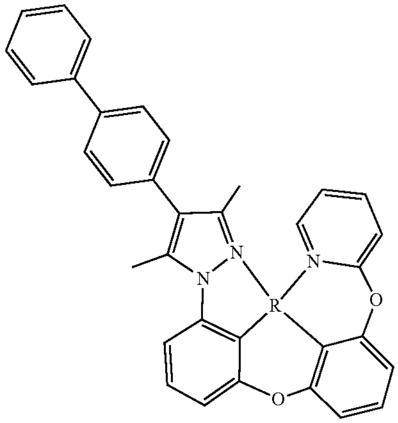

M-b-8

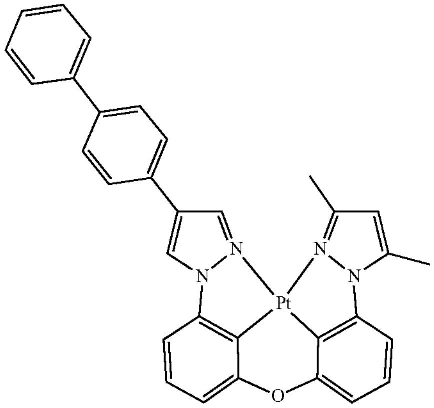

M-b-9

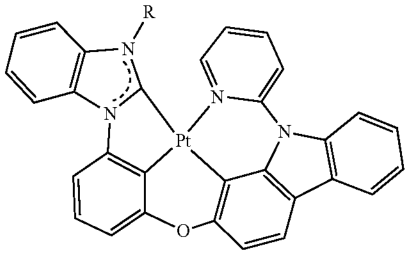

M-b-10

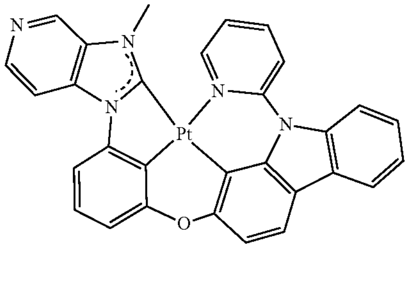

-continued

M-b-11

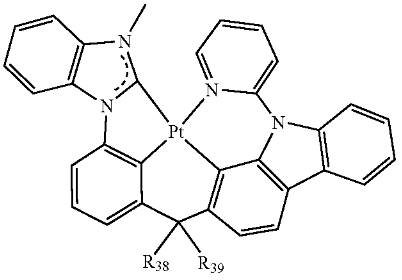

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The light-emitting layer EML may include any one of compounds represented by Formulas F-a to F-c below. The compounds represented by Formula F-a to Formula F-c below may be used as fluorescence dopant materials.

Formula F-a

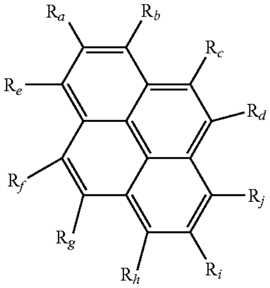

In Formula F-a, two selected from among $R_a$ to $R_j$ may be each independently substituted with *—$NAr_1Ar_2$. The remainder, not substituted with *—$NAr_1Ar_2$ among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one group among $Ar_1$ and $Ar_2$ may be a heteroaryl group including O or S as a ring-forming atom.

Formula F-b

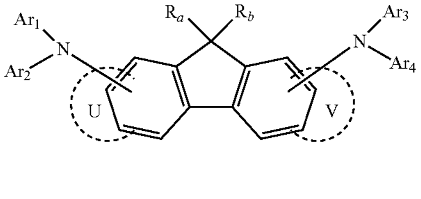

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $Ar_1$ to $Ar_4$ may be each independently a substituted or unsubstituted aryl group having 6 to 30 ring-forming carbon atoms, or a substituted or unsubstituted heteroaryl group having 2 to 30 ring-forming carbon atoms.

In Formula F-b, U and V may be each independently a substituted or unsubstituted hydrocarbon ring of 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, if the number of U or V is 1, one ring forms a fused ring at a part designated as U or V, and if the number of U or V is 0, a ring in which U or V is designated is not present. For example, if the number of U is 0 and the number of V is 1, or if the number of U is 1 and the number of V is 0, a fused ring having the fluorene core in Formula F-b may be a cyclic compound with four rings. In addition, if the number of both U and V is 0, the fused ring in Formula F-b may be a cyclic compound with three rings. In addition, if the number of both U and V is 1, a fused ring having the fluorene core in Formula F-b may be a cyclic compound with five rings.

Formula F-c

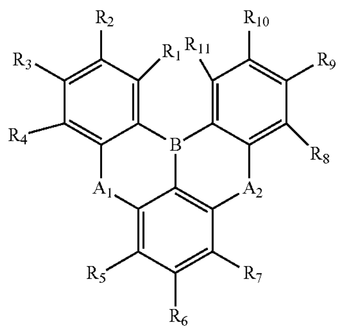

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may be each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring.

In Formula F-c, $A_1$ and $A_2$ may be each independently bonded to substituents of an adjacent ring to form a fused ring. For example, if $A_1$ and $A_2$ may be each independently $NR_m$, $A_1$ may be bonded to $R_4$ or $R_5$ to form a ring. In addition, A2 may be bonded to $R_7$ or $R_8$ to form a ring.

In an embodiment, the light-emitting layer EML may include, as a known (generally used/generally available) dopant material, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), 4,4'-bis[2-(4-(N,N-diphenylamino)phenyl)vinyl]biphenyl (DPAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The light-emitting layer EML may include a known (generally used/generally available)phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium(III) bis(4,6-difluorophenylpyridinato-N,C2')picolinate (Flrpic), bis(4,6-difluorophenylpyridinato-N,C2')picolinate), bis(2,4-difluorophenylpyridinato)-tetrakis(1-pyrazolyl)borate iridium(III) (Fir6), or platinum octaethyl porphyrin (PtOEP) may be used as the phosphorescence dopant. However, an embodiment of the present disclosure is not limited thereto.

In the light-emitting element ED according to an embodiment, as illustrated in FIGS. 3 to 6, the electron transport region ETR is provided on the light-emitting layer EML. The electron transport region ETR may include at least one of a hole blocking layer HBL, an electron transport layer ETL or an electron injection layer EIL. However, an embodiment of the present disclosure is not limited thereto. In the light-emitting element ED according to an embodiment, at least one of the hole blocking layer HBL, the electron transport layer ETL, or the electron injection layer EIL may include the aromatic compound according to an embodiment.

The electron transport region ETR may have a single layer formed of a single material, a single layer formed of multiple different materials, or a multilayer structure having multiple layers formed of multiple different materials.

For example, the electron transport region ETR may have a structure of single layer of an electron injection layer EIL or an electron transport layer ETL, or a single layer structure formed of an electron injection material and an electron transport material. In some embodiments, the electron transport region ETR may have a structure of single layer formed of multiple different materials, or a structure in which an electron transport layer ETL/electron injection layer EIL, or a hole blocking layer HBL/electron transport layer ETL/electron injection layer EIL, which may be sequentially stacked from the light-emitting layer EML, but an embodiment of the present disclosure is not limited thereto. The electron transport region ETR may have a thickness of, for example, about 1,000 Å to about 1,500 Å.

The electron transport region ETR may be formed of various suitable methods such as, but not limited to, a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

Formula ET-1

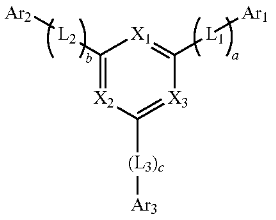

In Formula ET-1, at least one among $X_1$ to $X_3$ is N, and the remainder may be $CR_a$. $R_a$ may be a hydrogen atom, a deuterium atom, a substituted or unsubstituted alkyl having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. If "a" to "c" are integers of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), bis(2-methyl-8-quinolinolato-N1,O8)-(1,1'-Biphenyl-4-olato) aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), and/or mixtures thereof.

In addition, the electron transport region ETR may include a metal halide such as LiF, NaCl, CsF, RbCl, RbI, CuI and KI, a lanthanum group metal such as Yb, or a co-deposition material of the metal halide and the lanthanum group metal. For example, the electron transport region ETR may include KI:Yb, RbI:Yb, and/or the like as the co-deposition material. The electron transport region ETR may use a metal oxide such as $Li_2O$ and BaO, or 8-hydroxy-lithium quinolate (Liq), but an embodiment of the present disclosure is not limited thereto. The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen) in addition to the above-described materials. However, an embodiment of the present disclosure is not limited thereto. The electron transport region ETR may include the above-described compounds of the electron transport region in at least one of an electron injection layer EIL, an electron transport layer ETL, and/or a hole blocking layer HBL.

When the electron transport region ETR includes the electron transport layer ETL, the electron transport layer ETL may have a thickness of about 100 Å to about 1,000 Å, for example, about 150 Å to about 500 Å. When the thickness of the electron transport layer ETL satisfies the above-described range, satisfactory (suitable) electron transport properties may be obtained without a substantial increase in driving voltage. When the electron transport region ETR includes the electron injection layer EIL, the electron injection layer EIL may have a thickness of about 1 Å to about 100 Å, and about 3 Å to about 90 Å. When the thickness of the electron injection layer EIL satisfies the above-described range, satisfactory (suitable) electron injection properties may be obtained without a substantial increase in driving voltage.

The second electrode EL2 is provided on the electron transport region ETR. The second electrode EL2 may be a common electrode. The second electrode EL2 may be a cathode or an anode, but an embodiment of the present disclosure is not limited thereto. For example, when the first electrode EL1 is an anode, the second electrode EL2 may be a cathode; and when the first electrode EL1 is a cathode, the second electrode EL2 may be an anode. The second electrode EL2 may include at least one element or compound selected from among Ag, Mg, Cu, Al, Pt, Pd, Au, Ni, Nd, Ir, Cr, Li, Ca, LiF, Mo, Ti, W, In, Sn, and Zn, two or more elements or compounds selected from thereamong, a mixture of two or more elements or compounds selected from thereamong, and/or oxides of at least one element or compound thereof.

The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, and W or compounds including thereof, and/or mixtures thereof (for example, AgMg, AgYb, or MgYb). In some embodiments, the second electrode EL2 may have a multilayered structure including a reflective film or a transflective film formed of the above-described materials and a transparent conductive film formed of ITO, IZO, ZnO, ITZO, etc. For example, the second electrode EL2 may include the above-described metal materials, combinations of two or more metal materials selected from the above-described metal materials, or oxides of the above-described metal materials.

The second electrode EL2 may be connected (coupled) with an auxiliary electrode. If the second electrode EL2 is connected (coupled) with the auxiliary electrode, the resistance of the second electrode EL2 may be reduced.

A capping layer CPL may be further on the second electrode EL2 in the light-emitting element ED according to an embodiment. The capping layer CPL may include a multilayer or a single layer.

In an embodiment, the capping layer CPL may be an organic layer and/or an inorganic layer. For example, if the capping layer CPL includes an inorganic material, the inorganic material may include an alkali metal compound such as LiF, an alkaline earth metal compound such as $MgF_2$, and SiON, $SiN_x$, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or includes an epoxy resin, or acrylate such as methacrylate. In addition, a capping layer CPL may include at least one of Compounds P1 to P5 below, but an embodiment of the present disclosure is not limited thereto.

P1

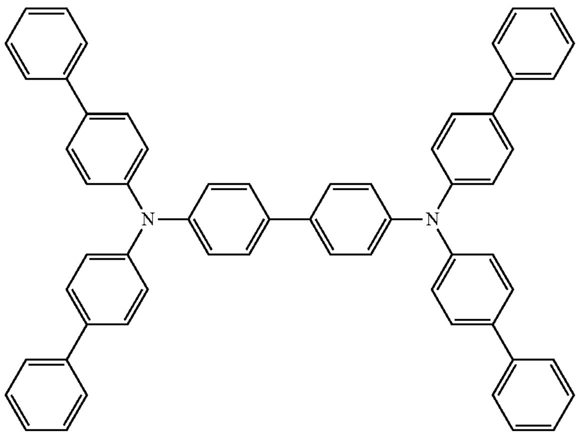

P2

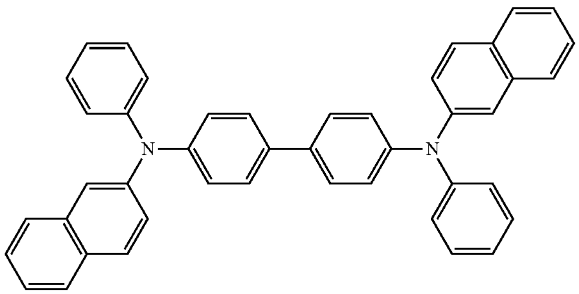

-continued

P3

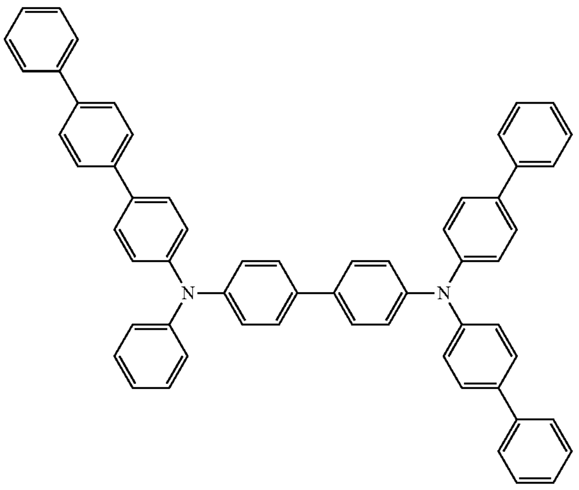

P4

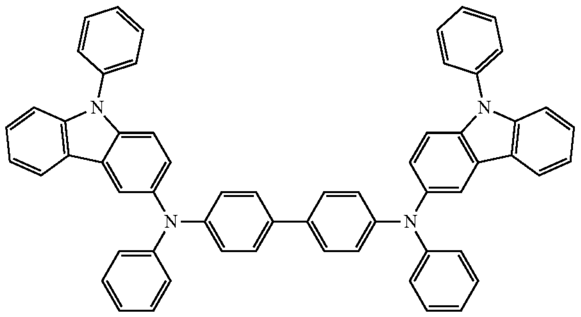

P5

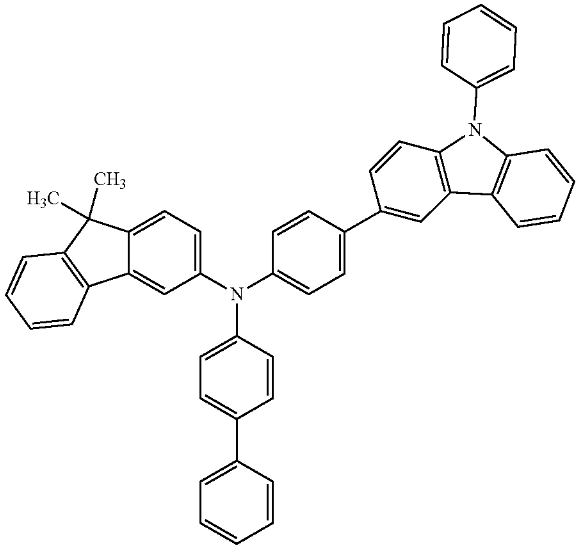

The refractive index of the capping layer CPL may be about 1.6 or more. For example, the refractive index of the capping layer CPL with respect to light in a wavelength range of about 550 nm to about 660 nm may be about 1.6 or more.

FIGS. 7 to 10 are cross-sectional views on display devices according to embodiments. In the description of the display devices according to embodiments with reference to FIGS. 7 to 10, the duplicate contents that have been described with reference to FIGS. 1 to 6 will not be described again here, and the description will be mainly focused on different aspects of embodiments of the present disclosure.

Figure 7:
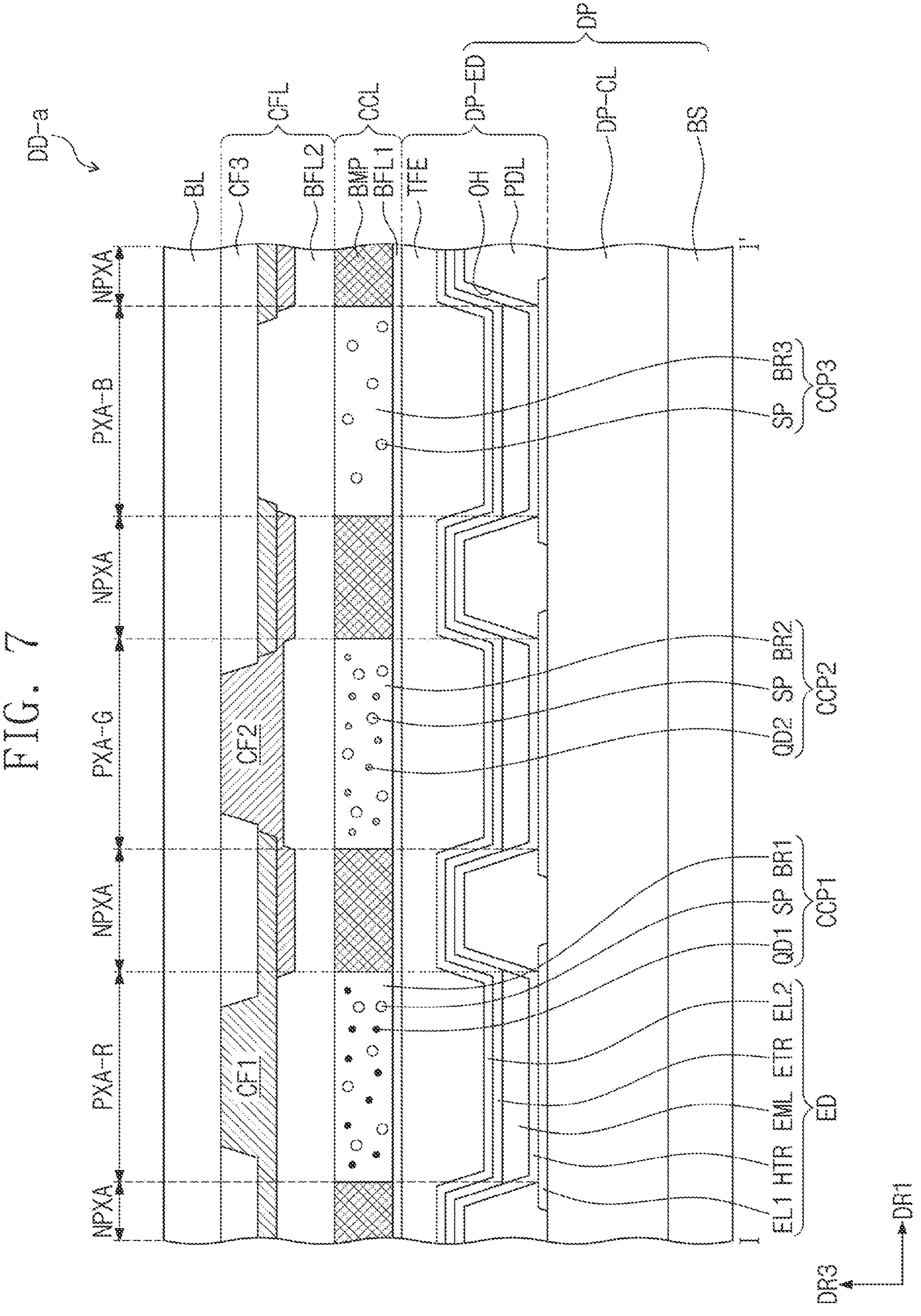
FIG. 7 is a cross-sectional view of a display device according to an embodiment.

Referring to FIG. 7, the display device DD according to an embodiment may include a display panel DP including a display element layer DP-ED, a light control layer CCL on the display panel DP and a color filter layer CFL.

In an embodiment illustrated in FIG. 7, the display panel DP may include a base layer BS, a circuit layer DP-CL provided on the base layer BS and a display element layer DP-ED, and the display element layer DP-ED may include a light-emitting element ED.

The light-emitting element ED may include a first electrode EL1, a hole transport region HTR on the first electrode EL1, a light-emitting layer EML on the hole transport region HTR, an electron transport region ETR on the light-emitting layer EML, and a second electrode EL2 on the electron transport region ETR. Meanwhile, the structures of the light-emitting elements of FIGS. 3 to 6 may be similarly applied to the structure of the light-emitting element ED illustrated in FIG. 7.

Referring to FIG. 7, in the display device DD-a, the light-emitting layers EML may be in openings OH defined in pixel defining films PDL. For example, the light-emitting layers EML, which are divided by the pixel defining films PDL and provided to respectively correspond to light-emitting regions PXA-R, PXA-G and PXA-B, may emit light in the same (substantially) wavelength range. In the display device DD according to an embodiment, the light-emitting layer EML may emit blue light. Meanwhile, unlike the configuration illustrated, in an embodiment, the light-emitting layer EML may be provided as a common layer for all light-emitting regions PXA-R, PXA-G and PXA-B.

The light control layer CCL may be on the display panel DP. The light control layer CCL may include a light converter. The light converter may be a quantum dot, a phosphor, and/or the like. The light converter may transform the wavelength of light provided and then emit. For example, the light control layer CCL may be a layer including a quantum dot or a layer including a phosphor.

The light control layer CCL may include a plurality of light control parts CCP1, CCP2 and CCP3. The light control parts CCP1, CCP2 and CCP3 may be separated from each other.

Referring to FIG. 7, partition patterns BMP may be between the separated light control parts CCP1, CCP2 and CCP3, but an embodiment of the present disclosure is not limited thereto. FIG. 7 illustrates that the partition patterns BMP do not overlap the light control parts CCP1, CCP2 and CCP3, but the edges of the light control parts CCP1, CCP2 and CCP3 may be at least partially overlap the partition patterns BMP.

The light control layer CCL may include a first light control part CCP1 including a first quantum dot QD1 which converts first color light provided from the light-emitting element ED into second color light, a second light control part CCP2 including a second quantum dot QD2 which converts first color light into third color light, and a third light control part CCP3 transmitting the first color light.

In an embodiment, the first light control part CCP1 may provide red light which is the second color light, and the second light control part CCP2 may provide green light which is the third color light. The third color controlling part CCP3 may transmit blue light which is the first color light provided from the light-emitting element ED. For example, the first quantum dot QD1 may be a red quantum dot, and the second quantum dot QD2 may be a green quantum dot.

The core of the quantum dot QD1 and QD2 may be selected from among a II-VI group compound, a III-VI group compound, a I-III-VI group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-V group compound may include a binary compound such as $In_2S_3$, and $In_2Se_3$, a ternary compound such as $InGaS_3$, and $InGaSe_3$, or any combination thereof.

The I-III-VI group compound may be selected from the group consisting of a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound such as $AgInGaS_2$, and $CuInGaS_2$, and/or the like.

The III-V group compound may be selected from the group consisting of: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. Meanwhile, the III-V group compound may further include a II group metal. For example, InZnP, etc., may be selected as a III-II-V group compound.

The IV-VI group compound may be selected from the group consisting of: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound or the quaternary compound may be present in the particle with a uniform (substantially uniform) concentration, or may be present in the same particle with partially different concentrations. In addition, a core/shell structure in which one quantum dot surrounds another quantum dot. The core/shell structure may have a concentration gradient in which the concentration of an element presents in the shell decreases toward the center thereof.

In some embodiments, the quantum dot QD1 and QD2 may have a core-shell structure including a core having the above-described nanocrystals and a shell surrounding the core. The shell of the quantum dots may serve as a protective layer for maintaining semiconductor characteristics by preventing (reducing) chemical modification of the core and/or serve as a charging layer for imparting electrophoretic properties to the quantum dot. The shell may be a single layer or multilayer. Examples of the shell of the quantum dot may include a metal or non-metal oxide, a semiconductor compound, or combinations thereof.

For example, examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but an embodiment of the present disclosure is not limited thereto.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The quantum dot QD1 and QD2 may have a full width of half maximum (FWHM) of emission wavelength spectrum of about 45 nm or less, about 40 nm or less, and about 30 nm or less, and within this range, color purity or color reproducibility may be improved. In addition, light emitted through these quantum dots is emitted in all directions, so that wide viewing angle characteristics may be improved.

In addition, the shape of the quantum dot QD1 and QD2 is not limited to a shape used in the field. For example, the quantum dot may have a shape such as a spherical shape, a pyramidal shape, a multi-arm shape, or a cubic nanoparticle, a nanotube, a nanowire, a nanofiber, and a nanoplatelet particle.

The quantum dot QD1 and QD2 may control the color of emitted light according to the particle size, and accordingly, the quantum dot may have various suitable emission colors such as blue, red and green.

In addition, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include a quantum dot but may include the scatterer SP.

The scatterer SP may be an inorganic particle. For example, the scatterer SP may include at least one among $TiO_2$, ZnO, $Al_2O_3$, $SiO_2$, and hollow silica. The scatterer SP may include at least one material among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

The first light control part CCP1, the second light control part CCP2, and the third light control part CCP3 may respectively include base resins BR1, BR2 and BR3 for dispersing the quantum dots QD1 and QD2 and the scatterer SP. In an embodiment, the first light control part CCP1 may include the first quantum dot QD1 and the scatterer SP dispersed in the first base resin BR1, the second light control part CCP2 may include the second quantum dot QD2 and the scatterer SP dispersed in the second base resin BR2, and the third light control part CCP3 may include the scatterer particle SP dispersed in the third base resin BR3. The base resins BR1, BR2 and BR3 are mediums in which the quantum dots QD1 and QD2 and the scatterer SP are dispersed, and may be composed of various suitable resin compositions which may be generally referred to as a binder. For example, the base resins BR1, BR2 and BR3 may be acrylic resins, urethane-based resins, silicone-based resins, or epoxy-based resins, etc. The base resins BR1, BR2 and BR3 may be transparent resins. In an embodiment, the first base resin BR1, the second base resin BR2 and the third base resin BR3 may be the same as or different from each other.

The light control layer CCL may include a barrier layer BFL1. The barrier layer BFL1 may serve to block (or reduce) the infiltration of moisture and/or oxygen (hereinafter, referred to as "moisture/oxygen"). The barrier layer BFL1 may be on the light control parts CCP1, CCP2 and CCP3 to block the exposure of the light control parts CCP1, CCP2 and CCP3 to moisture/oxygen. Meanwhile, the barrier layer BFL1 may cover the light control parts CCP1, CCP2 and CCP3. In addition, the barrier layer BFL2 may be provided between the light control parts CCP1, CCP2 and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride or may include a metal thin film with sufficient light transmittance, etc. In addition, the barrier layers BFL1 and BFL2 may further include an organic film. The barrier layers BFL1 and BFL2 may be formed of a single layer or a plurality of layers.

In the display device DD according to an embodiment, the color filter layer CFL may be on the light control layer CCL. For example, the color filter layer CFL may be directly on the light control layer CCL. In this case, the barrier layer BFL2 may be omitted.

The color filter layer CFL may include filters CF1, CF2 and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment or dye. The first filter CF1 may include a red pigment or dye, the second filter CF2 may include a green pigment or dye, and the third filter CF3 may include a blue pigment or dye. Furthermore, an embodiment of the present disclosure is not limited thereto, and the third filter CF3 may not include the pigment or dye. The third filter CF3 may include a polymer photosensitive resin and may not include a pigment or dye. The third filter CF3 may be transparent. The third filter CF3 may be formed of a transparent photosensitive resin.

In addition, in an embodiment, the first filter CF1 and the second filter CF2 may be yellow filters. The first filter CF1 and the second filter CF2 are not separated from each other and may be provided integrally.

The first to third filters CF1, CF2 and CF3 may be respectively disposed corresponding to each of a red light-emitting region PXA-R, green light-emitting region PXA-G, and blue light-emitting region PXA-B.

A base substrate BL may be on the color filter layer CFL. The base substrate BL may be a member that provides a base surface on which the color filter layer CFL and the light control layer CCL are disposed. The base substrate BL may be a glass substrate, a metal substrate, a plastic substrate, etc. However, an embodiment of the present disclosure is not limited thereto, and the base substrate BL may be an inorganic layer, an organic layer or a composite material layer. In addition, unlike the configuration illustrated, the base substrate BL may be omitted in an embodiment.

Figure 8:
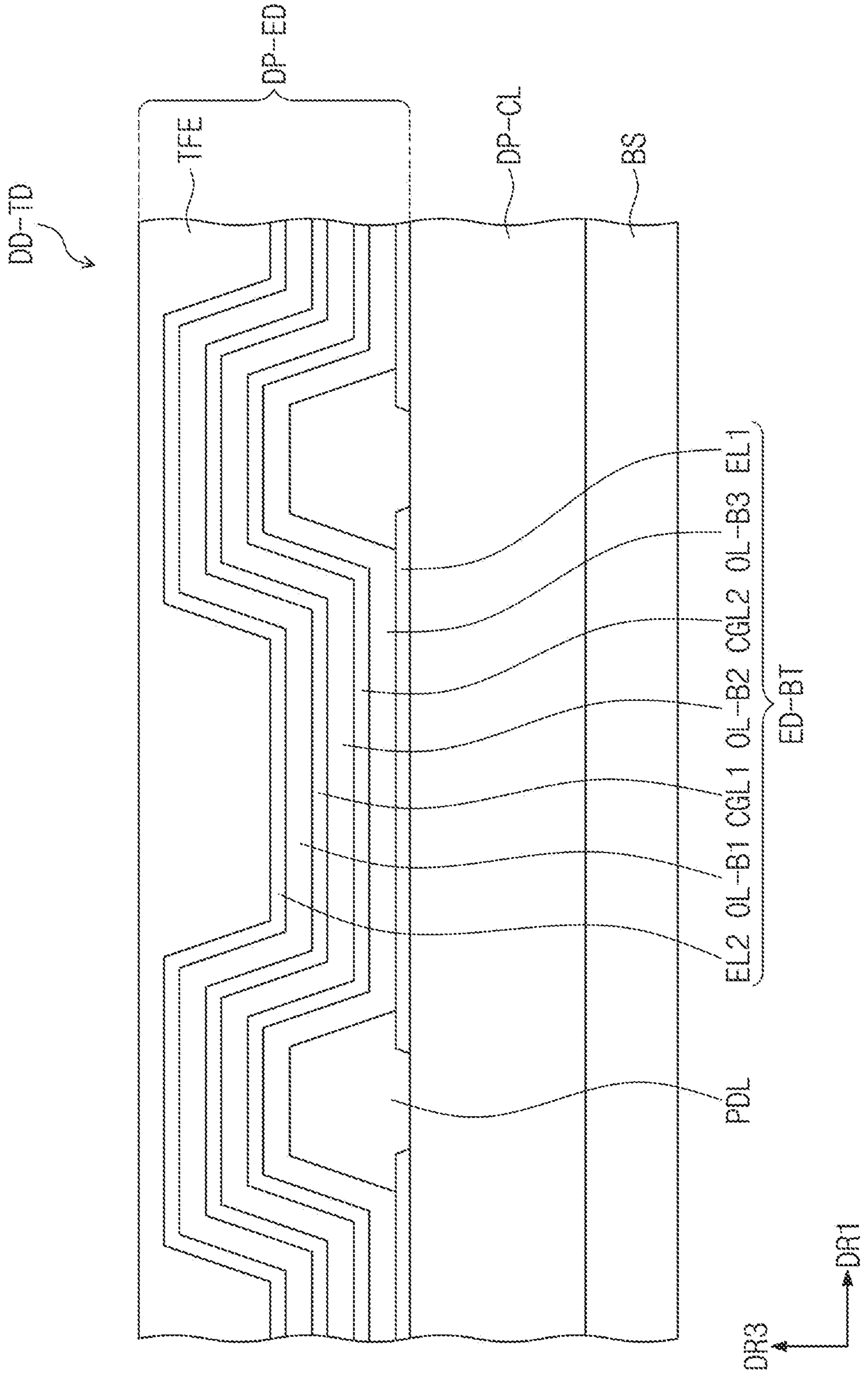
FIG. 8 is a cross-sectional view of a display device according to an embodiment.

FIG. 8 is a cross-sectional view illustrating a portion of the display device according to an embodiment. FIG. 8 illustrates the cross-sectional view of a portion corresponding to the display panel DP in FIG. 7. In a display device DD-TD according to an embodiment, a light-emitting element ED-BT may include a plurality of light-emitting structures OL-B1, OL-B2 and OL-B3. The light-emitting element ED-BT may include first electrode EL1 and second electrode EL2 which face each other, and the plurality of light-emitting structures OL-B1, OL-B2 and OL-B3 stacked in order in a thickness direction and provided between the first electrode EL1 and the second electrode EL2. Each of the light-emitting structures OL-B1, OL-B2 and OL-B3 may include a light-emitting layer EML (FIG. 7), and a hole transport region HTR and an electron transport region ETR disposed with the light-emitting layer EML (FIG. 7) therebetween. For example, the light-emitting element ED-BT included in the display device DD-TD according to an embodiment may be a light-emitting element having a tandem structure including a plurality of light-emitting layers.

In an embodiment illustrated in FIG. 8, light emitted from the light-emitting structures OL-B1, OL-B2 and OL-B3 may be all blue light. However, an embodiment of the present disclosure is not limited thereto, and the wavelength ranges of light emitted from the light-emitting structures OL-B1, OL-B2 and OL-B3 may be different from each other. For example, the light-emitting element ED-BT including the plurality of light-emitting structures OL-B1, OL-B2 and OL-B3 that emit light in different wavelength ranges may emit white light.

Between neighboring light-emitting structures OL-B1, OL-B2 and OL-B3, charge generation layers CGL1 and CGL2 may be disposed. The charge generation layers CGL1 and CGL2 may include a p-type charge generation layer and/or an n-type charge generation layer.

Figure 9:
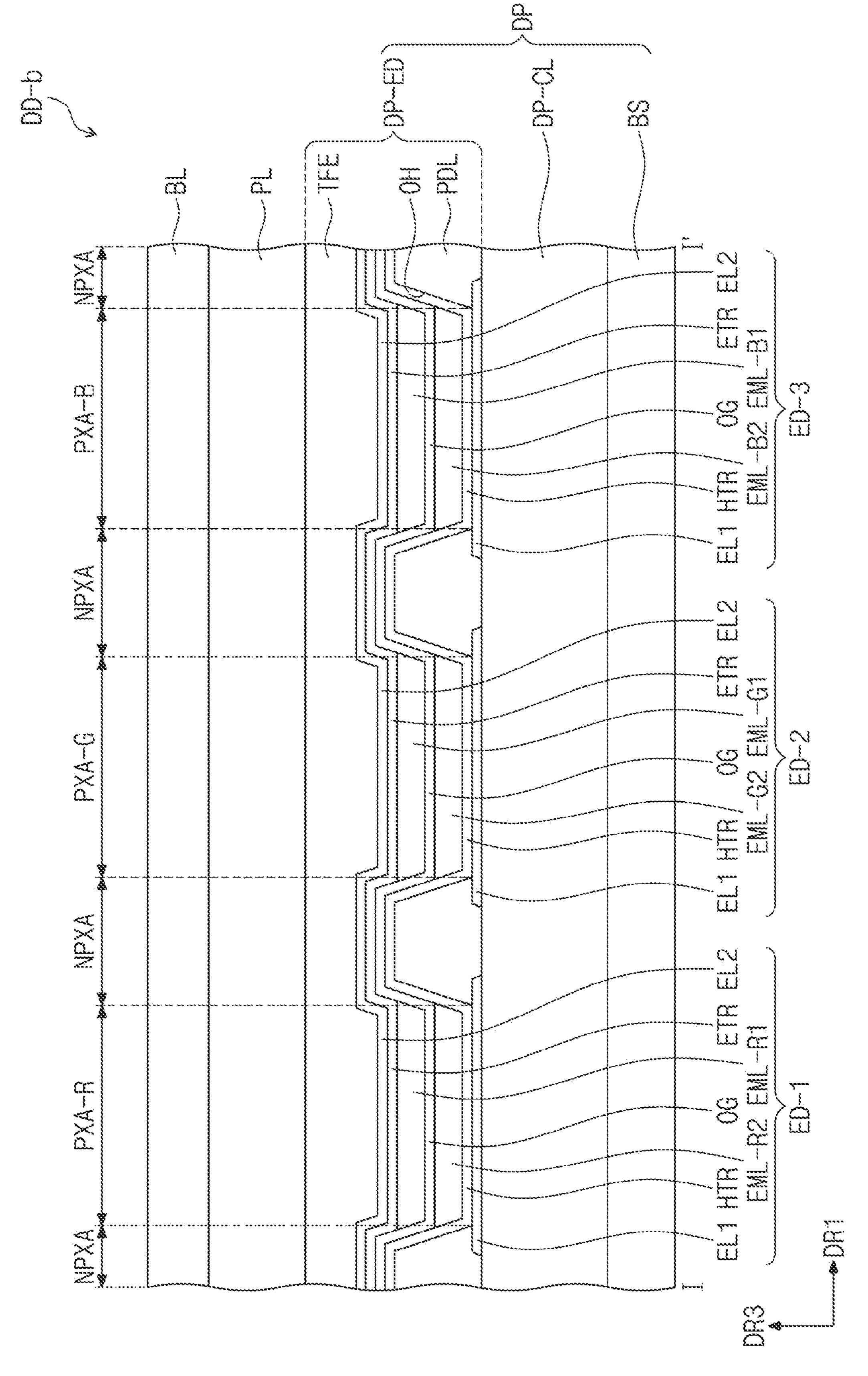
FIG. 9 is a cross-sectional view of a display device according to an embodiment.

Referring to FIG. 9, the display device DD-b may include light-emitting elements ED-1, ED-2, and ED-3 in which two light-emitting layers are stacked. Unlike FIG. 2, FIG. 9 illustrates that two light-emitting layers are provided in each of the first to third light-emitting elements ED-1, ED-2, and ED-3. In each of the first to third light-emitting elements ED-1, ED-2, and ED-3, the two light-emitting layers may emit light of the same (substantially the same) wavelength range.

The first light-emitting element ED-1 may include a first red light-emitting layer EML-R1 and a second red light-emitting layer EML-R2. The second light-emitting element ED-2 may include a first green light-emitting layer EML-G1 and a second green light-emitting layer EML-G2. The third light-emitting element ED-3 may include a first blue light-emitting layer EML-B1 and a second blue light-emitting layer EML-B2. A light-emitting auxiliary part OG may be between the first red light-emitting layer EML-R1 and the second red light-emitting layer EML-R2, between the first green light-emitting layer EML-G1 and the second green light-emitting layer EML-G2, and between the first blue light-emitting layer EML-B1 and the second blue light-emitting layer EML-B2.

The light-emitting auxiliary part OG may include a single layer or multiple layers. The light-emitting auxiliary part OG may include a charge generation layer. For example, the light-emitting auxiliary part OG may include an electron transport region, a charge generation layer, and a hole transport region which may be sequentially stacked. The light-emitting auxiliary part OG may be provided as a common layer in all of the first to third light-emitting elements ED-1, ED-2, and ED-3. However, an embodiment of the present disclosure is not limited thereto, and the light-emitting auxiliary part OG may be patterned and provided in the opening OH defined in the pixel defining film (layer) PDL.

The first red light-emitting layer EML-R1, the first green light-emitting layer EML-G1, and the first blue light-emitting layer EML-B1 may be between the hole transport region HTR and the light-emitting auxiliary part OG. The second red light-emitting layer EML-R2, the second green light-emitting layer EML-G2, and the second blue light-emitting layer EML-B2 may be between the light-emitting auxiliary part OG and the electron transport region ETR.

For example, the first light-emitting element ED-1 may include the first electrode EL1, the hole transport region HTR, the second red light-emitting layer EML-R2, the light-emitting auxiliary part OG, the first red light-emitting layer EML-R1, the electron transport region ETR, and the second electrode EL2 which may be sequentially stacked. The second light-emitting element ED-2 may include the first electrode EL1, the hole transport region HTR, the second green light-emitting layer EML-G2, the light-emitting auxiliary part OG, the first green light-emitting layer EML-G1, the electron transport region ETR, and the second electrode EL2 which may be sequentially stacked. The third light-emitting element ED-3 may include the first electrode EL1, the hole transport region HTR, the second blue light-emitting layer EML-B2, the light-emitting auxiliary part OG, the first blue light-emitting layer EML-B1, the electron transport region ETR, and the second electrode EL2 which may be sequentially stacked.

An optical auxiliary layer PL may be on the display element layer DP-ED. The optical auxiliary layer PL may include a polarization layer. The optical auxiliary layer PL may be on the display panel DP to control light reflected from the display panel DP by external light. Unlike the configuration illustrated, the optical auxiliary layer PL may be omitted in the display device according to an embodiment.

Figure 10:
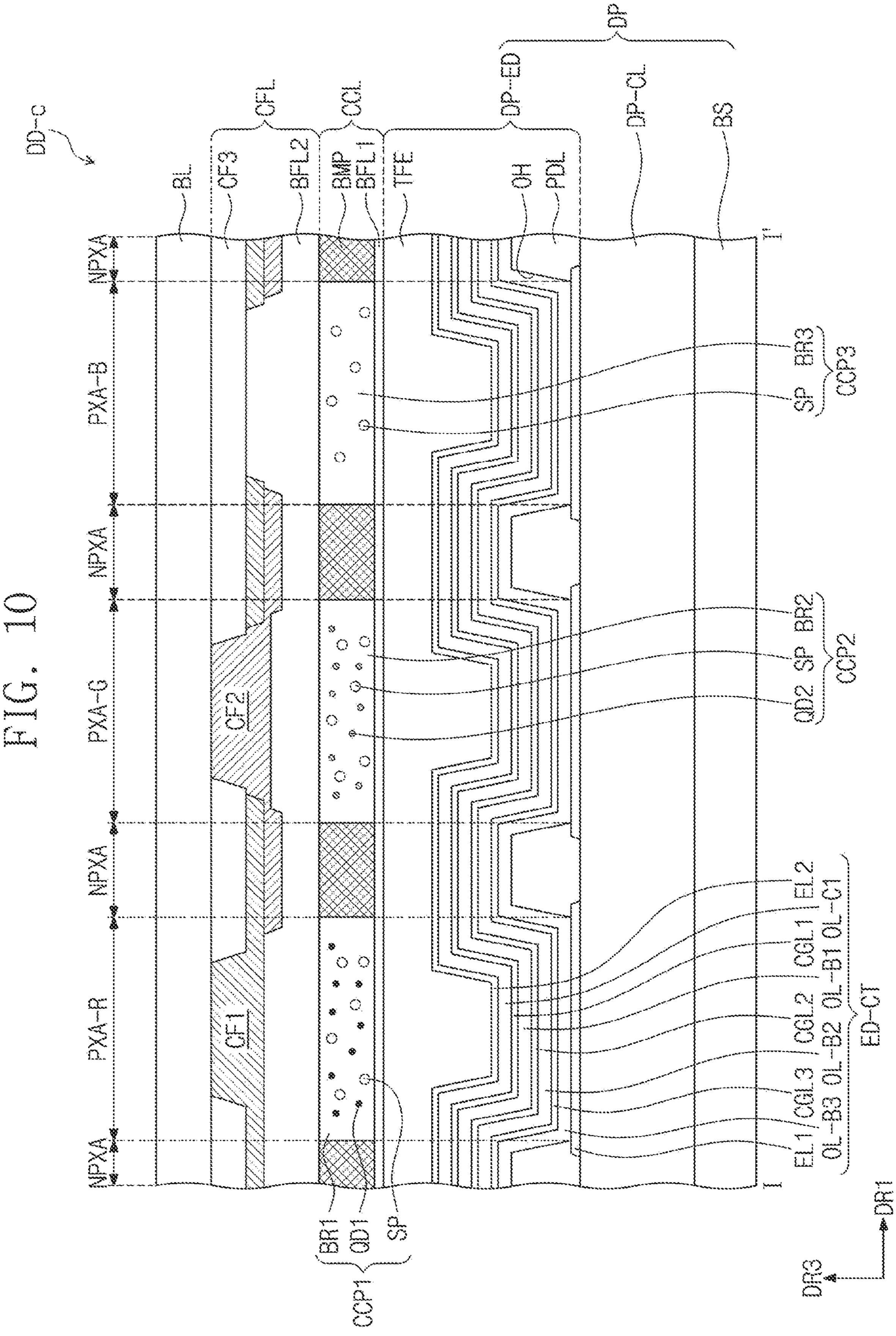
FIG. 10 is a cross-sectional view of a display device according to an embodiment.

Unlike FIGS. 7 and 8, a display device DD-c of FIG. 10 is illustrated to include four light-emitting structures OL-B1, OL-B2, OL-B3, and OL-C1. The light-emitting element ED-CT may include a first electrode EL1 and a second electrode EL2 which face each other, and the first to fourth light-emitting structures OL-B1, OL-B2, OL-B3, and OL-C1 which may be sequentially stacked in the thickness direction and provided between the first electrode EL1 and the second electrode EL2. Charge generation layers CGL1, CGL2, and CGL3 may be between the first to fourth light-emitting structures OL-B1, OL-B2, OL-B3, and OL-C1. Among the four light-emitting structures, the first to third light-emitting structures OL-B1, OL-B2 and OL-B3 may emit blue light, and the fourth light-emitting structure OL-C1 may emit green light. However, an embodiment of the present disclosure is not limited thereto, and the first to fourth light-emitting structures OL-B1, OL-B2, OL-B3, and OL-C1 may emit light of different wavelength ranges. However, an embodiment of the present disclosure is not limited thereto, and the first to fourth light-emitting structures OL-B1, OL-B2, OL-B3, and OL-C1 may emit light of different wavelength ranges.

Hereinafter, an amine compound according to an embodiment and a light-emitting element according to an embodiment will be described in more detail with reference to Examples and Comparative Examples. In addition, Examples below are only provide to assist in understanding of the present disclosure, and the scope of the present disclosure is not limited thereto.

Examples

1. Synthesis of Aromatic Compound According to Embodiment

First, a synthesis method for an aromatic compound according to the present embodiment will be described in more detail by exemplifying synthesis methods for Compounds 1, 3, 8, 11, 13, 18, and 25. In addition, a below-described synthesis method for an aromatic compound is an example, and a synthesis method for a compound according to an embodiment of the present disclosure is not limited to Examples below.

(1) Synthesis of Compound 1

Aromatic Compound 1 according to an embodiment may be synthesized, for example, by the process of Reaction 1 below.

Reaction 1

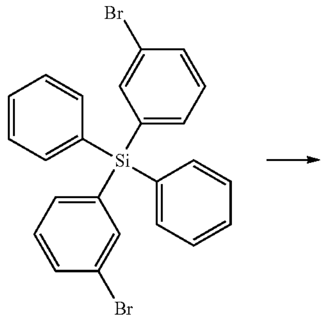

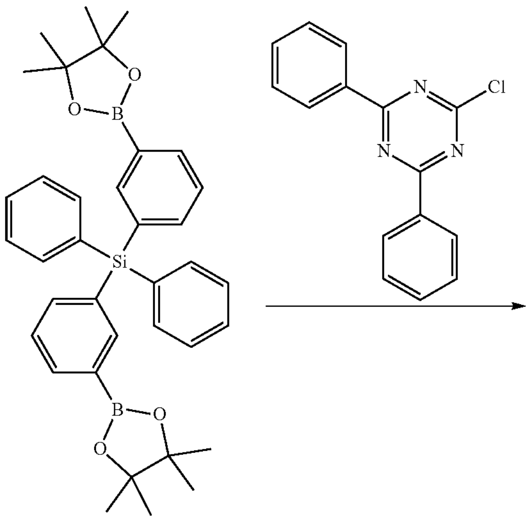

1-1

-continued

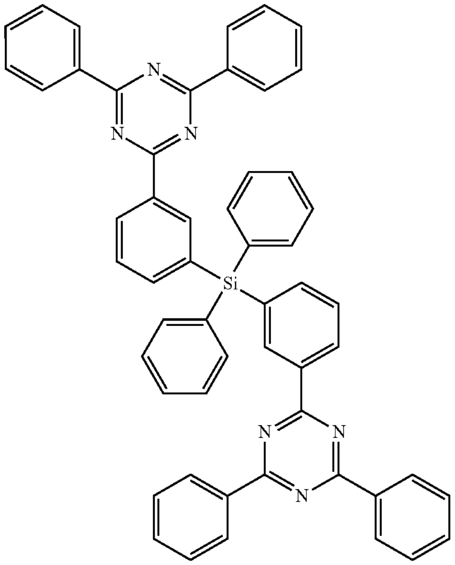

1

Synthesis of Intermediate 1-1

Bis(3-bromophenyl)diphenylsilane (CAS No. 500886-98-6, 1 eq) and bispinacolatodiboron (2 eq) were reacted under a catalyst condition of $Pd(PPh_3)_2Cl_2$ (0.05 eq) to obtain Intermediate 1-1. Intermediate 1-1 had a molecular weight of 588.30 ($C_{36}H_{42}B_2O_4Si$ M+1) as determined by LC/MS measurement.

Synthesis of Compound 1

3.4 g of 2-Chloro-4,6-diphenyl-1,3,5-triazine (CAS No. 3842-55-5), 9.0 g of Intermediate 1-1, 0.58 g of tetrakis (triphenylphosphine)palladium(0), and 4.3 g of potassium carbonate ($K_2CO_3$) were placed in a reactor, dissolved in 80 mL of toluene, 20 mL of ethanol, and 20 mL of distilled water, and the resultant solution was refluxed for 24 hours. After completion of the reaction, the reaction solution was extracted with ethyl acetate, and the collected organic layer was dried over magnesium sulfate $MgSO_4$, and then the residue obtained by evaporating the solvent was separated and purified through silica gel column chromatography to thereby obtain 6.2 g (yield: 61%) of Compound 1.

(2) Synthesis of Compound 3

Aromatic Compound 3 according to an embodiment may be synthesized, for example, by the process of Reaction 2 below.

Reaction 2

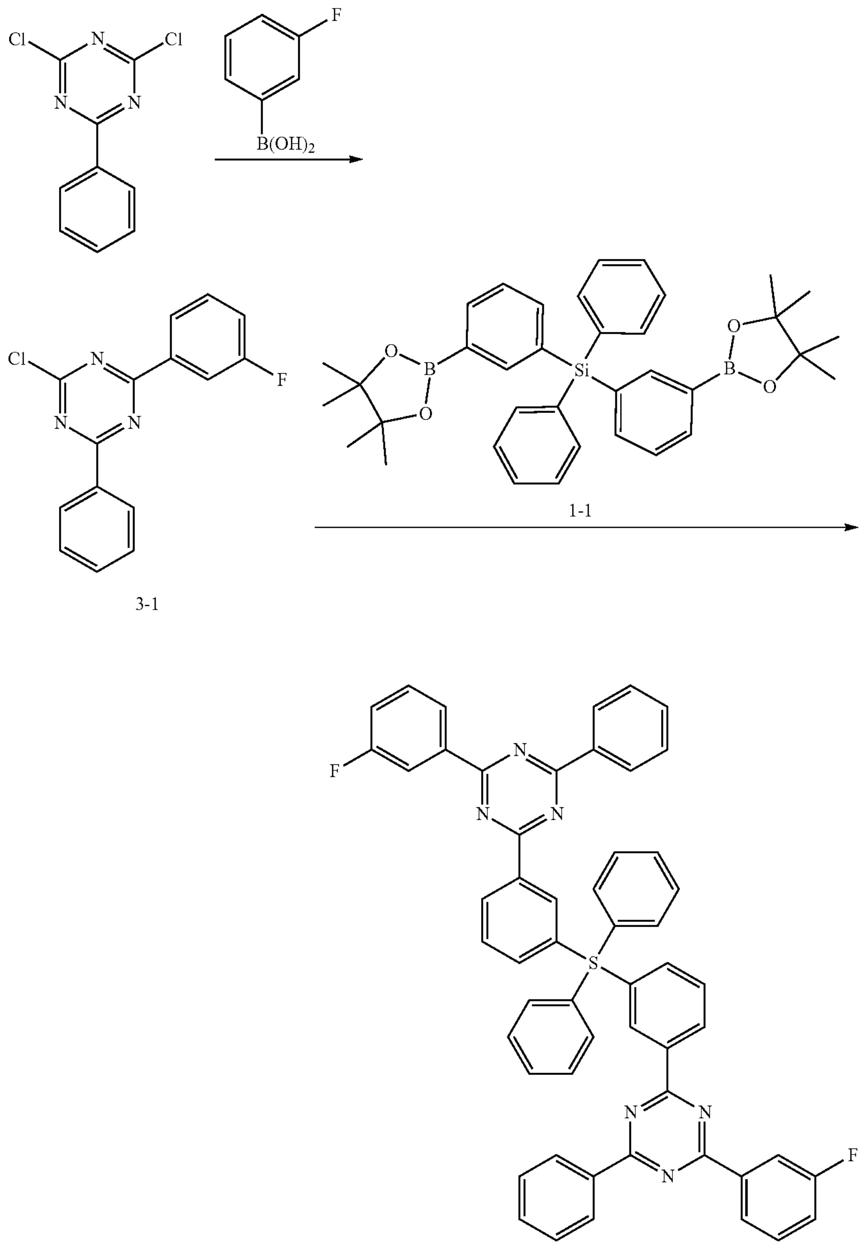

3-1

1-1

3

Synthesis of Intermediate 3-1

2,4-dichloro-6-phenyl-1,3,5-triazine (CAS No. 1700-02-3, 1 eq) and (3-fluorophenyl)boronic acid (1 eq) were reacted under a catalyst condition of $Pd(PPh_3)_2Cl_2$ (0.05 eq) to obtain Intermediate 3-1. Intermediate 3-1 had a molecular weight of 286.07 ($C_{15}H_9ClFN_3$ M+1) as determined by LC/MS measurement.

Synthesis of Compound 3

4.1 g of Intermediate 3-1, 10.1 g of Intermediate 1-1, 0.66 g of $Pd[(C_6H_5)_3P]_4$ tetrakis(triphenylphosphine)palladium, and 4.9 g of potassium carbonate were placed in a reactor, dissolved in 80 mL of toluene, 20 mL of ethanol, and 20 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 5.3 g (yield: 44%) of Compound 3.

(3) Synthesis of Compound 8

Aromatic Compound 8 according to an embodiment may be synthesized, for example, by the process of Reaction 3 below.

Reaction 3

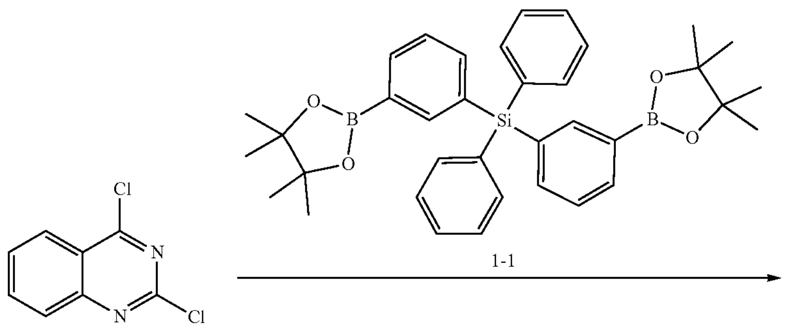

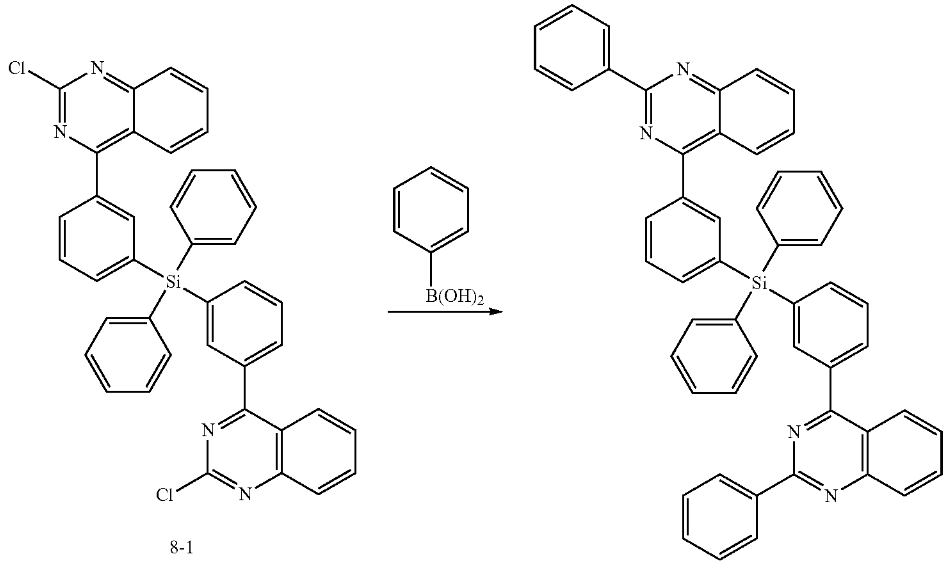

8-1

8

Synthesis of Compound 8-1

2,4-dichloroquinazoline (CAS No. 607-68-1, 2 eq) and Intermediate 1-1 (1 eq) were reacted under a catalyst condition of $Pd(PPh_3)_4$ (0.05 eq) to obtain Intermediate 8-1. Intermediate 8-1 had a molecular weight of 661.15 ($C_{40}H_{26}Cl_2N_4Si$ M+1) as determined by LC/MS measurement.

Synthesis of Compound 8

2.1 g of Intermediate 8-1, 0.5 g of phenylboronic acid, 0.14 g of tetrakis(triphenylphosphine)palladium, and 1.1 g of potassium carbonate were placed in a reactor, dissolved in 40 mL of toluene, 10 mL of ethanol, and 10 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 1.5 g (yield: 62%) of Compound 8.

(4) Synthesis of Compound 11

Aromatic Compound 11 according to an embodiment may be synthesized, for example, by the process of Reaction 4 below.

Reaction 4

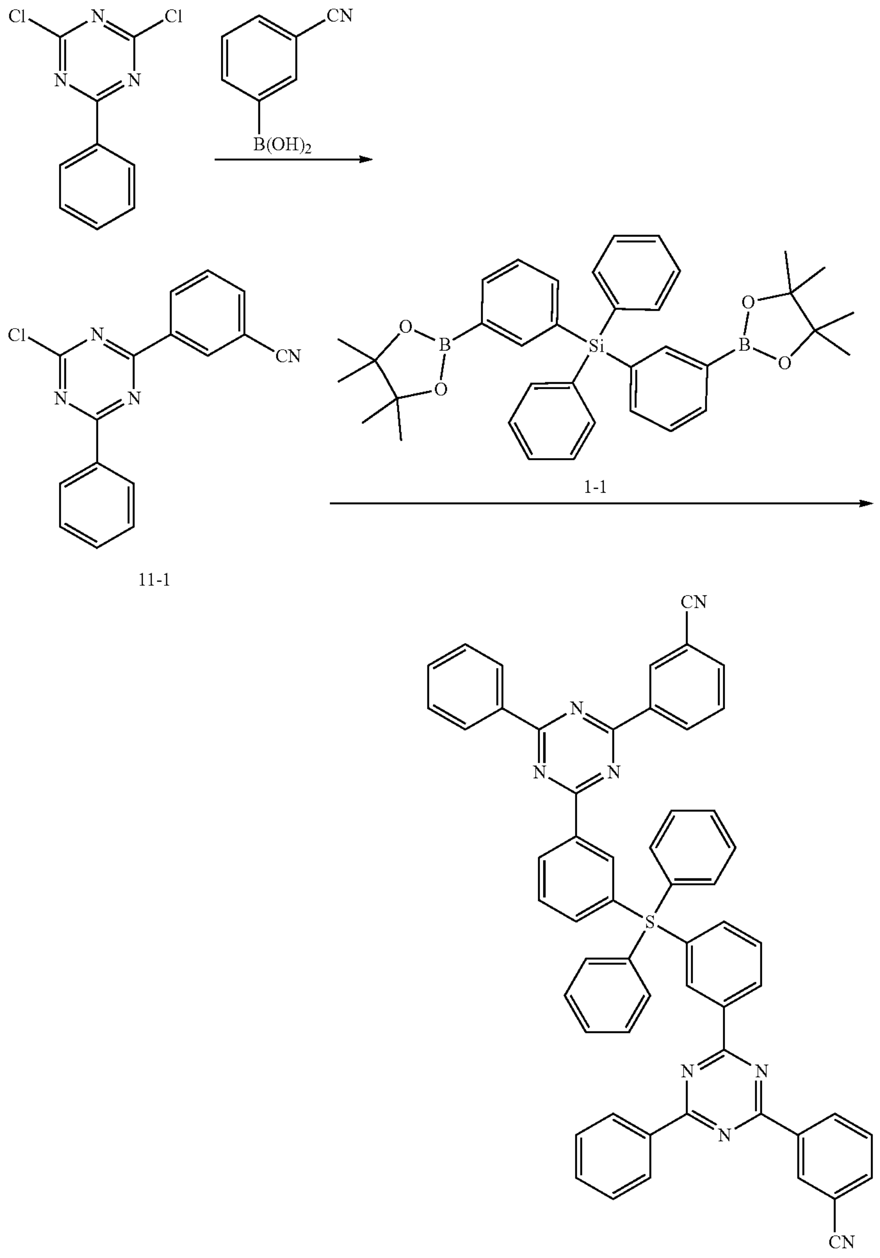
11-1

1-1

11

Synthesis of Intermediate 11-1

2,4-Dichloro-6-phenyl-1,3,5-triazine (CAS No. 1700-02-3, 1 eq) and (3-cyanophenyl)boronic acid (CAS No. 150255-96-2, 1 eq) were reacted under a catalyst condition of $Pd(PPh_3)_2Cl_2$ (0.05 eq) to obtain Intermediate 11-1. Intermediate 11-1 had a molecular weight of 293.07 ($C_{16}H_9ClN_4$ M+1) as determined by LC/MS measurement.

Synthesis of Intermediate 11

1.9 g of Intermediate 11-1, 4.6 g of Intermediate 1-1, tetrakis (triphenylphosphine) palladium of 0.30 g, and 2.2 g of potassium carbonate were placed in a reactor, dissolved in 40 mL of toluene, 10 mL of ethanol, and 10 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 3.9 g (yield: 71%) of Compound 11.

(5) Synthesis of Compound 13

Aromatic Compound 13 according to an embodiment may be synthesized, for example, by the process of Reaction 5 below.

Reaction 5

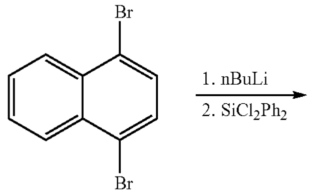

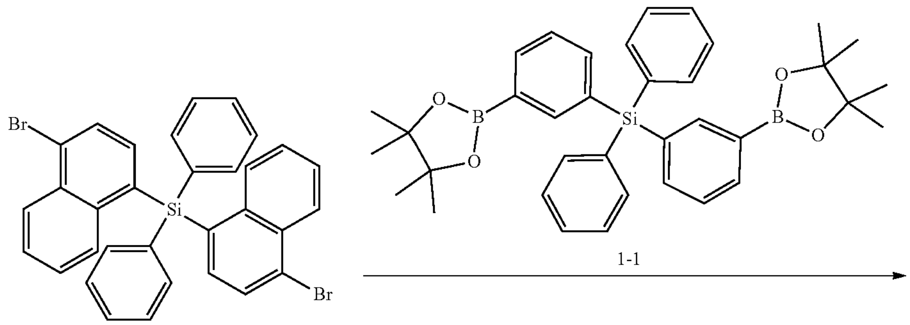

1-1

13-1

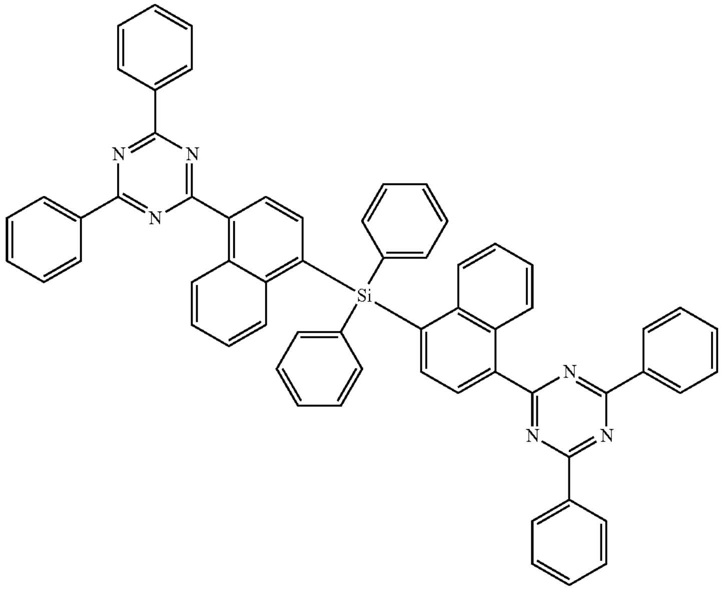

13

Synthesis of Compound 13-1

1,4-dibromonaphthalene (2 eq) was reacted with nBuLi (n-Butyllithium) (2 eq) and then reacted with dichlorodiphenylsilane ($SiCl_2Ph_2$) (1 eq) to obtain Intermediate 13-1. Intermediate 13-1 had a molecular weight of 593.01 ($C_{32}H_{22}Br_2Si$ M+1) as determined by LC/MS measurement.

Synthesis of Compound 13

3.8 g of Intermediate 13-1, 4.5 g of Intermediate 1-1, 0.30 g of tetrakis(triphenylphosphine)palladium, and 2.2 g of potassium carbonate were placed in a reactor, dissolved in 80 mL of toluene, 20 mL of ethanol, and 20 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 2.3 g (yield: 39%) of Compound 13.

(6) Synthesis of Compound 18

Aromatic Compound 18 according to an embodiment may be synthesized, for example, by the process of Reaction 6 below.

Reaction 6
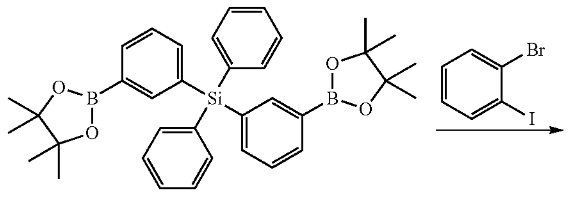
1-1
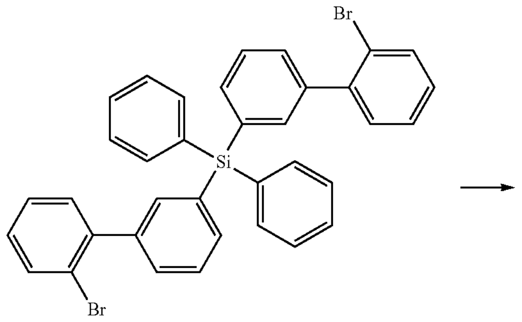
18-1
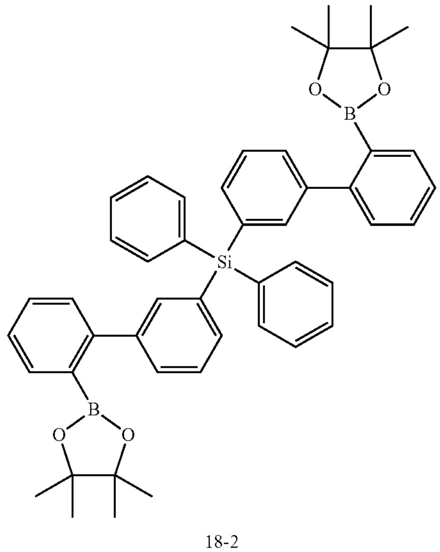
18-2
-continued
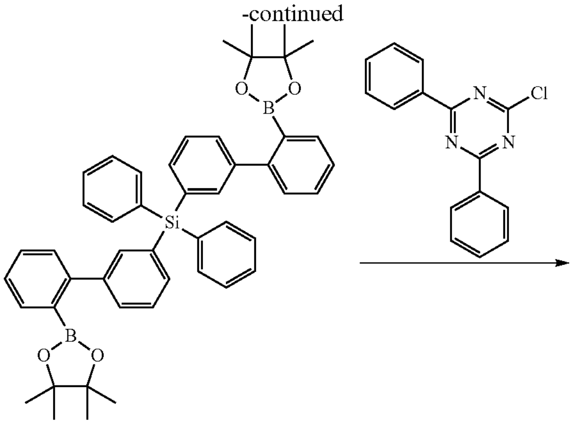
18-2
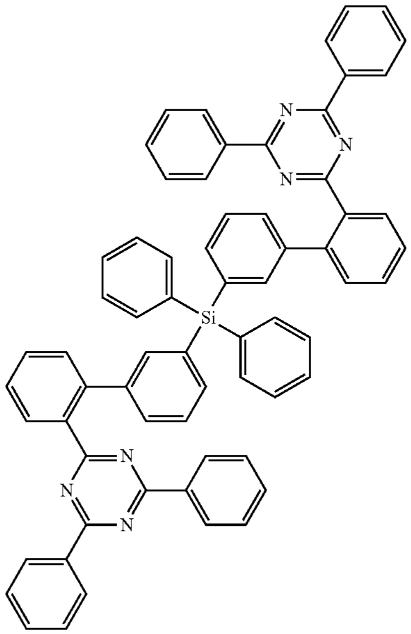
18
Synthesis of Intermediate 18-1
Intermediate 1-1 (1 eq) was reacted with 2-bromoiodobenzene (2 eq) under a condition of $Pd(PPh_3)_4$ (0.05 eq) to obtain Intermediate 18-1. Intermediate 18-1 had a molecular weight of 645.03 ($C_{36}H_{26}Br_2Si$ M+1) as determined by LC/MS measurement.

Synthesis of Intermediate 18-2

Intermediate 18-1 (1 eq) was reacted with bispinacolatodiboron (2.5 eq) under a condition of $Pd(PPh_3)_2Cl_2$ (0.05 eq) to obtain Intermediate 18-2. Intermediate 18-2 had a molecular weight of 741.38 ($C_{48}H_{50}B_2O_4Si$ M+1) as determined by LC/MS measurement.

Synthesis of Compound 18

17.6 g of Intermediate 18-2, 5.3 g of 2-Chloro-4,6-diphenyl-1,3,5-triazine (CAS No. 3842-55-5), 0.91 g of tetrakis(triphenylphosphine)palladium, 4.3 g of potassium carbonate were placed in a reactor, dissolved in 80 mL of toluene, 20 mL of ethanol, and 20 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 9.6 g (yield: 51%) of Compound 18.

(7) Synthesis of Compound 25

Aromatic Compound 25 according to an embodiment may be synthesized, for example, by the process of Reaction 7 below.

Reaction 7

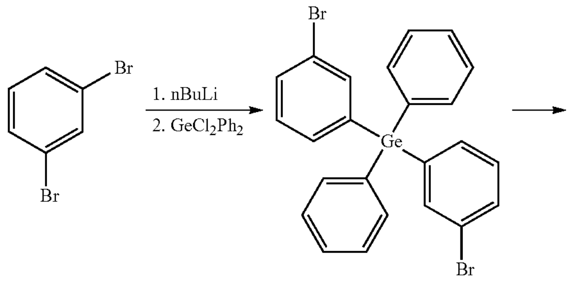

25-1

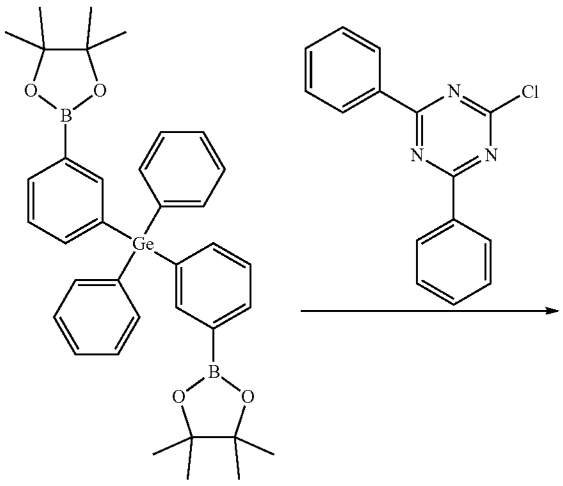

25-2

-continued

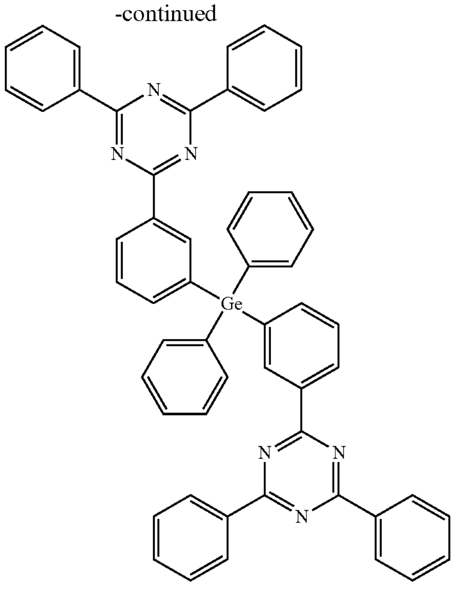

25

Synthesis of Intermediate 25-1

1,3-dibromobenzene (2 eq) was reacted with nBuLi (n-Butyllithium) (2 eq) and then reacted with dichlorodiphenylgermanium (1 eq) to obtain Intermediate 25-1. Intermediate 25-1 had a molecular weight of 538.89 ($C_{24}H_{18}Br_2Ge$ M+1) as determined by LC/MS measurement.

Synthesis of Intermediate 25-2

Intermediate 18-1 (1 eq) was reacted with bispinacolatodiboron (2.5 eq) under a condition of $Pd(PPh_3)_2Cl_2$ (0.05 eq) to obtain Intermediate 18-2. Intermediate 25-2 had a molecular weight of 635.27 ($C_{36}H_{42}B_2GeO_4$ M+1) as determined by LC/MS measurement.

Synthesis of Intermediate 25

6.0 g of Intermediate 25-2, 2.1 g of 2-chloro-4,6-diphenyl-1,3,5-triazine (CAS No. 3842-55-5), 0.36 g of tetrakis (triphenyl phosphine)palladium, and 2.7 g of potassium carbonate were placed in a reactor, dissolved in 40 mL of toluene, 10 mL of ethanol, and 10 mL of distilled water, and the resultant solution was refluxed for 24 hours. After completion of the reaction, the reaction solution was extracted with ethyl acetate, and the collected organic layer was dried over magnesium sulfate, and then the residue obtained by evaporating the solvent was separated and purified through silica gel column chromatography to thereby obtain 3.8 g (yield: 57%) of Compound 25.

The measurement of NMR values of Compounds 1, 3, 8, 11, 13, 18, and 25 demonstrated the structure of the synthesized compound. Table 1 shows the measured values of H NMR values of Compounds 1, 3, 8, 11, 13, 18, and 25.

TABLE 1

| | | MS/FAB | |
|---|---|---|---|
| Compound | $^1$H NMR ($CDCl_3$, 500 MHz) | Calc. | Found[M + 1] |
| 1 | 8.40-8.32 (m, 10H), 7.87(s) 2H, 7.64 (t) 2H, 7.57 (d) 2H, 7.49 (t) 12H, 7.46 (d) 4H, 7.38 (t) 6H | 798.29 | 799.30 |
| 3 | 8.39-8.32 (m) 6H, 8.05 (d) 2H, 7.88 (s) 2H, 7.62 (t) 2H, 7.56-7.50 (m) 12H, 7.44 (d) 4H, 7.37 (t) 6H, 7.21 (d) 2H | 834.27 | 835.22 |
| 8 | 8.39-8.32 (m) 6H, 8.15 (d) 2H, 7.88-7.83 (d) 6H, 7.63 (t) 2H, 7.59-7.7.53 (m) 4H, 7.51-7.43 (m) 10H, 7.37 (t) 6H | 744.27 | 745.30 |
| 11 | 8.57 (d) 2H, 8.40-8.32 (m) 6H, 8.01 (d) 2H, 7.89-7.83 (m) 4H, 7.74 (t) 2H, 7.63 (t) 2H, 7.55 (d) 2H, 7.49 (t) 6H, 7.46 (d) 4H, 7.38 (t) 6H | 848.28 | 849.21 |
| 13 | 8.97 (d) 2H, 8.36 (d) 8H, 8.19 (d) 2H, 8.11 (d) 2H, 7.94 (d) 2H, 7.60-7.53 (m) 4H, 7.51 (t) 12H, 7.46 (d) 4H, 7.38 (t) 6H | 898.32 | 899.31 |
| 18 | 8.38 (d) 2H, 8.35 (d) 8H, 7.97 (d) 4H, 7.87 (s) 2H, 7.64 (t) 2H, 7.59 (t) 4H, 7.53 (d) 2H, 7.50 (t) 12H, 7.44 (d) 4H, 7.35 (t) 6H | 950.36 | 951.43 |
| 25 | 8.38 (d) 8H, 8.27 (d) 2H, 7.66 (s) 2H, 7.53 (t) 2H, 7.49 (t) 12H, 7.43 (d) 2H, 7.34 (d) 4H, 7.21 (t) 6H | 44.24 | 845.27 |

2. Manufacture and Evaluation of Light-Emitting Element 1

(1) Manufacture of Light-Emitting Element 1

A light-emitting element which includes the aromatic compound according to an embodiment, or Comparative Example Compound in a light-emitting layer was manufactured by a method below. Light-emitting elements of Examples 1-1 to 1-7 were manufactured using, as light-emitting layer materials, Compounds 1, 3, 8, 11, 13, 18, and 25 which are aromatic compounds according to an embodiment. The light-emitting elements of Comparative Examples 1-1 to 1-3 were respectively manufactured using Comparative Example Compounds C1 to C3 as a material for the light-emitting layer.

An ITO substrate having a thickness of 1200 Å was used as the first electrode. The ITO substrate was washed with ultrasonic waves using isopropyl alcohol and pure water for about five minutes for each, exposed to ultraviolet rays for about 30 minutes and subjected to ozone treatment. Then, the ITO substrate was mounted on a vacuum deposition device.

A hole injection layer having a thickness of 300 Å was formed by vacuum-depositing NPB on the ITO substrate which has been prepared through cleaning. A hole transport layer having a thickness of 200 Å was formed by vacuum-depositing mCP on the hole injection layer.

Next, the host and the dopant were co-deposited at a weight ratio of 92:8 to form a light-emitting layer having a thickness of about 250 Å. Example Compound or Comparative Example Compound was used as the host, and $Ir(pmp)_3$ was used as the dopant.

Then, as an electron transport layer, TAZ was deposited on the light-emitting layer to a thickness of about 200 Å, and as an electron injection layer, LiF, which is an alkali metal halide, was deposited on the electron transport layer to a thickness of about 10 Å. A second electrode was formed by vacuum-depositing Al on the electron injection layer to a thickness of 100

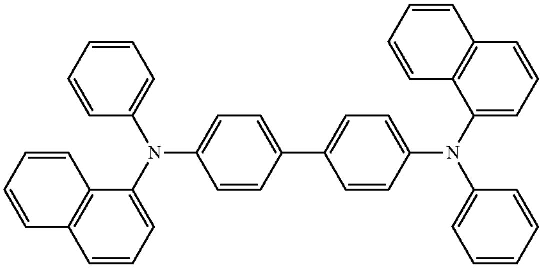

NPB

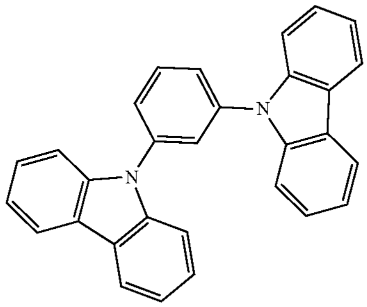

mCP

-continued
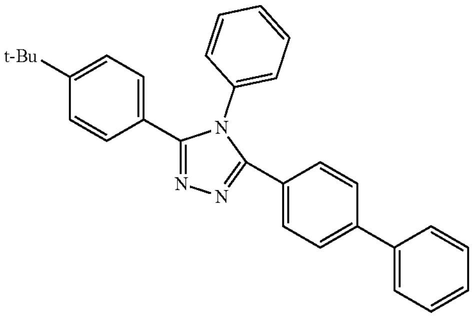
TAZ
-continued
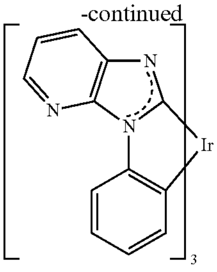
Å.
Ir(pmp)3
Example Compounds and Comparative Example Compounds used in Examples 1-1 to 1-7 and Comparative Examples 1-1 to 1-3 are shown in Table 2.
TABLE 2
| | |
|---|---|
| Comparative Example Compound C1 | 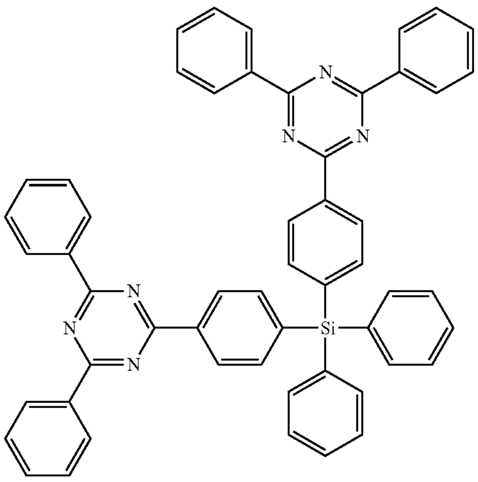 C1 |
| Comparative Example Compound C2 | 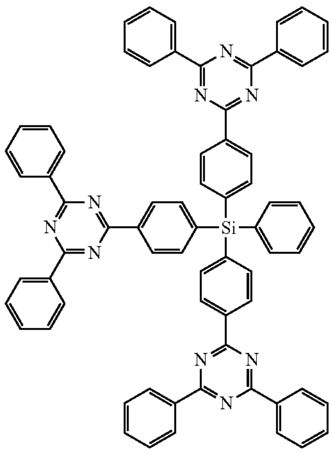 C2 |

TABLE 2-continued
| | |
|---|---|
| Comparative Example Compound C3 | 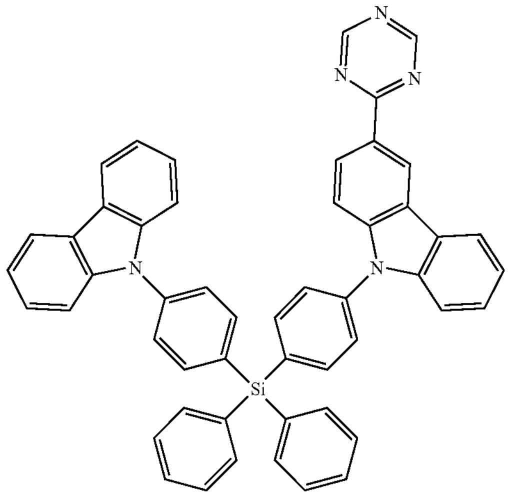 C3 |
| Compound 1 | 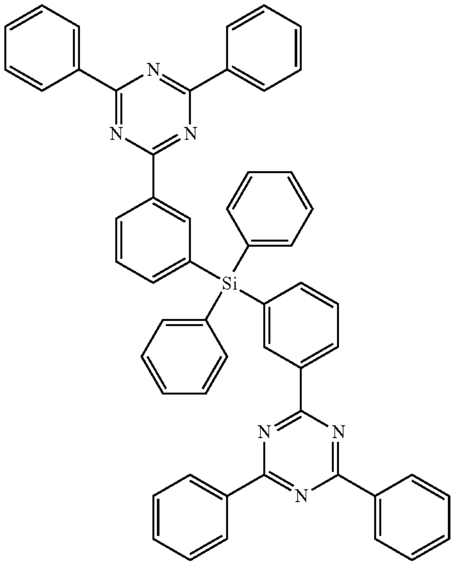 1 |

TABLE 2-continued
Compound 3
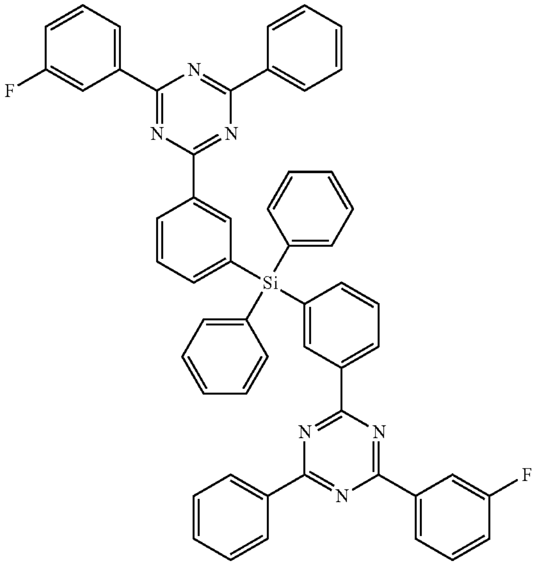 [SMILES: Fc1cccc(-c2nc(-c3ccccc3)nc(-c3cccc([Si](c4ccccc4)(c4ccccc4)c4cccc(-c5nc(-c6ccccc6)nc(-c6cccc(F)c6)n5)c4)c3)n2)c1]
3
Compound 8
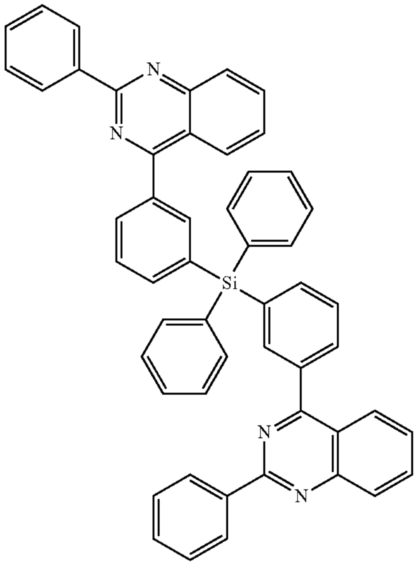 [SMILES: c1ccc(-c2nc(-c3cccc([Si](c4ccccc4)(c4ccccc4)c4cccc(-c5nc(-c6ccccc6)nc6ccccc56)c4)c3)c3ccccc3n2)cc1]
8

TABLE 2-continued
Compound 11
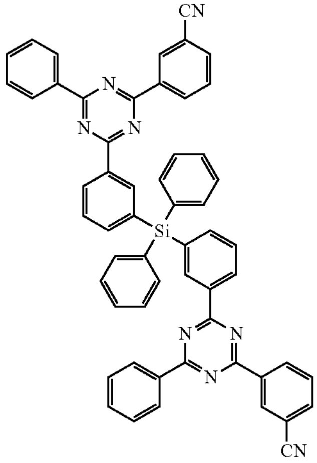 [SMILES: N#Cc1cccc(-c2nc(-c3ccccc3)nc(-c3cccc([Si](c4ccccc4)(c4ccccc4)c4cccc(-c5nc(-c6ccccc6)nc(-c6cccc(C#N)c6)n5)c4)c3)n2)c1]
11
Compound 13
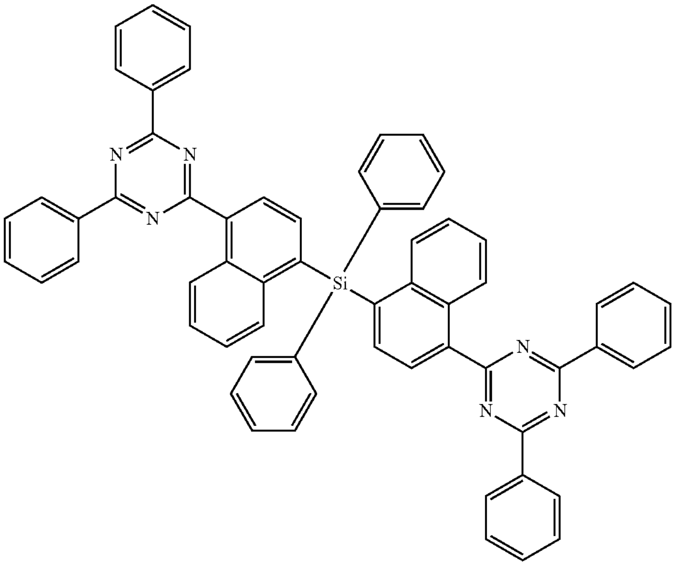 [SMILES: c1ccc(-c2nc(-c3ccccc3)nc(-c3ccc([Si](c4ccccc4)(c4ccccc4)c4ccc(-c5nc(-c6ccccc6)nc(-c6ccccc6)n5)c5ccccc45)c4ccccc34)n2)cc1]
13
Compound 18
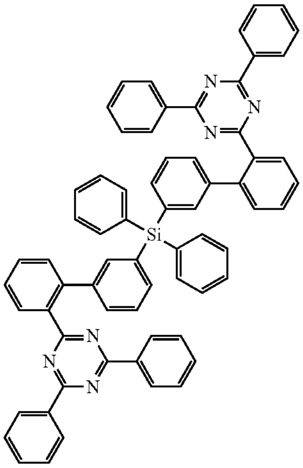 [SMILES: c1ccc(-c2nc(-c3ccccc3)nc(-c3ccccc3-c3cccc([Si](c4ccccc4)(c4ccccc4)c4cccc(-c5ccccc5-c5nc(-c6ccccc6)nc(-c6ccccc6)n5)c4)c3)n2)cc1]
18

TABLE 2-continued

Compound 25

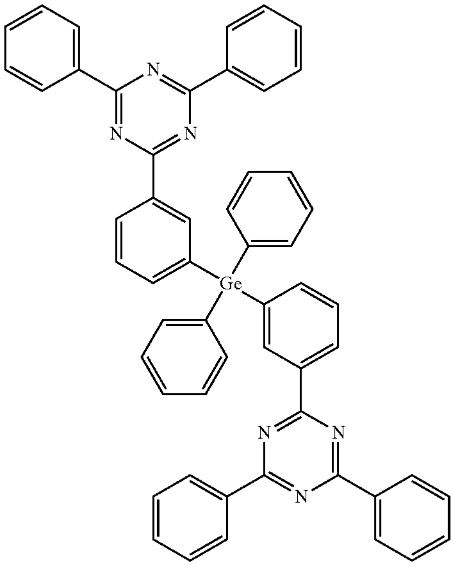

25

(2) Properties Evaluation of Light-Emitting Element 1

Table 3 shows the evaluation of the properties of the light-emitting elements of Examples and Comparative Examples. For the light-emitting elements of Examples and Comparative Examples, the driving voltage at the current density of 10 $mA/cm^2$ and the maximum external quantum efficiency were measured. The driving voltage and current density of the light-emitting element were measured using a source meter (Keithley Instrument Co., 2400 series), and the maximum external quantum efficiency was measured using an external quantum efficiency measuring device C9920-2-12 (manufactured by Hamamatsu Photonics Co.). In the evaluation of the maximum external quantum efficiency, the luminance/current density was measured using a luminance meter with wavelength sensitivity corrected, and the maximum external quantum efficiency was converted by assuming an angular luminance distribution (Lambertian) presuming a fully diffuse reflective surface.

TABLE 3

| Division | Host | Driving voltage (V) | Maximum External Quantum Efficiency ($EQE_{max}$, %) | Light-Emitting Color |
|---|---|---|---|---|
| Comparative Example 1-1 | Comparative Example Compound C1 | 4.6 | 19.1 | Blue |
| Comparative Example 1-2 | Comparative Example Compound C2 | 4.5 | 15.6 | Blue |
| Comparative Example 1-3 | Comparative Example Compound C3 | 4.5 | 13.3 | Blue |
| Example 1-1 | Compound 1 | 4.0 | 23.1 | Blue |
| Example 1-2 | Compound 3 | 4.2 | 22.1 | Blue |
| Example 1-3 | Compound 8 | 4.1 | 24.3 | Blue |
| Example 1-4 | Compound 11 | 4.1 | 25.1 | Blue |
| Example 1-5 | Compound 13 | 4.2 | 22.9 | Blue |
| Example 1-6 | Compound 18 | 3.9 | 23.8 | Blue |
| Example 1-7 | Compound 25 | 4.0 | 22.6 | Blue |

Referring to Table 3, it may be seen that the light-emitting elements of Examples 1-1 to 1-7 have a more reduced driving voltage and excellent efficiency than the light-emitting elements of Comparative Examples 1-1 to 1-3. It may be seen that the light-emitting elements of Examples 1-1 to 1-7 each have a maximum external quantum efficiency of about 22% or more. The light-emitting elements of Examples 1-1 to 1-7 respectively include Compounds 1, 3, 8, 11, 13, 18, and 25 as a host of the light-emitting layer.

Compounds 1, 3, 8, 11, 13, 18, and 25 each being an aromatic compound according to an embodiment each include four ring groups bonded to a silicon (Si) atom or a germanium (Ge) atom, and two of the four ring groups include a nitrogen-containing heterocyclic group. Compounds 1, 3, 11, 13, 18, and 25 each include a triazine group, and Compound 8 includes a quinazoline group. Accordingly, the light-emitting element including the aromatic compound according to an embodiment may exhibit a reduced driving voltage and excellent (greater) efficiency.

The light-emitting element of Comparative Example 1-1 includes Comparative Example Compound C1. Comparative Example Compound C1 includes two nitrogen-containing heterocyclic groups bonded to an aryl group having 6 ring-forming carbon atoms, and includes a nitrogen-containing heterocycle at a position corresponding to $Ar_1$ and $Ar_2$ in Formula 1 of an embodiment. The light-emitting element of Comparative Example 1-3 includes Comparative Example Compound C3. Comparative Example Compound C3 includes two nitrogen-containing heterocyclic groups bonded to an aryl group having 6 ring-forming carbon atoms, and includes a nitrogen-containing heterocycle at a position corresponding to $Ar_1$ and $Ar_2$ in Formula 1 of an embodiment. The light-emitting element of Comparative Example 1-2 includes Comparative Example Compound C2, and Comparative Example Compound C2 includes three nitrogen-containing heterocycles.

3. Manufacture and Evaluation of Light-Emitting Element 2

(1) Manufacture of Light-Emitting Element 2

A light-emitting element including the aromatic compound according to an embodiment or Comparative Example Compound in the electron transport layer was manufactured by a method below. Compounds 1, 3, 8, 11, 13, 18, and 25 each being an aromatic compound according to an embodiment were used as materials for the electron transport layer to manufacture light-emitting elements of Examples 2-1 to 2-7. Light-emitting elements of Comparative Examples 2-1 to 2-3 respectively manufactured using Comparative Example Compounds C1 to C3 as a light-emitting layer material.

An ITO substrate having a thickness of 1200 Å was used as the first electrode. The ITO substrate was washed with ultrasonic waves using isopropyl alcohol and pure water for about five minutes for each, exposed to ultraviolet rays for about 30 minutes and subjected to ozone treatment. Then, the ITO substrate was mounted on a vacuum deposition device.

A hole injection layer having a thickness of 300 Å was formed by vacuum-depositing NPB on the ITO substrate which has been prepared through cleaning. A hole transport layer having a thickness of 200 Å was formed by vacuum-depositing mCP on the hole injection layer.

Next, the host and the dopant were co-deposited at a weight ratio of 92:8 to form a light-emitting layer having a thickness of about 250 Å. Example Compound or Comparative Example Compound was used as the host, and $Ir(pmp)_3$ was used as the dopant.

Then, as an electron transport layer, Example Compound or Comparative Example Compound was deposited on the light-emitting layer to a thickness of about 200 Å, and as an electron injection layer, LiF, which is an alkali metal halide, was deposited on the electron transport layer to a thickness of about 10 Å. A second electrode was formed by vacuum-depositing Al on the electron injection layer to a thickness of 100 Å.

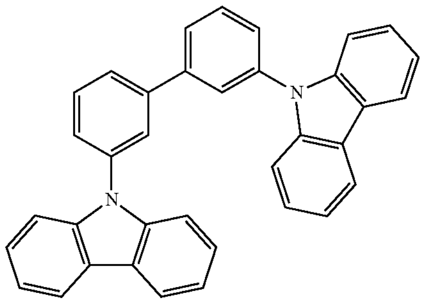

mCPB (2) Evaluation of Light-Emitting Element 2

Table 4 shows the evaluation of the properties of the light-emitting elements of Examples and Comparative Examples. For the light-emitting elements of Examples and Comparative Examples, the driving voltage at the current density of 10 mA/cm2 and the maximum external quantum efficiency were measured. The driving voltage and current density of the light-emitting element were measured using a source meter (Keithley Instrument Co., 2400 series), and the maximum external quantum efficiency was measured using an external quantum efficiency measuring device C9920-2-12 (manufactured by Hamamatsu Photonics Co.). In the evaluation of the maximum external quantum efficiency, the luminance/current density was measured using a luminance meter with wavelength sensitivity corrected, and the maximum external quantum efficiency was converted by assuming an angular luminance distribution (Lambertian) presuming a fully diffuse reflective surface.

TABLE 4

| Division | Electron Transport Layer | Driving voltage (V) | Maximum External Quantum Efficiency ($EQE_{max}$, %) | Light-Emitting Color |
|---|---|---|---|---|
| Comparative Example 2-1 | Comparative Example Compound C1 | 5.7 | 12.1 | Blue |
| Comparative Example 2-2 | Comparative Example Compound C2 | 5.4 | 13.5 | Blue |
| Comparative Example 2-3 | Comparative Example Compound C3 | 5.9 | 16.1 | Blue |
| Example 2-1 | Compound 1 | 4.1 | 21.1 | Blue |
| Example 2-2 | Compound 3 | 4.3 | 21.3 | Blue |
| Example 2-3 | Compound 8 | 4.7 | 22.5 | Blue |
| Example 2-4 | Compound 11 | 4.2 | 20.8 | Blue |
| Example 2-5 | Compound 13 | 4.2 | 20.7 | Blue |
| Example 2-6 | Compound 18 | 4.4 | 22.1 | Blue |
| Example 2-7 | Compound 25 | 4.5 | 22.5 | Blue |

Referring to Table 4, it may be seen that the light-emitting elements of Examples 2-1 to 2-3 have a more reduced driving voltage and excellent (greater) efficiency than the light-emitting elements of Comparative Examples 2-1 to 2-7. It may be seen that the light-emitting elements of Examples 2-1 to 2-7 each have a maximum external quantum efficiency of about 20% or more. The light-emitting elements of Examples 2-1 to 2-7 respectively include compounds 1, 3, 8, 11, 13, 18, and 25 in the electron transport layer. Accordingly, the light-emitting element including the aromatic compound of Example may exhibit a reduced driving voltage and excellent (greater) efficiency.

A light-emitting element according to an embodiment may include a first electrode, a second electrode on the first electrode, and at least one functional layer between the first electrode and the second electrode. At least one functional layer may include an aromatic compound according to an embodiment, and the aromatic compound may include four ring groups bonded to a silicon atom or a germanium atom. The four ring groups may be hydrocarbon ring groups or heterocyclic groups, and due to their three-dimensional structure, intermolecular interactions of aromatic compounds may be prevented (or reduced). In addition, a nitrogen-containing heterocyclic group may be bonded to two ring groups selected from among the four ring groups of the aromatic compound. The aromatic compound according to an embodiment including a nitrogen-containing heterocyclic group may exhibit excellent electron transport properties. Accordingly, the light-emitting element including the aromatic compound according to an embodiment may exhibit improved efficiency and driving voltage.

A light-emitting element according to an embodiment may include an aromatic compound according to an embodiment and thus exhibit a reduced driving voltage and an improved (greater) efficiency.

An aromatic compound according to an embodiment may reduce a driving voltage of the light-emitting element and may improve a luminous efficiency.

Although the embodiments of the present disclosure have been described, it is understood that the present disclosure should not be limited to these embodiments but various suitable changes and modifications can be made by one ordinary skilled in the art within the spirit and scope of the present disclosure as defined by the following claims, and equivalents thereof.

What is claimed is:

1. A light-emitting element comprising:

a first electrode;

a second electrode on the first electrode; and at least one functional layer between the first electrode and the second electrode and including an aromatic compound represented by Formula 1:

Formula 1

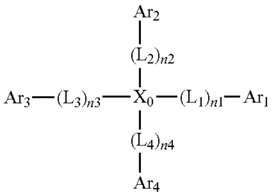

wherein in Formula 1, $X_0$ is Si or Ge, n1 to n4 are each independently 1 or 2, $L_1$ to $L_4$ are each independently a substituted or unsubstituted divalent hydrocarbon ring group having 6 to 30 ring-forming carbon atoms, or a substituted or unsubstituted divalent heterocyclic group having 3 to 30 ring-forming carbon atoms, two selected groups from among $Ar_1$ to $Ar_4$ are nitrogen-containing heterocyclic groups and the other two groups are each a hydrogen atom, a substituted or unsubstituted aryl group having 6 to 30 ring-forming carbon atoms, or a substituted or unsubstituted heteroaryl group having 2 to 30 ring-forming carbon atoms, n1 and n2 are 1, and $L_1$ and $L_2$ are each independently a substituted or unsubstituted divalent hydrocarbon ring group having 7 to 30 ring-forming carbon atoms if $Ar_1$ and $Ar_2$ are heterocyclic groups containing at least one nitrogen atom as a ring-forming atom, and wherein the two nitrogen-containing heterocyclic groups are each independently a substituted pyridine group, a substituted pyrimidine group, a substituted triazine group, or a substituted quinazoline group, wherein the substituted pyridine group, the substituted pyrimidine group, or the substituted quinazoline group comprises, as a substituent, a substituted or unsubstituted phenyl group, a substituted or unsubstituted naphthyl group, a substituted or unsubstituted biphenyl group, or a substituted or unsubstituted pyridine group.

2. The light-emitting element of claim 1, wherein, among the substituent, the substituted phenyl group, the substituted naphthyl group, the substituted biphenyl group, or the substituted pyridine group is substituted with at least one substituent selected from the group consisting of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkenyl group, an alkynyl group, an alkoxy group, a hydrocarbon ring group, an aryl group, and a heterocyclic group.

3. The light-emitting element of claim 1, wherein the two nitrogen-containing heterocyclic groups are each independently represented by any one of W1-1 to W1-4 below:

W1-1

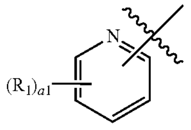

W1-2

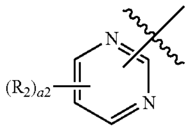

W1-3

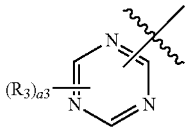

W1-4

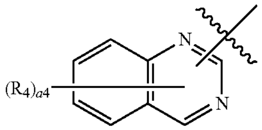

wherein in W1-1, a1 is an integer of 1 to 4, in W1-2, a2 is an integer of 1 to 3, in W1-3, a3 is an integer of 1 to 2, in W1-4, a4 is an integer of 1 to 5, and in W1-1 to W1-4, $R_1$ to $R_4$ are each independently a substituted or unsubstituted phenyl group, a substituted or unsubstituted naphthyl group, a substituted or unsubstituted biphenyl group, or a substituted or unsubstituted pyridine group.

4. The light-emitting element of claim 1, wherein Formula 1 is represented by any one of Formulas 2-1 to 2-3:

Formula 2-1

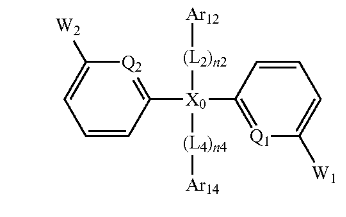

Formula 2-2

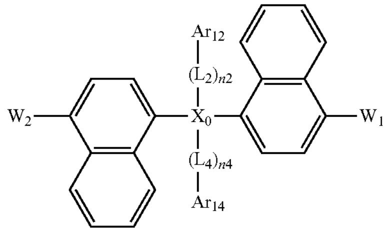

-continued

Formula 2-3

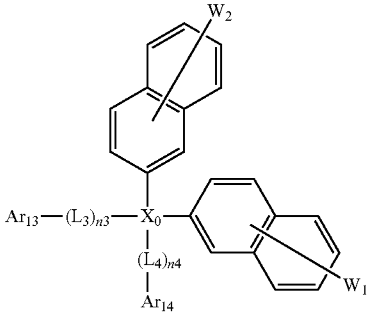

wherein in Formula 2-1, $Q_1$ and $Q_2$ are each independently CH or N and in Formulas 2-1 to 2-3, $W_1$ and $W_2$ are each independently the nitrogen-containing heterocyclic group, $Ar_{12}$ to $Ar_{14}$ are each independently a hydrogen atom, a substituted or unsubstituted aryl group having 6 to 30 ring-forming carbon atoms, or a substituted or unsubstituted heteroaryl group having 2 to 30 ring-forming carbon atoms, and $L_2$ to $L_4$, n2 to n4, and $X_0$ are the same as defined in claim 1.

5. The light-emitting element of claim 4, wherein in Formulas 2-1 to 2-3, $W_1$ and $W_2$ are the same.

6. The light-emitting element of claim 4, wherein in Formula 2-1, $L_2$ and $L_4$ are the same.

7. The light-emitting element of claim 1, wherein Formula 1 is represented by Formula 3:

Formula 3

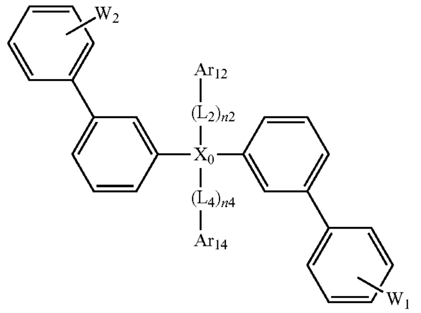

wherein in Formula 3, $W_1$ and $W_2$ are each independently the nitrogen-containing heterocyclic group, $Ar_{12}$ and $Ar_{14}$ are each independently a hydrogen atom, a substituted or unsubstituted aryl group having 6 to 30 ring-forming carbon atoms, or a substituted or unsubstituted heteroaryl group having 2 to 30 ring-forming carbon atoms, and $L_2$, $L_4$, n2, n4, and $X_0$ are the same as defined in claim 1.

8. The light-emitting element of claim 1, wherein $L_1$ to $L_4$ are each independently a substituted or unsubstituted phenylene group, a substituted or unsubstituted divalent biphenyl group, a substituted or unsubstituted pyridylene group, or a substituted or unsubstituted naphthylene group.

9. The light-emitting element of claim 1, wherein the at least one functional layer comprises a light-emitting layer, a hole transport region between the first electrode and the light-emitting layer, and an electron transport region between the light-emitting layer and the second electrode, and at least one of the light-emitting layer or the electron transport region includes the aromatic compound.

10. The light-emitting element of claim 9, wherein the electron transport region comprises a hole blocking layer on the light-emitting layer, an electron transport layer on the hole blocking layer, and an electron injection layer on the electron transport layer, and at least one of the hole blocking layer, the electron transport layer, or the electron injection layer includes the aromatic compound.

11. The light-emitting element of claim 1, wherein the aromatic compound is represented by any one of compounds of Compound Group 1:

Compound Group 1

3

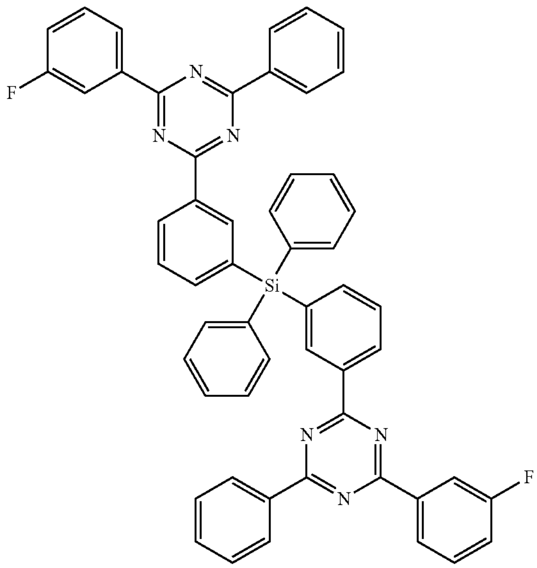

4

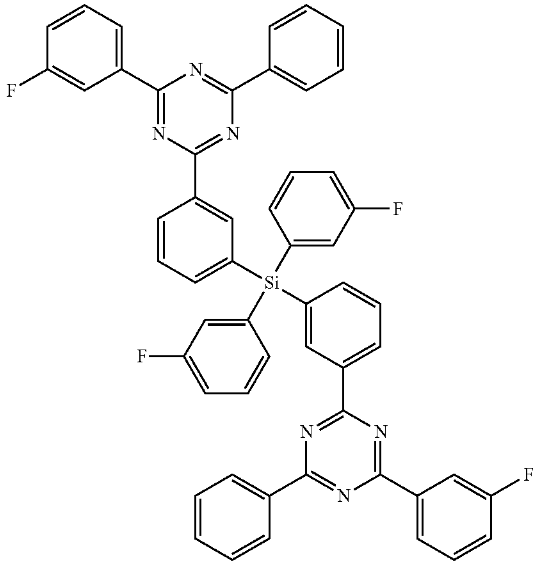

5
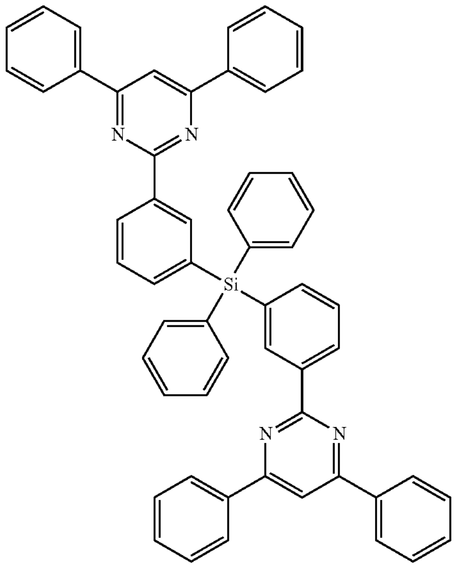
6
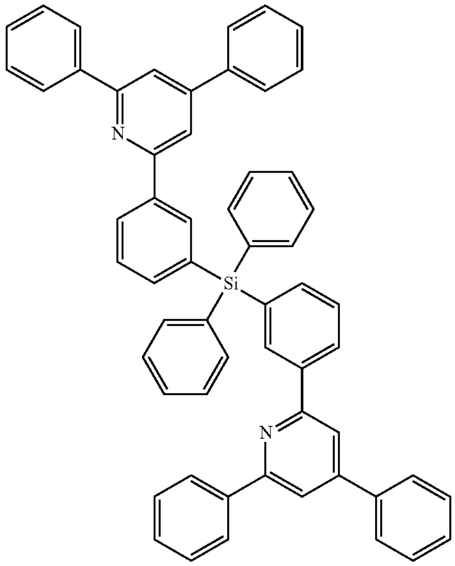
7
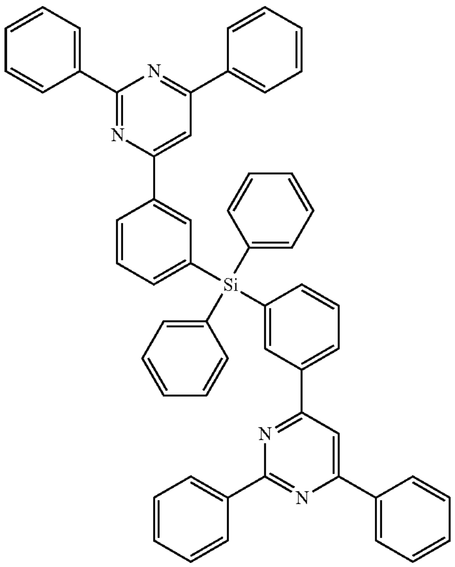
8
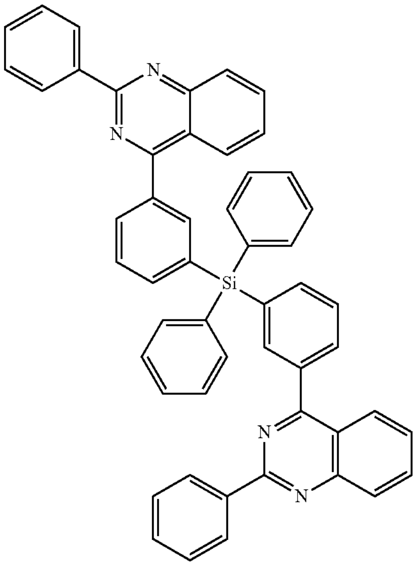

-continued
9
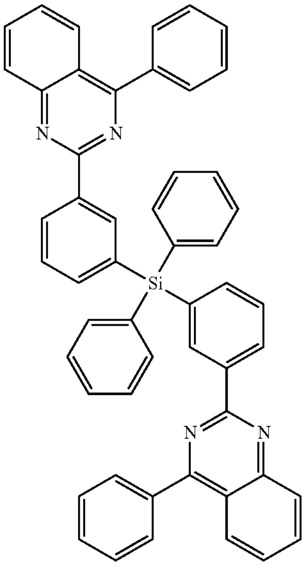
10
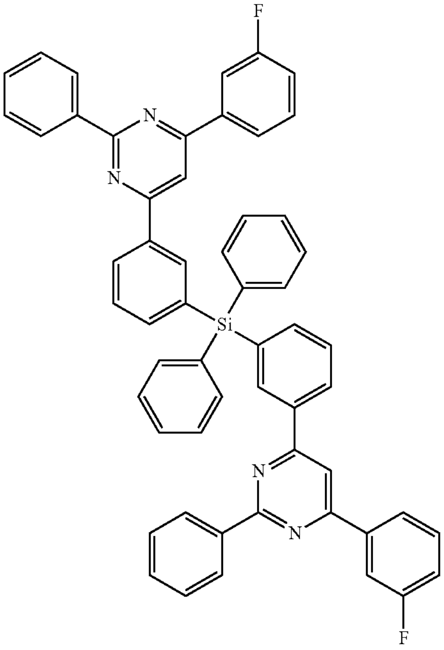
-continued
11
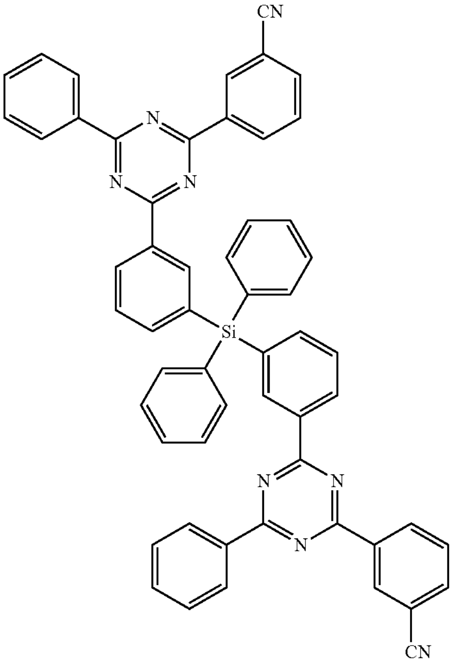
12
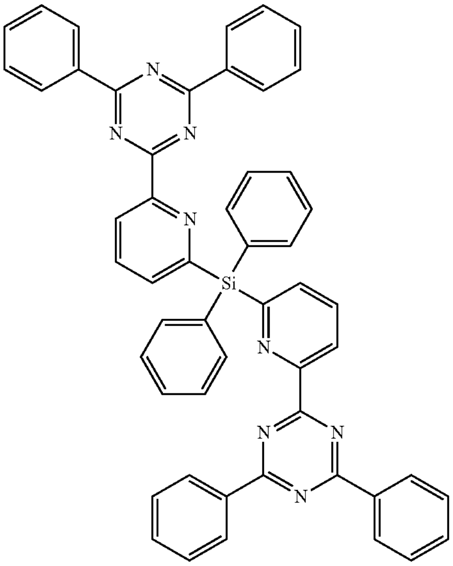

-continued
22
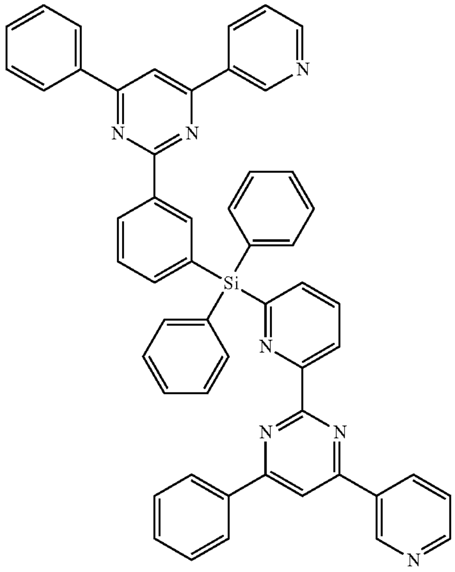
24
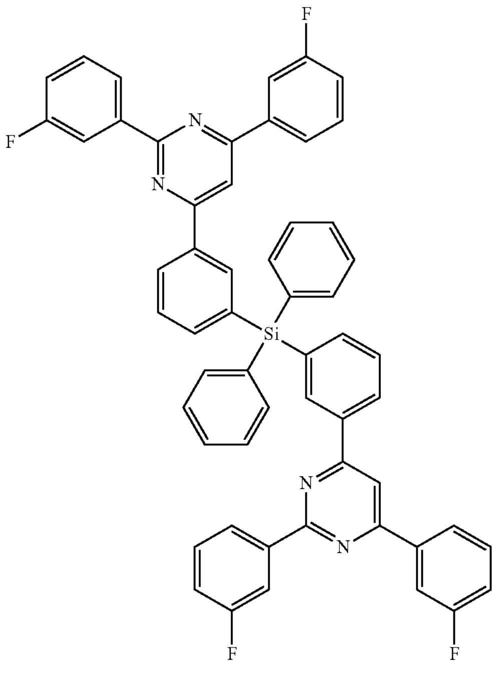
-continued
25
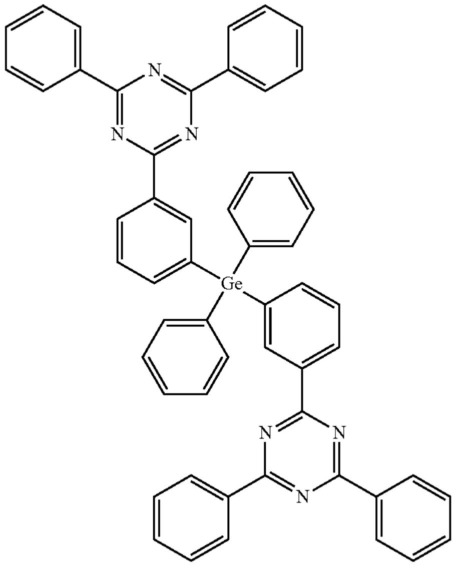
26
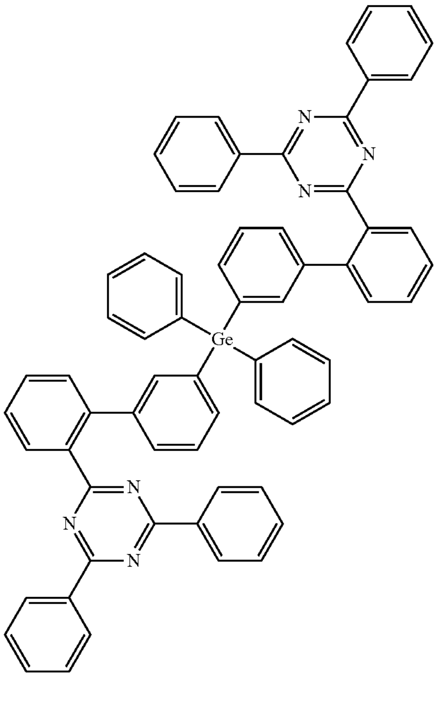

-continued

27

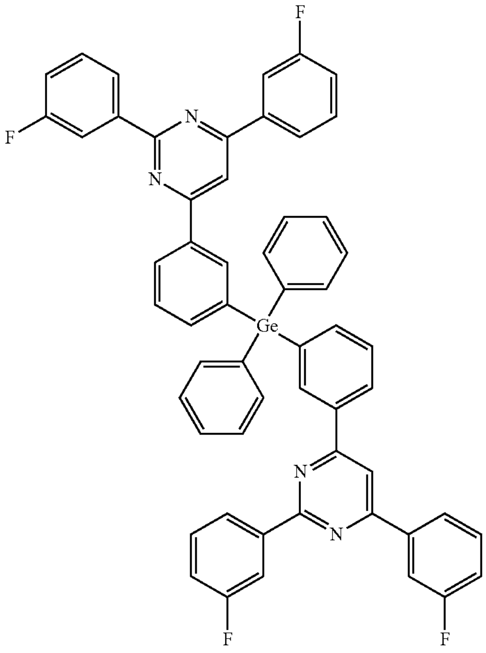

28

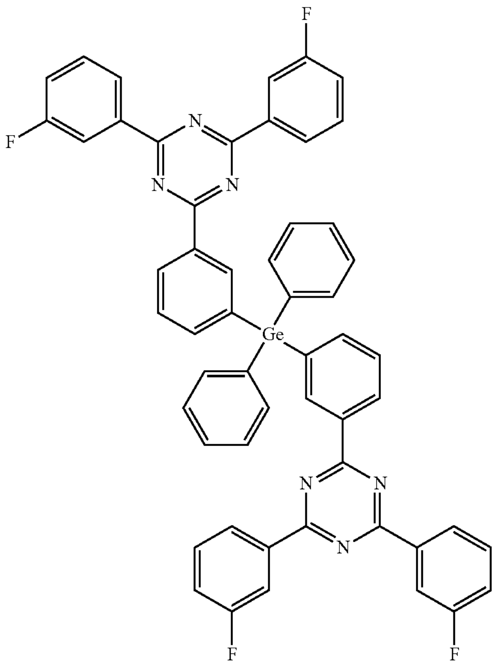

-continued

29

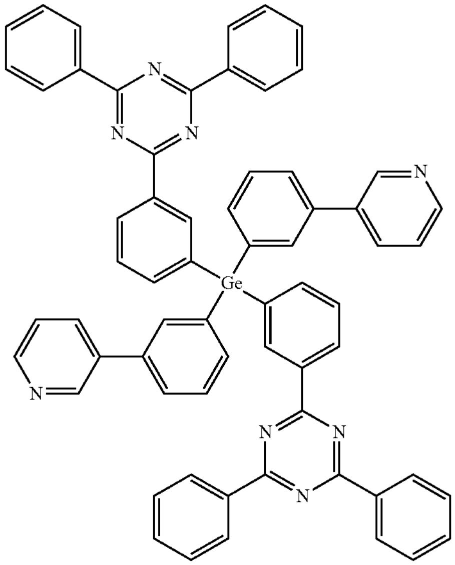

30

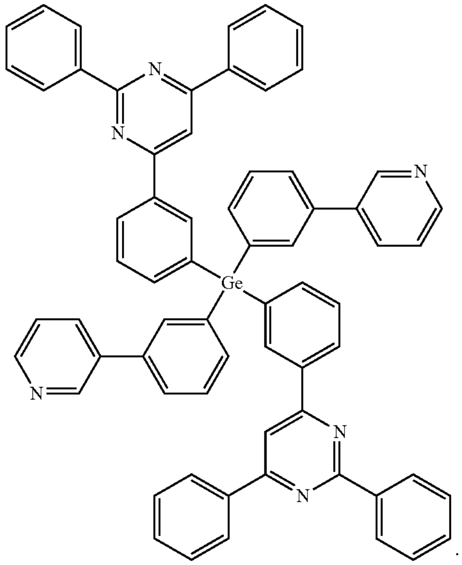

12. An aromatic compound represented by Formula 1:

Formula 1

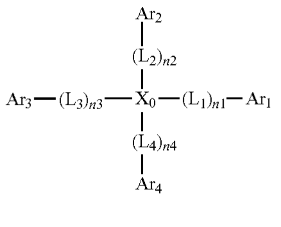

wherein in Formula 1, $X_0$ is Si or Ge, n1 to n4 are each independently 1 or 2, $L_1$ to $L_4$ are each independently a substituted or unsubstituted divalent hydrocarbon ring group having 6 to 30 ring-forming carbon atoms, or a substituted or unsubstituted divalent heterocyclic group having 3 to 30 ring-forming carbon atoms, two selected groups from among $Ar_1$ to $Ar_4$ are nitrogen-containing heterocyclic groups and the other two groups are each a hydrogen atom, a substituted or unsubstituted aryl group having 6 to 30 ring-forming carbon atoms, or a substituted or unsubstituted heteroaryl group having 2 to 30 ring-forming carbon atoms, n1 and n2 are 1, and $L_1$ and $L_2$ are each independently a substituted or unsubstituted divalent hydrocarbon ring group having 7 to 30 ring-forming carbon atoms if $Ar_1$ and $Ar_2$ are heterocyclic groups containing at least one nitrogen atom as a ring-forming atom, and wherein the two nitrogen-containing heterocyclic groups are each independently a substituted pyridine group, a substituted pyrimidine group, a substituted triazine group, or a substituted quinazoline group, wherein the substituted pyridine group, the substituted pyrimidine group, or the substituted quinazoline group comprises, as a substituent, a substituted or unsubstituted phenyl group, a substituted or unsubstituted naphthyl group, a substituted or unsubstituted biphenyl group, or a substituted or unsubstituted pyridine group.

13. The aromatic compound of claim 12, wherein, among the substituent, the substituted phenyl group, the substituted naphthyl group, the substituted biphenyl group, or the substituted pyridine group is substituted with at least one substituent selected from the group consisting of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkenyl group, an alkynyl group, an alkoxy group, a hydrocarbon ring group, an aryl group, and a heterocyclic group.

14. The aromatic compound of claim 12, wherein the two nitrogen-containing heterocyclic groups are each independently represented by any one of W1-1 to W1-4 below:

W1-1

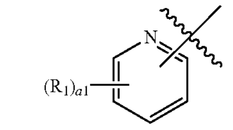

W1-2

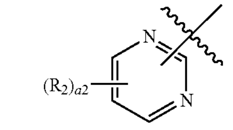

W1-3

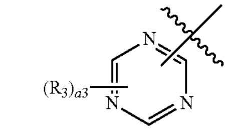

W1-4

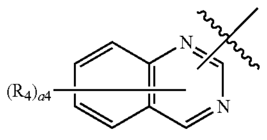

wherein in W1-1, a1 is an integer of 1 to 4, in W1-2, a2 is an integer of 1 to 3, in W1-3, a3 is an integer of 1 to 2, in W1-4, a4 is an integer of 1 to 5, and in W1-1 to W1-4, $R_1$ to $R_4$ are each independently a substituted or unsubstituted phenyl group, a substituted or unsubstituted naphthyl group, a substituted or unsubstituted biphenyl group, or a substituted or unsubstituted pyridine group.

15. The aromatic compound of claim 12, wherein Formula 1 is represented by any one of Formulas 2-1 to 2-3:

Formula 2-1

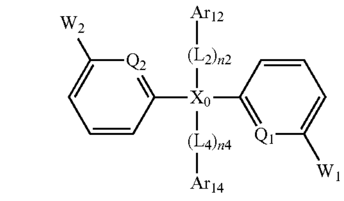

Formula 2-2

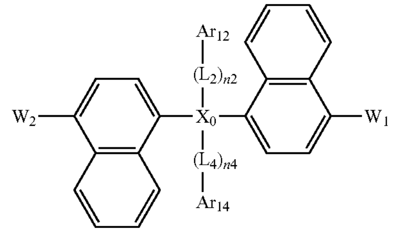

Formula 2-3

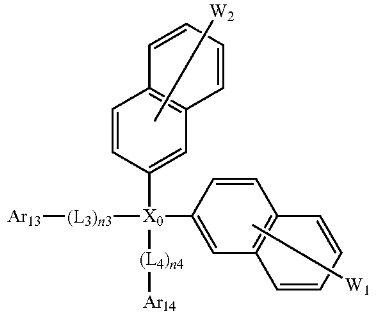

wherein in Formula 2-1, $Q_1$ and $Q_2$ are each independently CH or N in Formulas 2-1 to 2-3, $W_1$ and $W_2$ are each independently the nitrogen-containing heterocyclic group and, $Ar_{12}$ to $Ar_{14}$ are each independently a hydrogen atom, a substituted or unsubstituted aryl group having 6 to 30 ring-forming carbon atoms, or a substituted or unsubstituted heteroaryl group having 2 to 30 ring-forming carbon atoms, and $L_2$ to $L_4$, n2 to n4, and $X_0$ are the same as defined in claim 1.

16. The aromatic compound of claim 15, wherein in Formulas 2-1 to 2-3, $W_1$ and $W_2$ are same.

17. The aromatic compound of claim 12, wherein $L_1$ to $L_4$ are each independently a substituted or unsubstituted phenylene group, a substituted or unsubstituted divalent biphenyl group, a substituted or unsubstituted pyridylene group, or a substituted or unsubstituted naphthylene group.

18. An aromatic compound, wherein the aromatic compound is represented by any one of compounds of Compound Group 1:

Compound Group 1
3
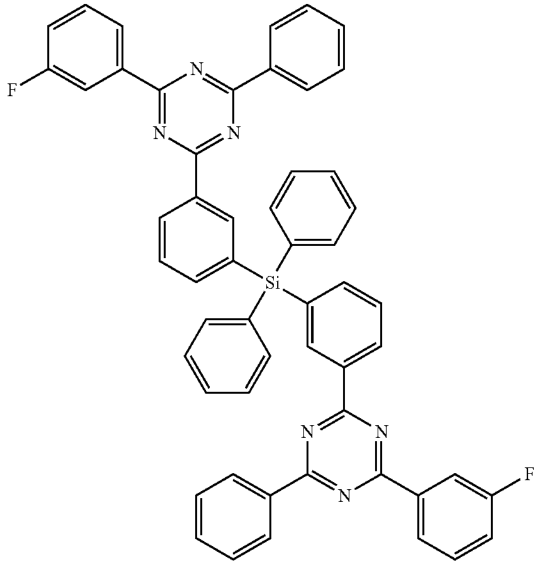
-continued
5
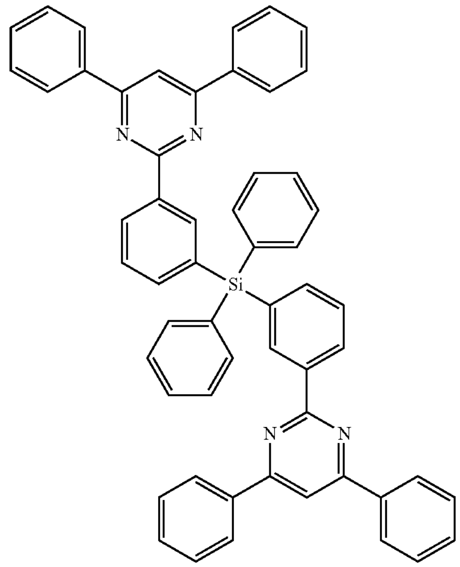
4
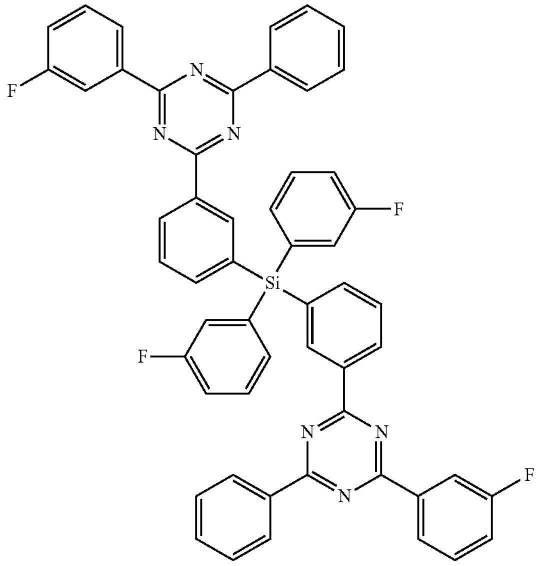
6
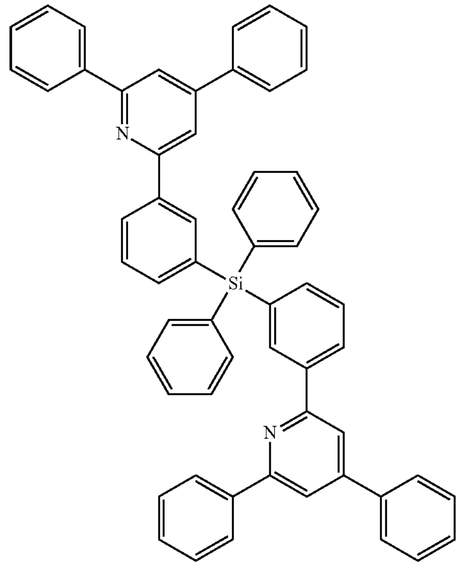

-continued
7
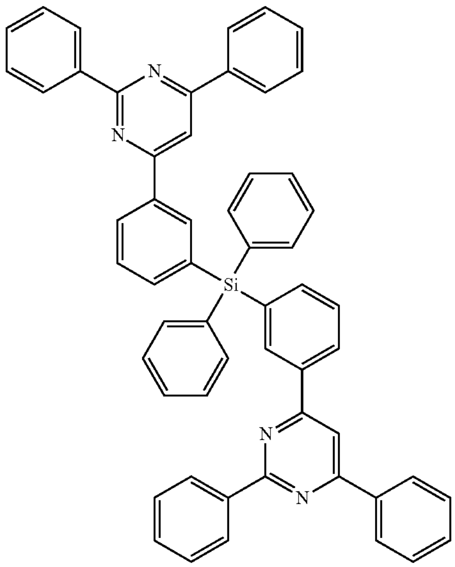
8
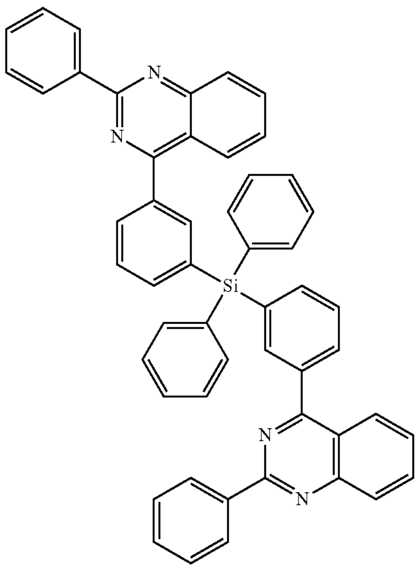
-continued
9
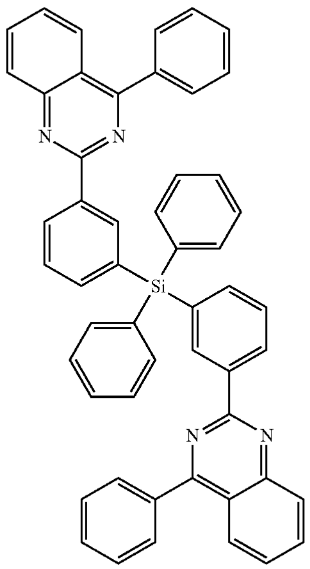
10
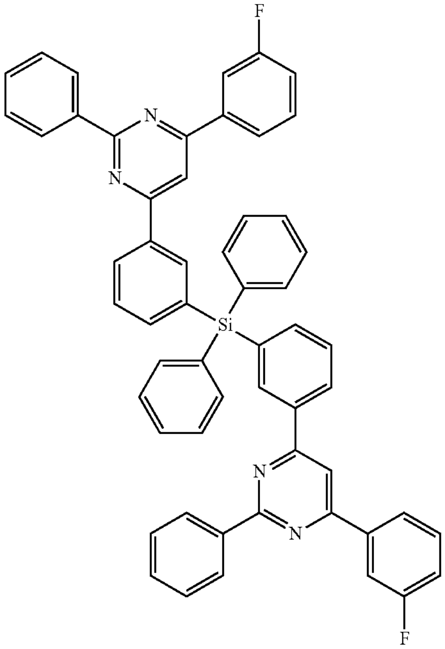

-continued
11
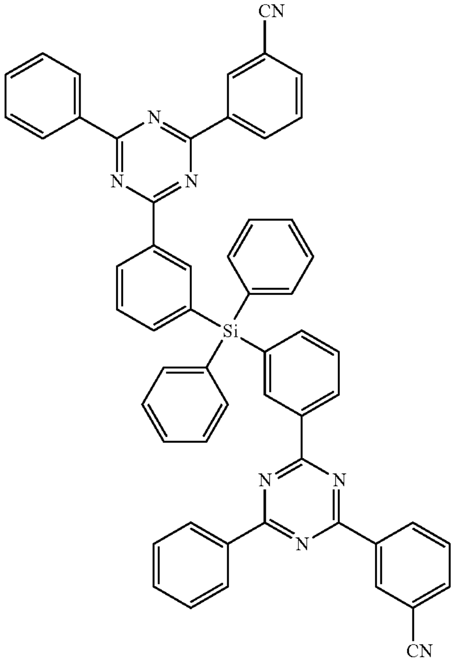
12
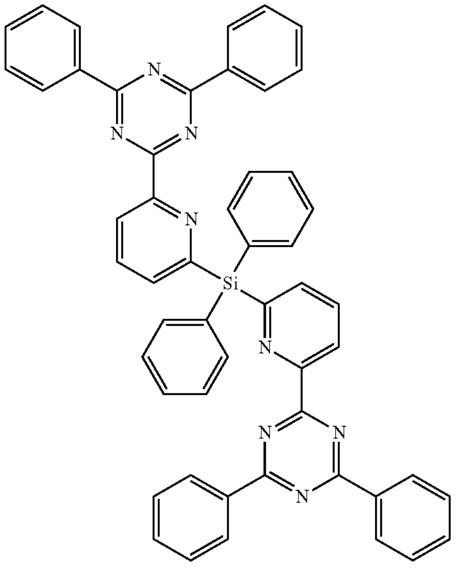
-continued
13
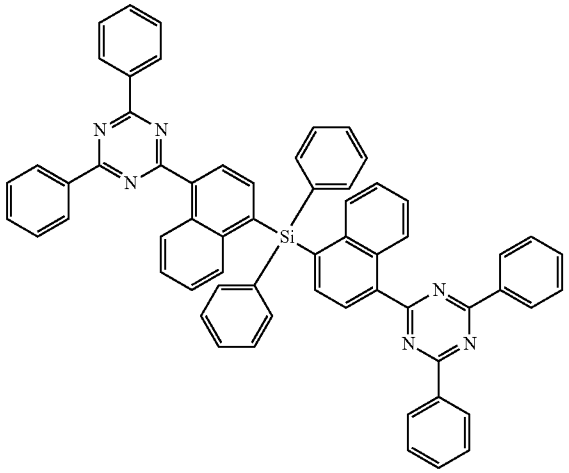
17
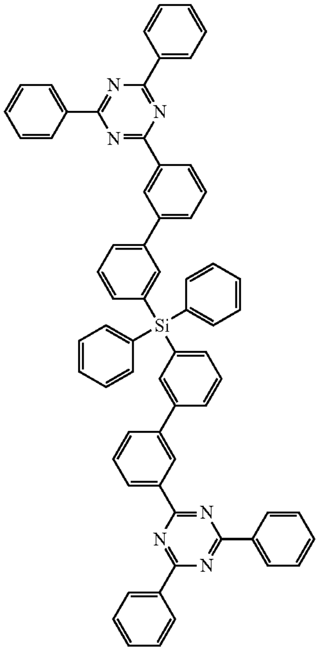

-continued
18
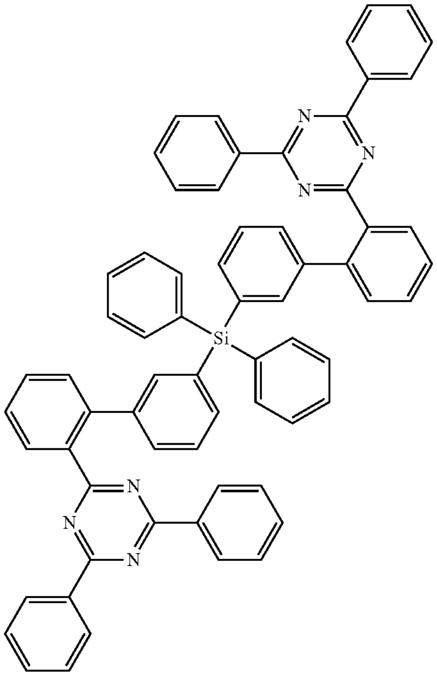
19
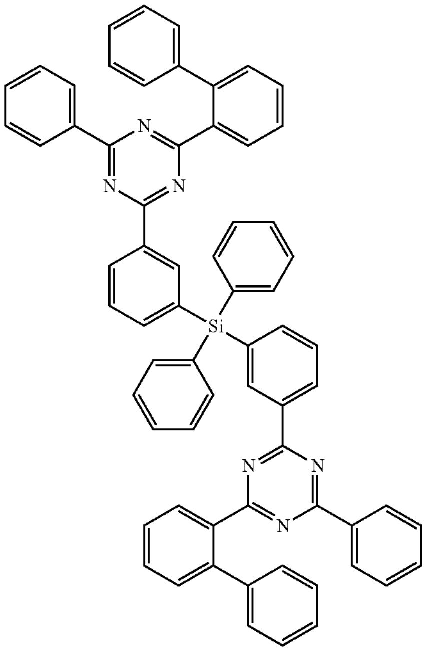
-continued
20
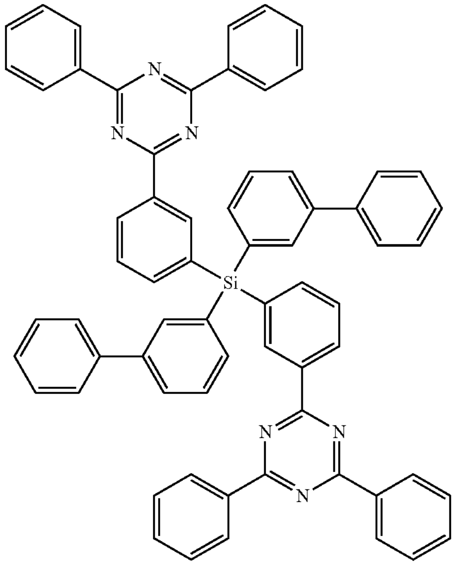
21
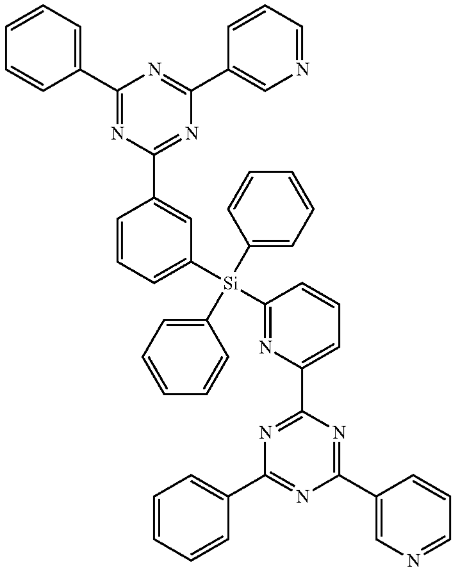

-continued
22
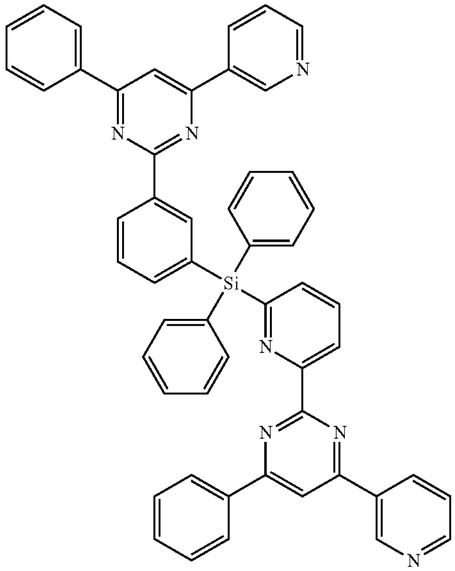
23
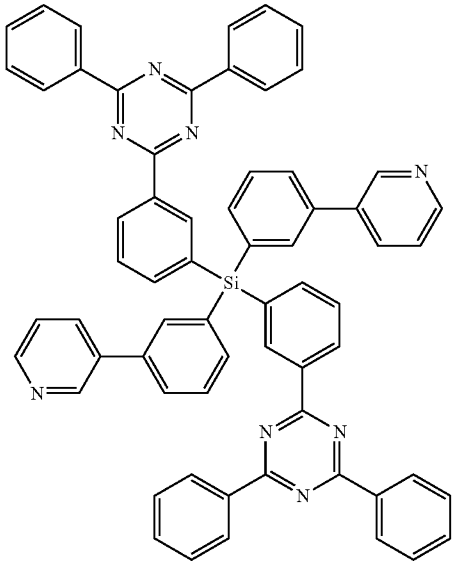
-continued
24
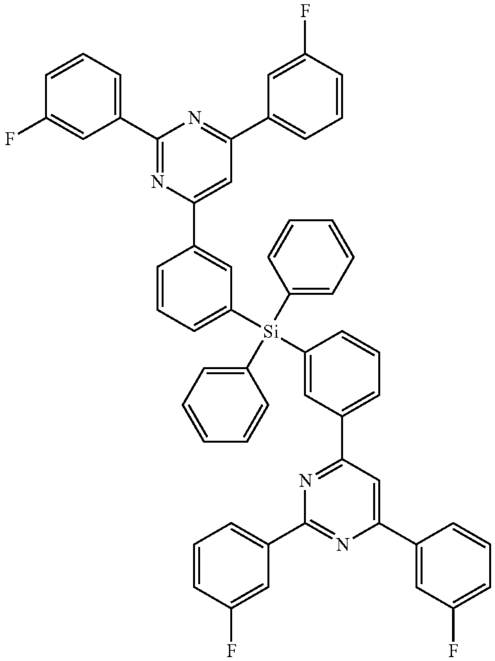
25
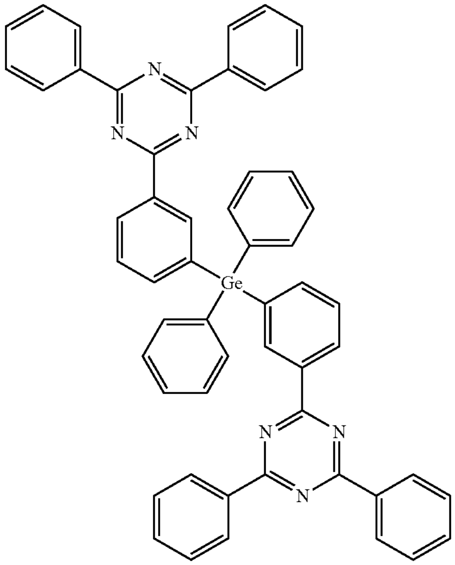

-continued
26
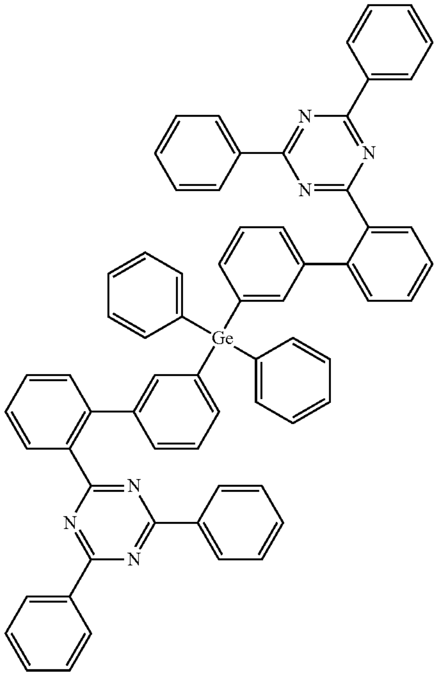
27
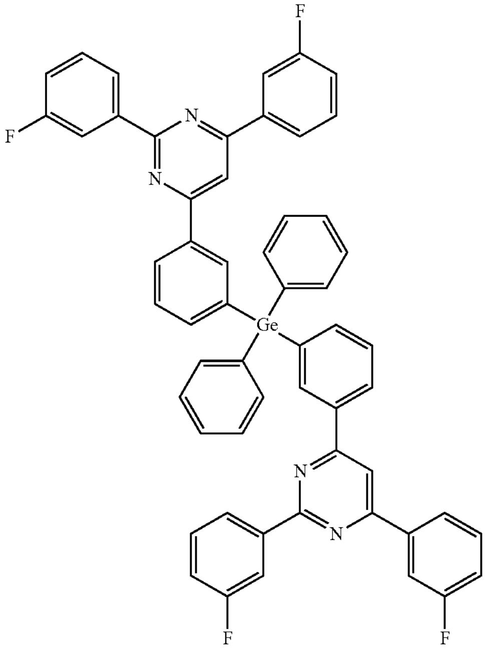
-continued
28
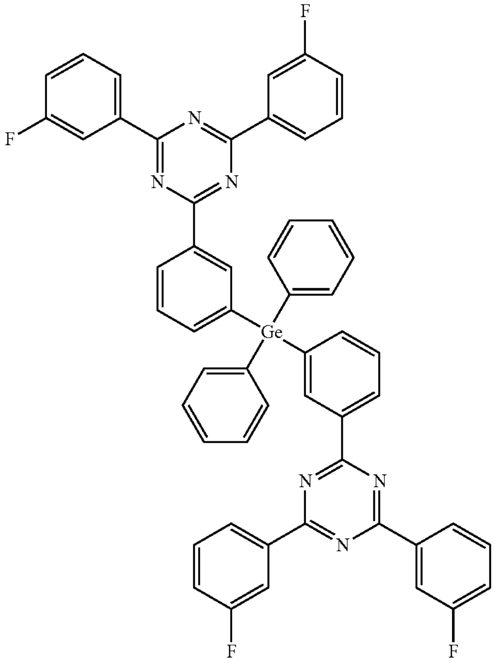
29
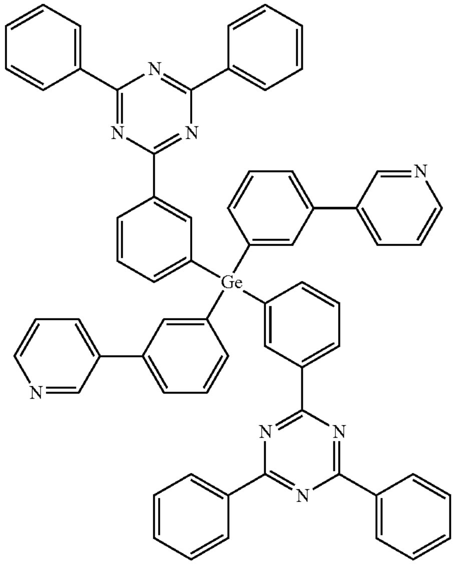

-continued
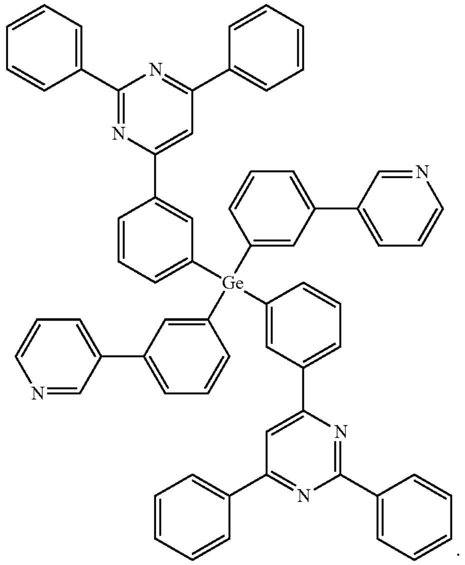
* * * * *